(12) United States Patent
Shimomura

(10) Patent No.: US 11,997,850 B2
(45) Date of Patent: May 28, 2024

(54) THREE-DIMENSIONAL MEMORY DEVICE WITH STAIRCASE ETCH STOP STRUCTURES AND METHODS FOR FORMING THE SAME

(71) Applicant: SANDISK TECHNOLOGIES LLC, Addison, TX (US)

(72) Inventor: Kenichi Shimomura, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 308 days.

(21) Appl. No.: 17/411,689

(22) Filed: Aug. 25, 2021

(65) Prior Publication Data

US 2023/0064713 A1    Mar. 2, 2023

(51) Int. Cl.
| | |
|---|---|
| *H10B 41/35* | (2023.01) |
| *H01L 23/522* | (2006.01) |
| *H01L 23/528* | (2006.01) |
| *H10B 41/10* | (2023.01) |
| *H10B 41/27* | (2023.01) |
| *H10B 43/10* | (2023.01) |

(Continued)

(52) U.S. Cl.
CPC ......... *H10B 41/35* (2023.02); *H01L 23/5226* (2013.01); *H01L 23/5283* (2013.01); *H10B 41/10* (2023.02); *H10B 41/27* (2023.02); *H10B 43/10* (2023.02); *H10B 43/27* (2023.02); *H10B 43/35* (2023.02)

(58) Field of Classification Search
CPC ........ H10B 41/00–70; H10B 43/00–50; H01L 23/5226; H01L 23/5283; H01L 23/522; H01L 23/528; H01L 27/02
See application file for complete search history.

(56) References Cited

U.S. PATENT DOCUMENTS

| | | | |
|---|---|---|---|
| 5,915,167 A | 6/1999 | Leedy | |
| 9,601,577 B1 * | 3/2017 | Lee | ......................... H10B 10/12 |
| 10,115,681 B1 | 10/2018 | Ariyoshi | |

(Continued)

OTHER PUBLICATIONS

Shimomura, K., "Three-Dimensional Memory Device With Staircase Etch Stop Structures and Methods for Forming the Same," U.S. Appl. No. 17/411,726, filed Aug. 25, 2021.

(Continued)

*Primary Examiner* — Steven M Christopher
*Assistant Examiner* — Tyler J Wiegand
(74) *Attorney, Agent, or Firm* — THE MARBURY LAW GROUP PLLC

(57) ABSTRACT

A three-dimensional memory device includes an alternating stack of insulating layers and electrically conductive layers, and memory opening fill structures vertically extending through the alternating stack. An insulating liner overlies stepped surfaces of the alternating stack in a staircase region. A plurality of discrete dielectric plates can be formed over the insulating liner. In one embodiment, the plurality of discrete dielectric plates can function as etch stop structures for formation of contact via structures that contact underlying portions of the electrically conductive layers. In another embodiment, the plurality of discrete dielectric plates may be replaced with a metallic material that forms extensions of the electrically conductive layers, and can be employed as etch stop structures during formation of contact via structures.

17 Claims, 54 Drawing Sheets

(51) Int. Cl.
*H10B 43/27* (2023.01)
*H10B 43/35* (2023.01)

(56) References Cited

U.S. PATENT DOCUMENTS

| | | | |
|---|---|---|---|
| 10,608,010 B2 | 3/2020 | Terasawa et al. | |
| 10,672,711 B2* | 6/2020 | Zhu | H01L 21/76832 |
| 10,700,089 B1 | 6/2020 | Hojo et al. | |
| 10,861,863 B2* | 12/2020 | Kim | H10B 41/41 |
| 11,081,443 B1 | 8/2021 | Mizutani et al. | |
| 2011/0031546 A1* | 2/2011 | Uenaka | H01L 29/7926 438/479 |
| 2015/0270165 A1* | 9/2015 | Hyun | H10B 43/35 257/329 |
| 2015/0287710 A1* | 10/2015 | Yun | H10B 43/35 257/314 |
| 2017/0117222 A1* | 4/2017 | Kim | H01L 23/5283 |
| 2018/0083035 A1* | 3/2018 | Oh | H10B 43/50 |
| 2019/0067312 A1* | 2/2019 | Arisumi | H10B 43/10 |
| 2019/0280004 A1* | 9/2019 | Takamura | H10B 43/10 |
| 2020/0144380 A1* | 5/2020 | Hwang | H10B 41/50 |
| 2020/0194447 A1* | 6/2020 | Sun | H10B 41/27 |
| 2020/0258757 A1* | 8/2020 | Wang | H01L 21/0337 |
| 2021/0043648 A1* | 2/2021 | Kim | H10B 43/27 |
| 2021/0057336 A1 | 2/2021 | Shao et al. | |
| 2021/0134827 A1 | 5/2021 | Iwai et al. | |
| 2021/0210499 A1* | 7/2021 | Jhothiraman | H10B 43/35 |
| 2021/0358805 A1* | 11/2021 | Hopkins | H01L 21/76829 |

OTHER PUBLICATIONS

Notification of Transmittal of the International Search Report and Written Opinion of the International Searching Authority for International Patent Application No. PCT/US2022/028631, mailed Oct. 12, 2022, 12 pages.

Endoh, T et al., "Novel Ultra High Density Memory with a Stacked-Surrounding Gate Transistor (S-SGT) Structured Cell," IEDM Proc., (2001), 33-36.

U.S. Appl. No. 16/782,307, filed Feb. 5, 2020, SanDisk Technologies, LLC.
U.S. Appl. No. 16/881,346, filed May 22, 2020, SanDisk Technologies, LLC.
U.S. Appl. No. 16/881,401, filed May 22, 2020, SanDisk Technologies, LLC.
U.S. Appl. No. 16/921,146, filed Jul. 6, 2020, SanDisk Technologies, LLC.
U.S. Appl. No. 17/039,160, filed Sep. 30, 2020, SanDisk Technologies, LLC.
U.S. Appl. No. 17/146,866, filed Jan. 12, 2021, SanDisk Technologies, LLC.
U.S. Appl. No. 17/174,064, filed Feb. 11, 2021, SanDisk Technologies, LLC.
U.S. Appl. No. 17/174,094, filed Feb. 11, 2021, SanDisk Technologies, LLC.
U.S. Appl. No. 17/224,370, filed Apr. 7, 2021, SanDisk Technologies, LLC.
U.S. Appl. No. 17/226,321, filed Apr. 9, 2021, SanDisk Technologies, LLC.
U.S. Appl. No. 17/244,258, filed Apr. 29, 2021, SanDisk Technologies, LLC.
U.S. Appl. No. 17/244,311, filed Apr. 29, 2021, SanDisk Technologies, LLC.
U.S. Appl. No. 17/397,678, filed Aug. 9, 2021, SanDisk Technologies, LLC.
U.S. Appl. No. 17/397,777, filed Aug. 9, 2021, SanDisk Technologies, LLC.
U.S. Appl. No. 17/397,846, filed Aug. 9, 2021, SanDisk Technologies, LLC.

\* cited by examiner

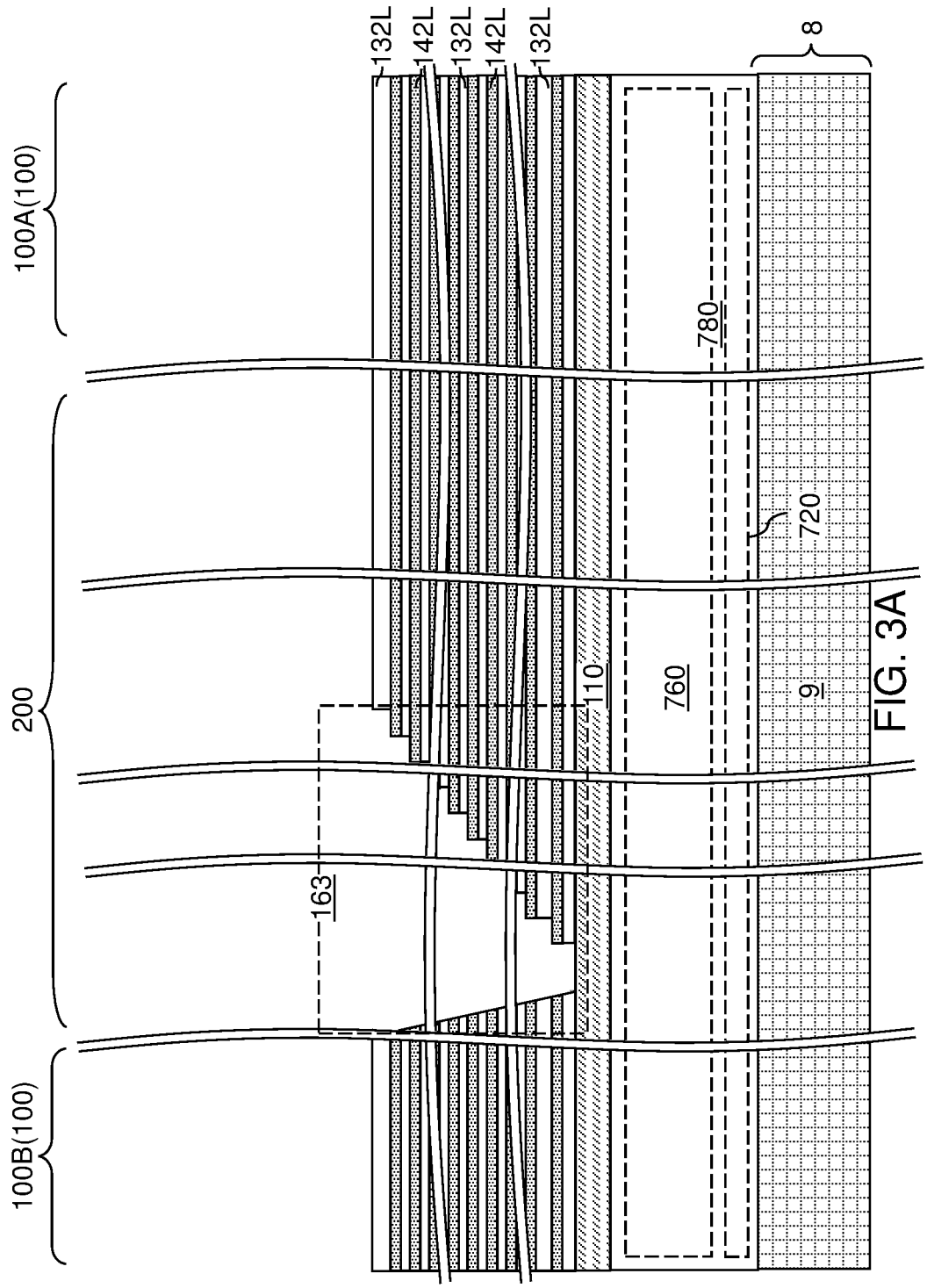

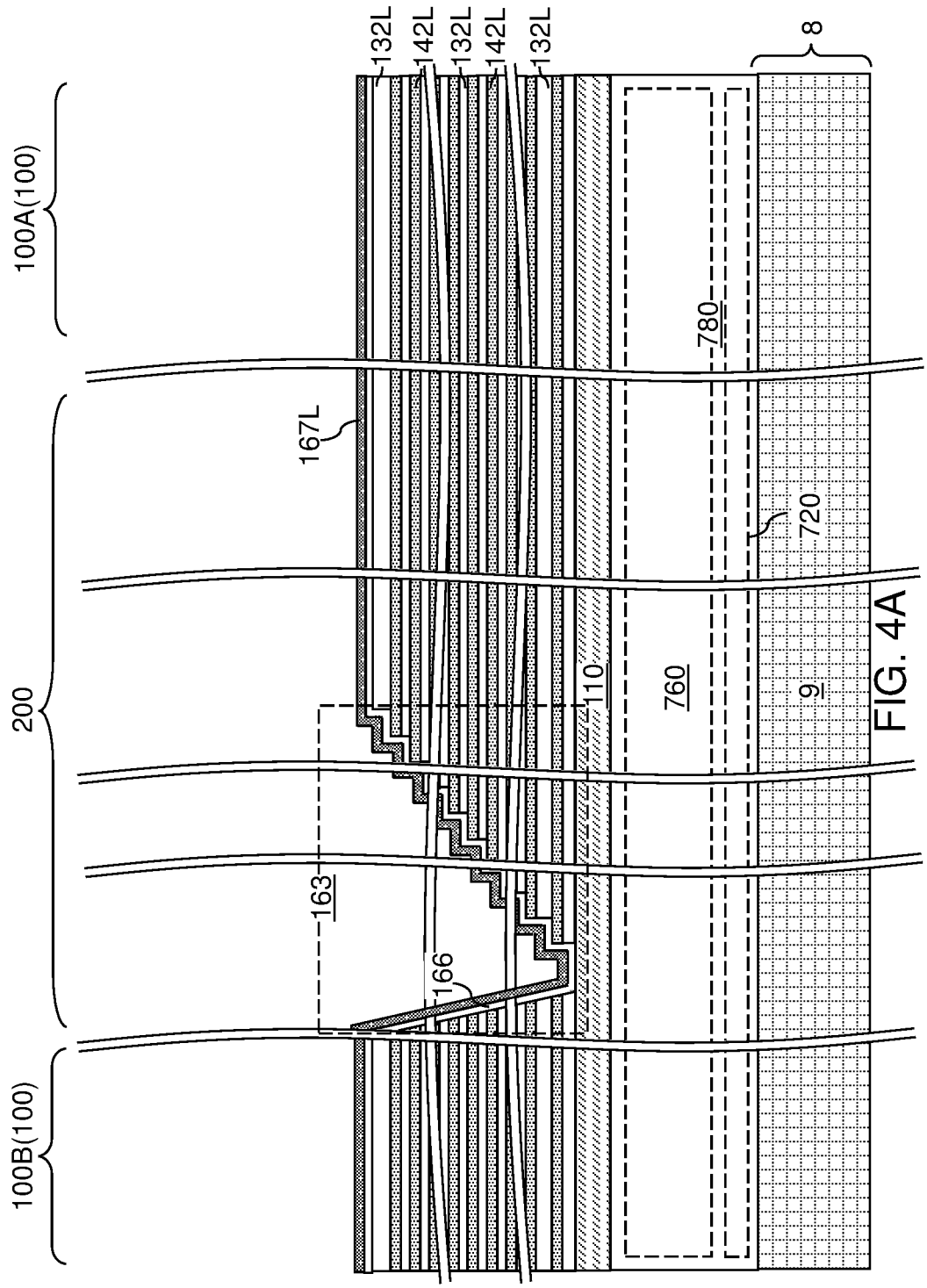

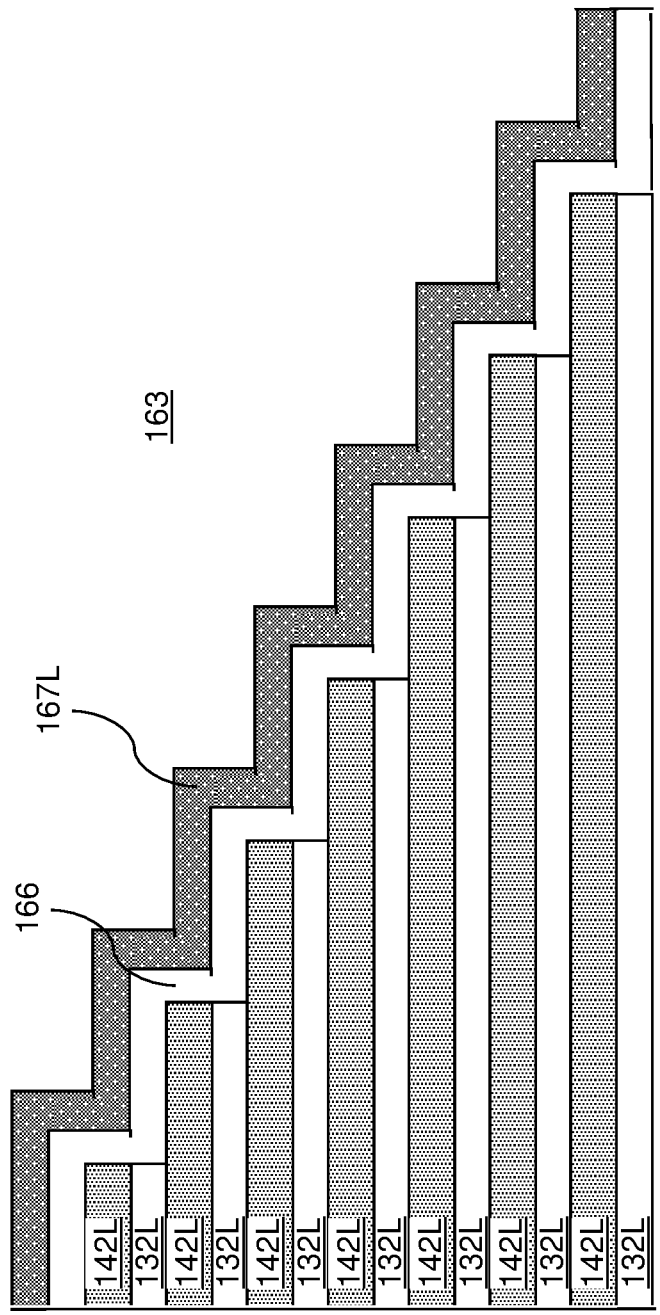

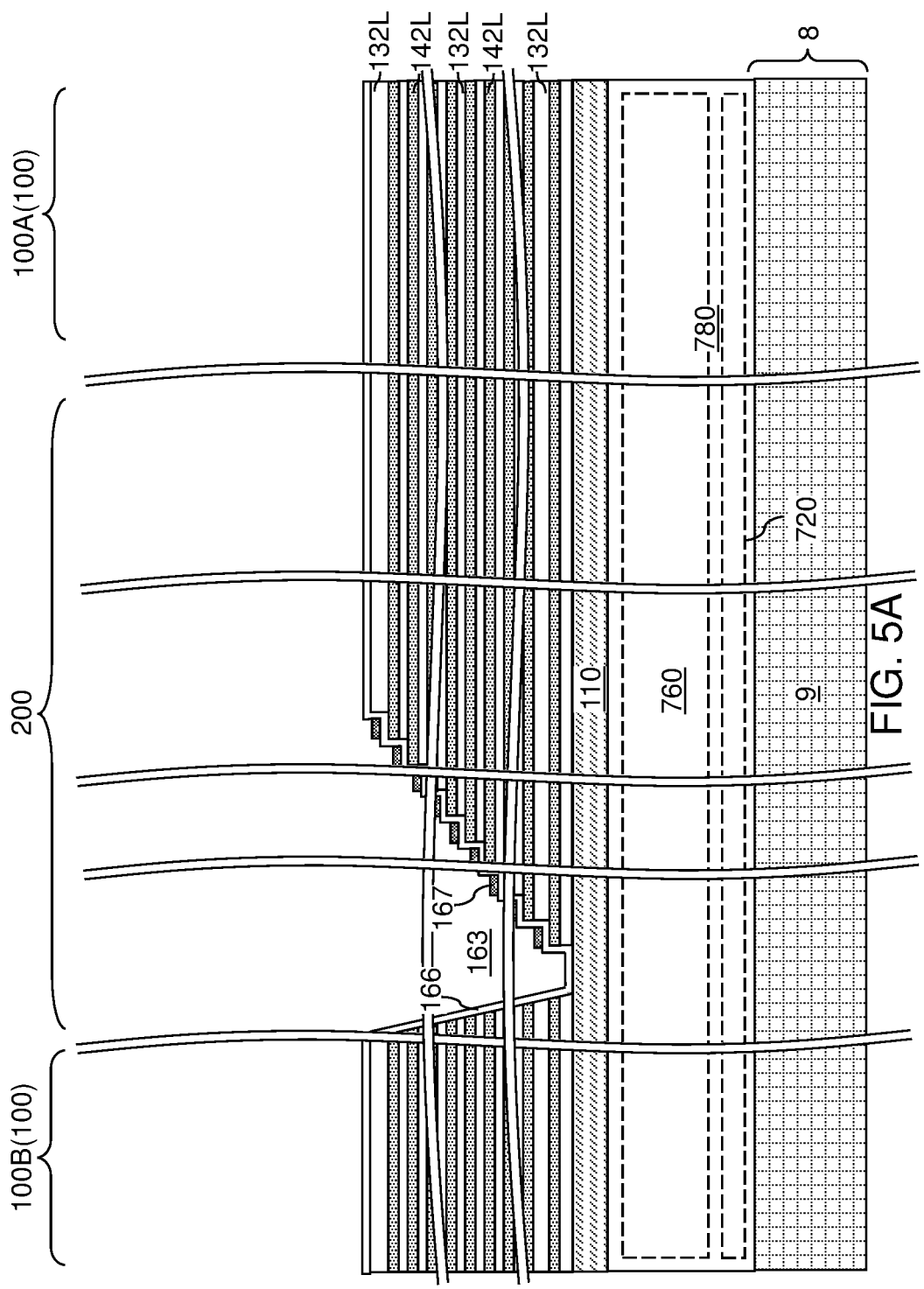

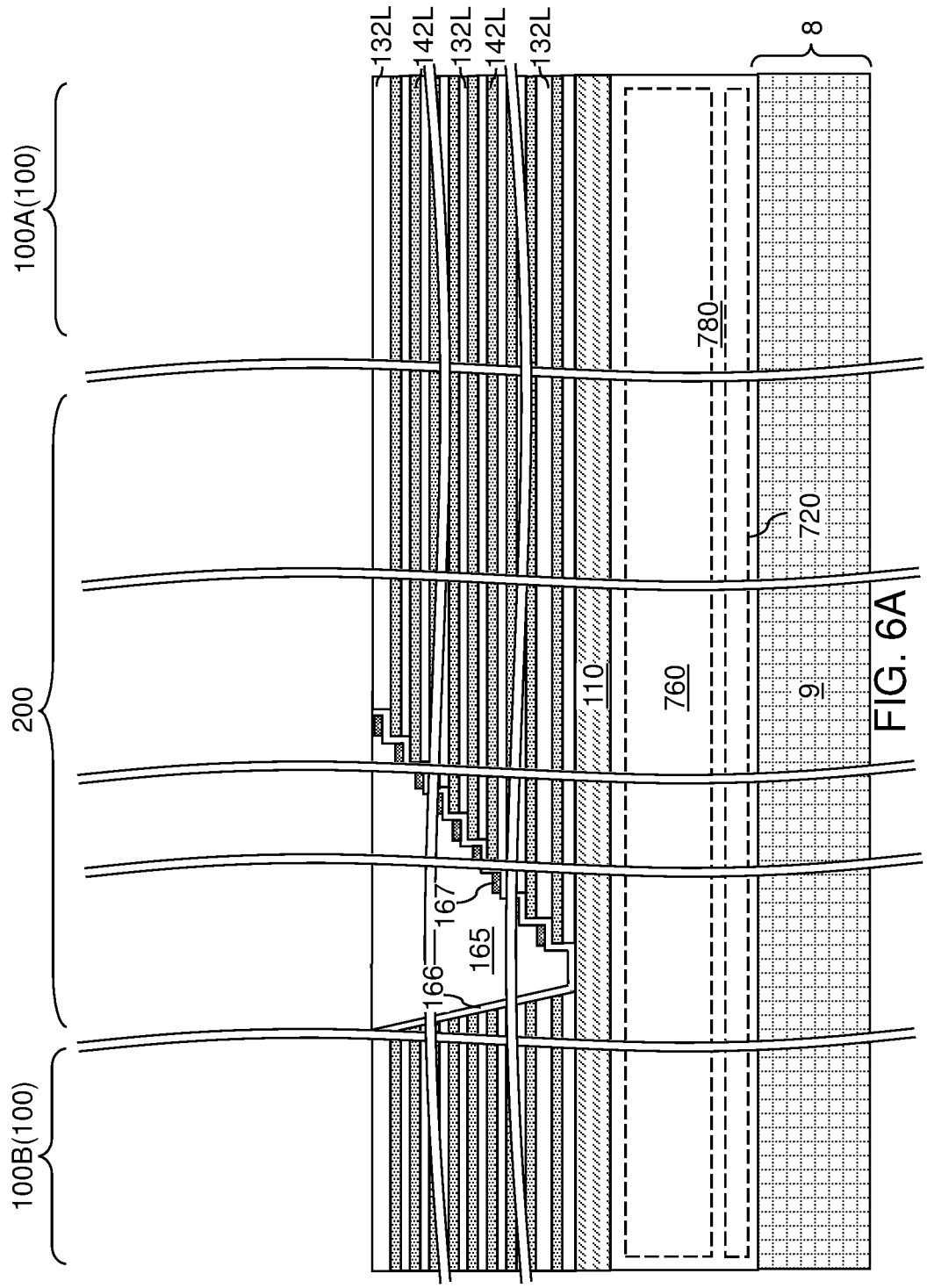

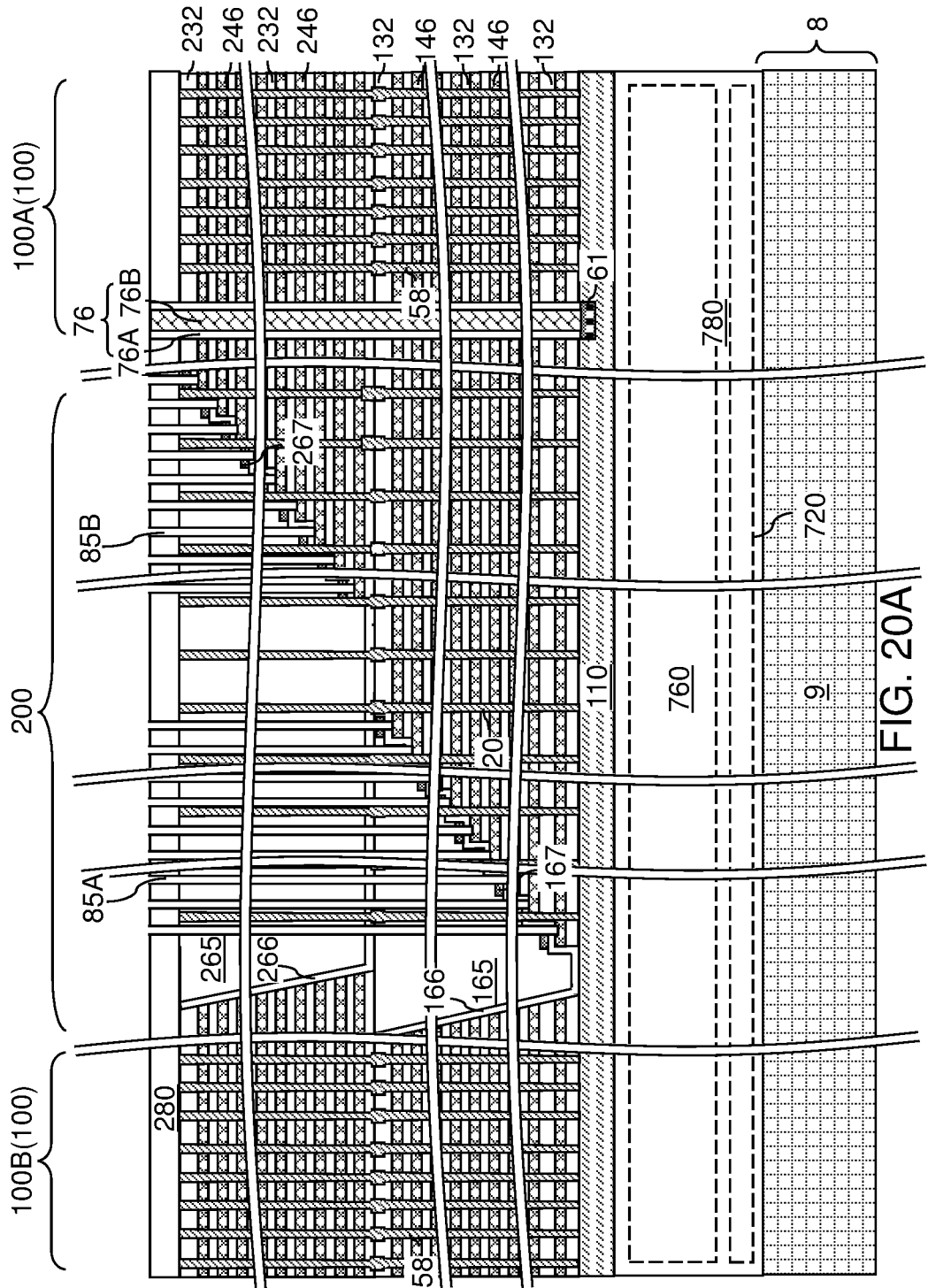

US 11,997,850 B2

THREE-DIMENSIONAL MEMORY DEVICE WITH STAIRCASE ETCH STOP STRUCTURES AND METHODS FOR FORMING THE SAME

FIELD

The present disclosure relates generally to the field of semiconductor devices, and particularly to a three-dimensional memory device with staircase etch stop structures and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers, wherein the alternating stack comprises at least one memory array region in which each layer of the alternating stack is present and a staircase region comprising stepped surfaces of the alternating stack; memory openings vertically extending through the alternating stack in the memory array region; memory opening fill structures located in the memory openings and comprising a respective vertical stack of memory elements; an insulating liner overlying the stepped surfaces of the alternating stack; a plurality of discrete dielectric plates located over the insulating liner and spaced apart from each other; a dielectric material portion overlying the plurality of discrete dielectric plates; and contact via structures vertically extending through the dielectric material portion, a respective one of the plurality of discrete dielectric plates, and a respective portion of the insulating liner, and contacting a respective one of the electrically conductive layers.

According to another aspect of the present disclosure, a method of forming a three-dimensional memory device is provided, which comprises: forming an alternating stack of insulating layers and spacer material layers over a substrate, wherein the spacer material layers are formed are, or are subsequently replaced with, electrically conductive layers, and wherein the alternating stack comprises at least one memory array region in which each layer of the alternating stack is present and a staircase region comprising stepped surfaces of the alternating stack; forming an insulating liner over the stepped surfaces of the alternating stack; forming a plurality of discrete dielectric plates over the insulating liner, wherein the plurality of discrete dielectric plates are spaced apart from each other; forming a dielectric material portion over the plurality of discrete dielectric plates; forming memory openings through the alternating stack in the memory array region; forming memory opening fill structures in the memory openings, wherein each of the memory opening fill structures comprises a respective vertical stack of memory elements; and forming contact via structures through the dielectric material portion, a respective one of the plurality of discrete dielectric plates, and a respective portion of the insulating liner, and directly on a respective one of the electrically conductive layers.

According to yet another aspect of the present disclosure, a three-dimensional memory device is provided, which comprises: an alternating stack of insulating layers and electrically conductive layers located over a substrate, wherein the alternating stack comprises at least one memory array region in which each layer of the alternating stack is present and a staircase region comprising stepped surfaces of the alternating stack in which horizontal surfaces and vertical steps are adjoined to each other to form a continuous set of surface segments; memory openings vertically extending through the alternating stack in the memory array region; memory opening fill structures located in the memory openings and comprising a respective vertical stack of memory elements; an insulating liner overlying the stepped surfaces of the alternating stack and comprising horizontal top surface segments and vertical sidewall segments that are adjoined to each other, wherein the electrically conductive layers comprises a respective protrusion via portion that protrudes through a respective opening in the insulating liner and a respective protrusion pad portion adjoined to an upper end of the respective protrusion via portion; a dielectric material portion overlying the insulating liner; and contact via structures vertically extending through the dielectric material portion and contacting a top surface of a respective one of the protrusion pad portions.

According to still another aspect of the present disclosure, a method of forming a three-dimensional memory device is provided, which comprises: forming an alternating stack of insulating layers and sacrificial material layers over a substrate, wherein the alternating stack comprises at least one memory array region in which each layer of the alternating stack is present and a staircase region comprising stepped surfaces of the alternating stack; forming an insulating liner over the stepped surfaces of the alternating stack; forming discrete openings through the insulating liner; forming a plurality of discrete dielectric plates over the insulating liner, wherein the plurality of discrete dielectric plates are spaced apart from each other and fill a respective discrete opening through the insulating liner; forming a dielectric material portion over the plurality of discrete dielectric plates; forming memory openings through the alternating stack in the memory array region; forming memory opening fill structures in the memory openings, wherein each of the memory opening fill structures comprises a respective vertical stack of memory elements; and replacing the sacrificial material layers and the plurality of discrete dielectric plates with electrically conductive layers, wherein each of the electrically conductive layers is formed within a volume including a volume of a respective sacrificial material layer and a volume of a respective discrete dielectric plate of the plurality of discrete dielectric plates.

BRIEF DESCRIPTION OF THE DRAWINGS

FIG. 3A is a vertical cross-sectional view of the first exemplary structure after formation of first stepped surfaces according to the first embodiment of the present disclosure.

FIG. 4A is a vertical cross-sectional view of the first exemplary structure after formation of a first insulating liner and a first continuous dielectric liner according to the first embodiment of the present disclosure.

FIG. 4B is a magnified view of a portion of the first stepped surfaces of the first exemplary structure of FIG. 4A.

FIG. 5A is a vertical cross-sectional view of the first exemplary structure after patterning the first continuous dielectric liner into first discrete dielectric plates according to the first embodiment of the present disclosure.

FIG. 6A is a vertical cross-sectional view of the first exemplary structure after formation of a first-tier retro-stepped dielectric material portion according to the first embodiment of the present disclosure.

FIG. 20A is a schematic vertical cross-sectional view of the first exemplary structure after vertical extension of the layer contact via cavities according to the first embodiment of the present disclosure.

DETAILED DESCRIPTION

Figure 1A:
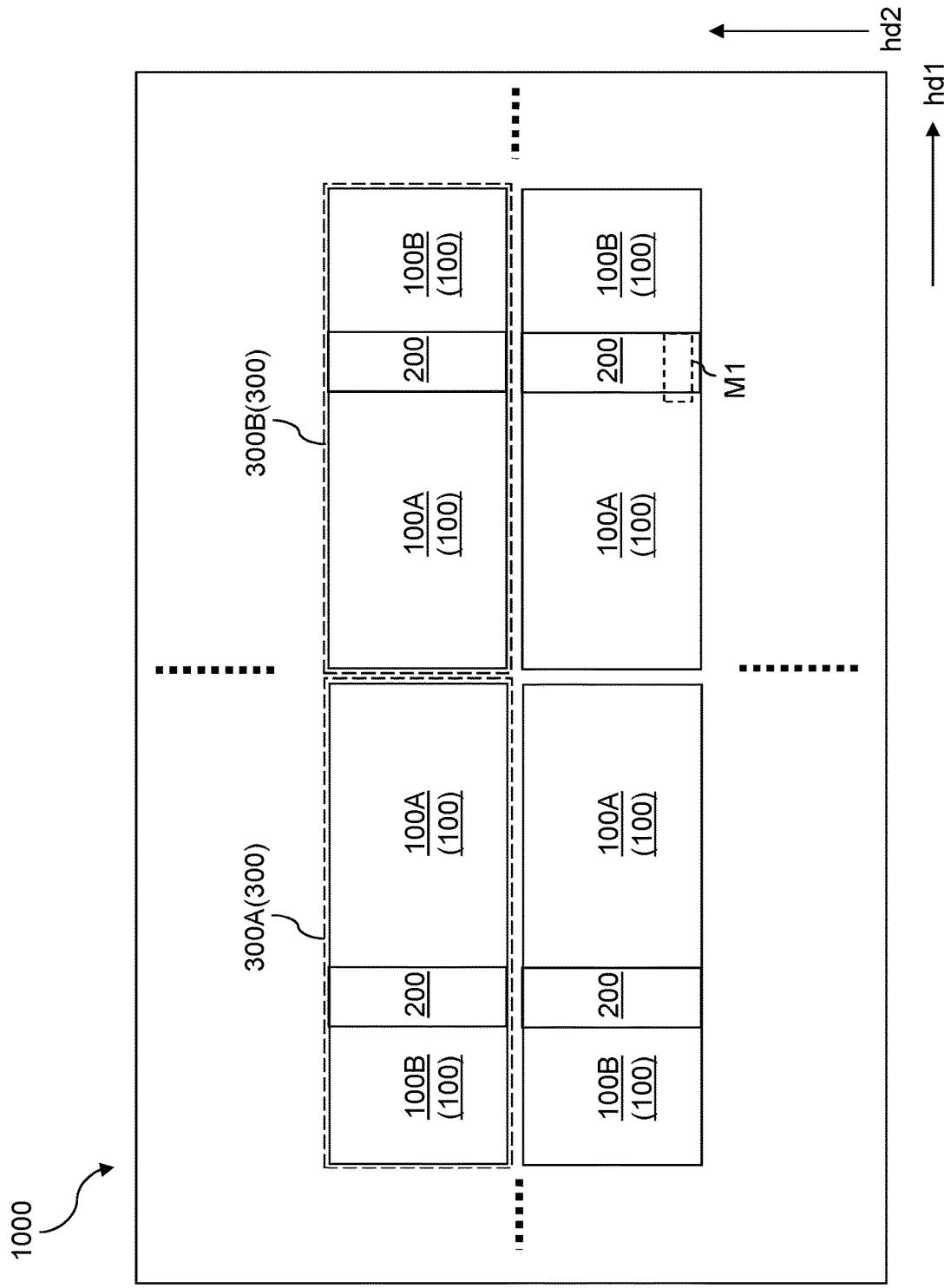
FIG. 1A is a plan view of a first exemplary semiconductor die including multiple three-dimensional memory array regions according to a first embodiment of the present disclosure.

As discussed above, the embodiments of the present disclosure are directed to a three-dimensional memory device with staircase etch stop structures and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element.

As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1F, a first exemplary semiconductor die 1000 according to an embodiment of the present disclosure is illustrated. The first exemplary semiconductor die 1000 includes multiple three-dimensional memory array regions and multiple inter-array regions. The first exemplary semiconductor die 1000 can include multiple planes 300 (e.g., 300A, 300B), each of which includes two memory array regions 100, such as a first memory array region 100A and a second memory array region 100B that are laterally spaced apart by a respective inter-array region 200. Generally, a semiconductor die 1000 may include a single plane 300 or multiple planes. The total number of planes in the semiconductor die 1000 may be selected based on performance requirements on the semiconductor die 1000. A pair of memory array regions 100 in a plane 300 may be laterally spaced apart along a first horizontal direction hd1 (which may be the word line direction). A second horizontal direction hd2 (which may be the bit line direction) can be perpendicular to the first horizontal direction hd1.

According to one embodiment of the present disclosure, the size of the first memory array region 100A may differ from the size of the second memory array region 100B within a given plane. Specifically, the lateral extent of each of the first memory array region 100A and the second memory array region 100B may be the same along the second horizontal direction hd2 within a plane. However, the lateral extent of the first memory array region 100A within the plane 300 long the first horizontal direction hd1 can be greater than the lateral extent of the second memory array region 100B within the same plane 300. In one embodiment, each of the first memory array region 100A and the second memory array region 100B may have a respective rectangular area having a same width along the second horizontal direction hd2, and the lateral extent of the first memory array region 100A along the first horizontal direction hd1 can be greater than the lateral extent of the second memory array region 100B along the first horizontal direction hd1. Thus, the inter-array region 200 within each plane 300 can be located off-center of the respective plane 300 along the first horizontal direction hd1 (i.e., the inter-array region 200 is located closer to one end than to another end of the respective plane 300). For example, the inter-array region 200 in the left plane 300A may be shifted toward the left edge of the die 1000, while the inter-array region 200 in the right plane 300B may be shifted toward the right edge of the die 1000. In another embodiment, the size of the first memory array region 100A may be the same as the size of the second memory array region 100B within a given plane 300. In this embodiment, the inter-array region 200 is located in middle of the plane 300 without being shifted to the left or right edge of the plane 300.

Each memory array region 100 includes first-tier alternating stacks of first insulating layers 132 and first electrically conductive layers 146 (which function as first word lines) and second-tier alternating stacks of second insulating layers 232 and second electrically conductive layers 246 (which function as second word lines). Each second-tier alternating stack (232, 246) overlies a respective first-tier alternating stack (132, 146), and each first-tier alternating stack (132, 146) underlies a respective second-tier alternating stack (232, 246). Each combination of a first-tier alternating stack (132, 146) and an overlying second-tier alternating stack (232, 246) may be laterally spaced apart from neighboring combinations of a respective first-tier alternating stack (132, 146) and a respective second-tier alternating stack (232, 246) by trench fill structures 76 that laterally extend along the first horizontal direction hd1.

The first exemplary structure can include an optional semiconductor material layer 110 that includes a single crystalline or polycrystalline semiconductor material, such as single crystalline silicon or polysilicon. In one embodiment, the semiconductor material layer 110 may be a substrate. Optionally, underlying dielectric material layers may be provided underneath the semiconductor material layer 110. In this case, the underlying dielectric material layers are referred to as lower-level dielectric material layers 760.

A first-tier alternating stack of first insulating layers 132 and first electrically conductive layers 146 is located over a substrate (which may include the semiconductor material layer 110 or another structure, such as a silicon wafer that underlies the semiconductor material layer 110) between each neighboring pair of trench fill structures 76. A first-tier retro-stepped dielectric material portion 165 overlies, and contacts, first stepped surfaces of the first-tier alternating stack (132, 146). A second-tier alternating stack of second insulating layers 232 and second electrically conductive layers 246 overlies the first-tier alternating stack (132, 146), and overlies a horizontal plane including a planar top surface of the first-tier retro-stepped dielectric material portion 165 between each neighboring pair of trench fill structures 76. A second-tier retro-stepped dielectric material portion 265 overlies, and contacts, second stepped surfaces of the second-tier alternating stack (232, 246). Vertical steps S of the first stepped surfaces and the second stepped surfaces laterally extend along the second horizontal direction hd2 (e.g., bit line direction).

Memory opening fill structures 58 can be located within each memory array region 100 (which includes a first memory array region 100A and a second memory array region 100B) between each neighboring pair of trench fill structures 76. The memory opening fill structures 58 can be located within memory openings that vertically extend through each layer within the first-tier alternating stack (132, 146) and the second-tier alternating stack (232, 246) that are located between a respective neighboring pair of trench fill structures 76.

Each memory opening fill structure 58 includes a respective memory stack structure, which includes a respective memory film and a respective vertical semiconductor channel. The memory openings and the memory opening fill structures 58 are formed in region in which each layer of a first-tier alternating stack and each layer of the second-tier alternating stack are present. For each area within which a continuous combination of a first-tier alternating stack (132, 146) and a second-tier alternating stack (232, 246) continuously laterally extends, first memory stack structures can be located within a respective first memory array region 100A and second memory stack structures can be located within a respective second memory array region 100B. The second memory array region 100B can be connected to the first memory array region 100A through a respective inter-array region 200, in which a first-tier retro-stepped dielectric material portion 165 and a second-tier retro-stepped dielectric material portion 265 are located.

A first-tier retro-stepped dielectric material portion 165 can be located between each neighboring pair of trench fill structures 76. Each first-tier retro-stepped dielectric material portion 165 overlies first stepped surfaces of a respective first-tier alternating stack (132, 146). Each first-tier retro-stepped dielectric material portion 165 can have a sidewall that laterally extends along the first horizontal direction hd1 and contacts a respective trench fill structure 76. The first stepped surfaces comprise vertical steps of the first-tier alternating stack (132, 146) that are laterally spaced apart along the first horizontal direction hd1 and vertically offset from each other.

A second-tier retro-stepped dielectric material portion 265 can be located between each neighboring pair of trench fill structures 76. Each second-tier retro-stepped dielectric material portion 265 overlies second stepped surfaces of a respective second-tier alternating stack (232, 246). Each second-tier retro-stepped dielectric material portion 265 can have a sidewall that laterally extends along the second horizontal direction hd1 and contacts a respective trench fill structure 76. The second stepped surfaces comprise vertical steps of the second-tier alternating stack (232, 246) that are laterally spaced apart along the first horizontal direction hd1 and vertically offset from each other. In one embodiment, each second-tier retro-stepped dielectric material portion 265 overlies, and contacts, a respective one of the first-tier retro-stepped dielectric material portions 165.

Backside trenches can laterally extend along the first horizontal direction hd1. Each backside trench can be filled with a trench fill structure 76, which may include a combination of a backside contact via structure and an insulating spacer that laterally surround the backside contact via structure. Alternatively, each trench fill structure 76 may consist of an insulating fill structure. Each contiguous combination of a first-tier alternating stack (132, 146) and an overlying second-tier alternating stack (232, 246) can be located between a neighboring pair of trench fill structure 76.

For each contiguous combination of a first-tier alternating stack (132, 146) and an overlying second-tier alternating stack (232, 246), a respective first trench fill structure 76 laterally extends along the first horizontal direction hd1 (e.g., word line direction) and contacts first sidewalls of the first-tier alternating stack (132, 146) and first sidewalls of the second-tier alternating stack (232, 246), and a second trench fill structure 76 laterally extends along the first horizontal direction hd1 and contacts second sidewalls of the first-tier alternating stack (132, 146) and second sidewalls of the second-tier alternating stack (232, 246). The first trench fill structure 76 can contact each layer within the first-tier alternating stack (132, 146) and the second-tier alternating stack (232, 246), and can contact a sidewall of the first-tier retro-stepped dielectric material portion 165. The second trench fill structure 76 can contact each layer within the first-tier alternating stack (132, 146) and the second-tier alternating stack (232, 246), and can be laterally spaced from the first-tier retro-stepped dielectric material portion 165.

A contact-level dielectric layer 280 can be provided over each second-tier alternating stack (232, 246). In one embodiment, first contact via structures 86A vertically extend through a second-tier retro-stepped dielectric material portion 265 and a first-tier retro-stepped dielectric material portion 165, and contact a respective one of the first electrically conductive layers 146. Second contact via structures 86B vertically extend through a second-tier retro-stepped dielectric material portion 265 and contact a respective one of the second electrically conductive layers 246.

For each contiguous combination of a first-tier alternating stack (132, 146) and an overlying second-tier alternating stack (232, 246), a second-tier retro-stepped dielectric material portion 265 overlies second stepped surfaces of the second-tier alternating stack (232, 246), and second contact via structures 86B vertically extend through the second-tier retro-stepped dielectric material portion 265 and contact a respective one of the second electrically conductive layers 246.

For each contiguous combination of a first-tier alternating stack (132, 146) and an overlying second-tier alternating stack (232, 246), first memory opening fill structures 58 can be located within a first memory array region 100A in which each layer of the first-tier alternating stack and each layer of the second-tier alternating stack are present. Second memory opening fill structures 58 can be located within a second memory array region 100B that is laterally offset along the first horizontal direction hd1 from the first memory array region 100A by the first-tier retro-stepped dielectric material portion 165 and the second-tier retro-stepped dielectric material portion 265. Each layer of the first-tier alternating stack (132, 146) and each layer of the second-tier alternating stack (232, 246) are present within the second memory array region 100B. At least a portion of the first electrically conductive layers 146 and at least a portion of the second electrically conductive layers 246 continuously extend from the first memory array region 100A to the second memory array region 100B through a strip-shaped connection region (e.g., a "bridge" region) 240 within an inter-array region 200 located between a trench fill structures 76 and the second-tier retro-stepped dielectric material portion 265 at the level of the second-tier alternating stack (232, 246), and between the trench fill structure 76 and the first-tier retro-stepped dielectric material portion 165 at the level of the first-tier alternating stack (132, 146).

Each combination of a first-tier alternating stack (132, 146) and an overlying second-tier alternating stack (232, 246) can be located between a respective neighboring pair of trench fill structures 76. Thus, for each combination of a first-tier alternating stack (132, 146) and an overlying second-tier alternating stack (232, 246), a neighboring combination of an additional first-tier alternating stack (132, 146) and an additional second-tier alternating stack (232, 246) may be provided. A structure that is adjacent to each combination of a first-tier alternating stack (132, 146) and an overlying second-tier alternating stack (232, 246) can include an additional first-tier alternating stack of additional first insulating layers 132 and additional first electrically conductive layers 146 located over the substrate, an additional first-tier retro-stepped dielectric material portion 165 overlying additional first stepped surfaces of the additional first-tier alternating stack (132, 146), an additional second-tier alternating stack of additional second insulating layers 232 and additional second electrically conductive layers 246, additional memory opening fill structures 58 located within an additional memory array region 100B and vertically extending through each layer within the additional first-tier alternating stack (132, 146) and the additional second-tier alternating stack (232, 246), an additional second-tier retro-stepped dielectric material portion 265 overlying additional second stepped surfaces of the additional second-tier alternating stack (232, 246), and a trench fill structure 76 laterally extending along the first horizontal direction hd1 and contacting sidewalls of the first-tier alternating stack (132, 146), sidewalls of the second-tier alternating stack (232, 246), sidewalls of the additional first-tier alternating stack (132, 146), and sidewalls of the additional second-tier alternating stack (232, 246). The additional second-tier alternating stack (232, 246) overlies the additional first-tier alternating stack (132, 146) and overlies a horizontal plane including the planar top surface of the first-tier retro-stepped dielectric material portion 165.

Staircases including the first stepped surfaces and the second stepped surfaces of combinations of a first-tier alternating stack (132, 146) and an overlying second-tier alternating stack (232, 246) can ascend (i.e., rise) from the substrate along the first horizontal direction hd1, or along the opposite direction of the first horizontal direction hd1. In one embodiment, the direction of rise of the staircases can change for every other pair of combinations of a respective first-tier alternating stack (132, 146) and a respective second-tier alternating stack (232, 246). In other words, the direction of rise is staggered in adjacent alternating stacks that are separated along the second horizontal direction. For example, upon sequentially numbering each combination of a respective first-tier alternating stack (132, 146) and a respective second-tier alternating stack (232, 246) with positive integers N starting with 1, each (4N+1)-th combination and each (4N+2)-th combination of a respective first-tier alternating stack (132, 146) and a respective second-tier alternating stack (232, 246) can have stairs that rise along the first horizontal direction hd1, and each (4N+3)-th combination and each (4N+4)-th combination of a respective first-tier alternating stack (132, 146) and a respective second-tier alternating stack (232, 246) can have stairs that rise along the opposite direction of the first horizontal direction hd1. In this embodiment, a vertical distance between the first stepped surfaces and the substrate increases along the first horizontal direction hd1, a vertical distance between the second stepped surfaces and the substrate increases along the first horizontal direction hd1, a vertical distance between the additional first stepped surfaces and the substrate decreases along the first horizontal direction hd1, and a vertical distance between the additional second stepped surfaces and the substrate decreases along the first horizontal direction hd1.

In an alternative embodiment, the direction of rise of the staircases does not change for every other pair of combinations of a respective first-tier alternating stack (132, 146) and a respective second-tier alternating stack (232, 246). In other words, the direction of rise is the same (i.e., non-staggered) in adjacent alternating stacks that are separated along the second horizontal direction.

The inter-array region 200 includes strips of the first insulating layers 132, the first electrically conductive layers 146, the second insulating layers 232, and the second electrically conductive layers 246 located between each laterally neighboring pair of trench fill structures 76. The portions of the strips in the respective strip-shaped connection ("bridge") regions 240 of the inter-array regions 200 located adjacent to a respective first-tier retro-stepped dielectric material portion 165 and a respective second-tier retro-stepped dielectric material portion 265 have a narrower width along the second horizontal direction hd2 than portions of the alternating stacks (132, 146, 232, 246) located in the memory array regions 100, and portions of the strips located in the remaining portions of the inter array regions 200 outside of the respective strip-shaped connection ("bridge") regions 240. Each layer within the first-tier alternating stack (132, 146) and the second-tier alternating stack (232, 246) comprises a respective strip portion located within the inter-array region 200 and laterally extending continuously from the first memory array region 100A to the second memory array region 100B. Thus, each strip of the first insulating layers 132, the first electrically conductive layers 146, the second insulating layers 232, and the second electrically conductive layers 246 can continuously extend from the first memory array region 100A to the second memory array region 100B.

Laterally-isolated vertical interconnection structures (484, 486) can be formed through the inter-array region 200. Each laterally-isolated vertical interconnection structure (484, 486) can include a through-memory-level conductive via structure 486 and a tubular insulating spacer 484 that laterally surrounds the conductive via structure 486. Each through-memory-level conductive via structure 486 can contact a lower-level metal interconnect structure 780 located in the lower-level dielectric material layers 760, as shown in FIG. 1E. The lower-level metal interconnect structures 780 can be embedded in the lower-level dielectric material layers 760, which are located between the first-tier alternating stack (132, 146) and a substrate (not shown) that can be provided underneath the lower-level dielectric material layers 760. The laterally-isolated vertical interconnection structures (484, 486) vertically extend through the strip portions of the first-tier alternating stack (132, 146) and the second-tier alternating stack (232, 246), and contact a respective one of the lower-level metal interconnect structures 780.

Drain contact via structures (not illustrated) can extend through the contact-level dielectric layer 280, and can contact an upper portion of a respective memory opening fill structure 58 (such as a drain region within the respective memory opening fill structure 58). Bit lines (not illustrated) can laterally extend along the second horizontal direction hd2, and can contact top surfaces of a respective subset of the drain contact via structures. Additional metal interconnect structures embedded in overlying dielectric material layers (not shown) may be employed to provide electrical connection among the various nodes of the three-dimensional memory device located in the semiconductor die 1000.

In one embodiment, upon sequentially numbering the trench fill structures 76 along the second horizontal direction hd2 with positive integers, each odd-numbered trench fill structure 76 contacts a respective pair of first-tier retro-stepped dielectric material portions 165 (and a respective pair of second-tier retro-stepped dielectric material portions 265) and each even-numbered trench fill structure 76 does not contact any of the first-tier retro-stepped dielectric material portions 165 (or any of the second-tier retro-stepped dielectric material portions 265).

Each trench fill structure 76 includes an insulating material portion that contacts sidewalls of a neighboring pair of alternating stacks (132, 146, 232, 246). In one embodiment, each insulating material portion may comprise an insulating spacer that laterally surrounds a contact via structure such as a backside contact via structure (not expressly shown). In another embodiment, each insulating material portion may comprise a dielectric wall structure which takes up the entire volume of the respective trench fill structure 76. In one embodiment, each sidewall of the first alternating stacks (132, 146) can be contacted by a sidewall of an insulating material portion of a respective one of the trench fill structures 76.

In one embodiment, each plane 300 within the first exemplary semiconductor die 100 includes a three-dimensional memory device, which includes alternating stacks of insulating layers (132, 232) and electrically conductive layers (146, 246). Each of the alternating stacks {(132, 146), (232, 246)} laterally extends along a first horizontal direction hd1 through a first memory array region 100A and a second memory array region 100B that are laterally spaced apart by an inter-array region 200. Each of the alternating stacks {(132, 146), (232, 246)} includes a set of stepped surfaces (i.e., a staircase) in the inter-array region (i.e., staircase region) 200. Each plane 300 within the first exemplary semiconductor die 1000 includes retro-stepped dielectric material portions (165, 265) overlying a respective set of stepped surfaces of the alternating stacks {(132, 146), (232, 246)}. Each plane 300 within the first exemplary semiconductor die 1000 includes clusters of memory stack structures located within memory opening fill structures 58. Each of the memory stack structures vertically extends through a respective one of the alternating stacks {(132, 146), (232, 246)} and is located within the first memory array region 100A or the second memory array region 100B. Each memory stack structure can include a respective vertical semiconductor channel and a vertical stack of memory elements (e.g., a memory film) located at levels of the electrically conductive layers (146, 246).

According to an aspect of the present disclosure, the first memory array region 100A has a first length along the first horizontal direction hd1. The second memory array region 100B has a second length along the first horizontal direction hd1 that is less than the first length.

The three-dimensional memory device can comprise layer contact via structures (e.g., word line contact via structures) (86A, 86B) vertically extending through a respective one of the retro-stepped dielectric material portions (165, 265) and contacting a respective one of the electrically conductive layers (146, 246). In one embodiment, for each pair of electrically conductive layers (146 or 246) located within a same alternating stack, a layer contact via structure (86A, 86B) that contacts an overlying electrically conductive layer is more proximal to the first memory array region 100A than a layer contact via structure that contacts an underlying electrically conductive layer is to the first memory array region 100A. In other words, the higher the bottom surface of a layer contact via structure (86A, 86B) is from a substrate (110, 760), the closer the layer contact via structure (86A, 86B) is to the first memory array region 100A. In other words, the staircases generally ascend (i.e., rise up) from the shorter second memory array region 100B towards the longer first memory array region 300 in each plane 300.

Electrical connection between each layer contact via structure (86A, 86B) and a portion of each electrically conductive layer (146 or 246) within the second memory array region 100B is provided by a strip portion of the electrically conductive layer (146 or 246) located in the bridge region 250 adjacent to and laterally offset along the second horizontal direction from a respective retro-stepped dielectric material portion (165, 265). The strip portion has a lesser width (i.e., narrower width) than the portions of the electrically conductive layer (146 or 246) located in the first memory array region 100A or in the second memory array region 100B. The portions of the electrically conductive layer (146 or 246) located in the first memory array region 100A or in the second memory array region 100B have a width along the second horizontal direction hd2 that is the same as a lateral distance between a neighboring pair of trench fill structures 76. In contrast, each strip portion of the electrically conductive layer (146 or 246) in the bridge region 240 has a width along the second horizontal direction hd2 that is the same as the difference between the lateral distance between a neighboring pair of trench fill structures 76 and the width of an adjoining retro-stepped dielectric material portion (165 or 265) along the second horizontal direction hd2. Each electrical connection between a layer contact via structure (86A, 86B) and a most proximal portion of the second memory array region 100B includes a narrow strip portion of an electrically conductive layer (146, 246) in the bridge region 240, while electrical connection between the layer contact via structure (86A, 86B) and a most proximal portion of the first memory array region 100A does not include any narrow strip portion of the electrically conductive layer (146, 246) because the first memory array region 100A is not separated from the layer contact via structures (86A, 86B) by the bridge region 240. This geometrical difference tends to increase the electrical resistance between the layer contact via structure (86A, 86B) and the most proximal portion of the second memory array region 100B relative to the electrical resistance between the layer contact via structure (86A, 86B) and the most proximal portion of the first memory array region 100A.

Figure 1B:
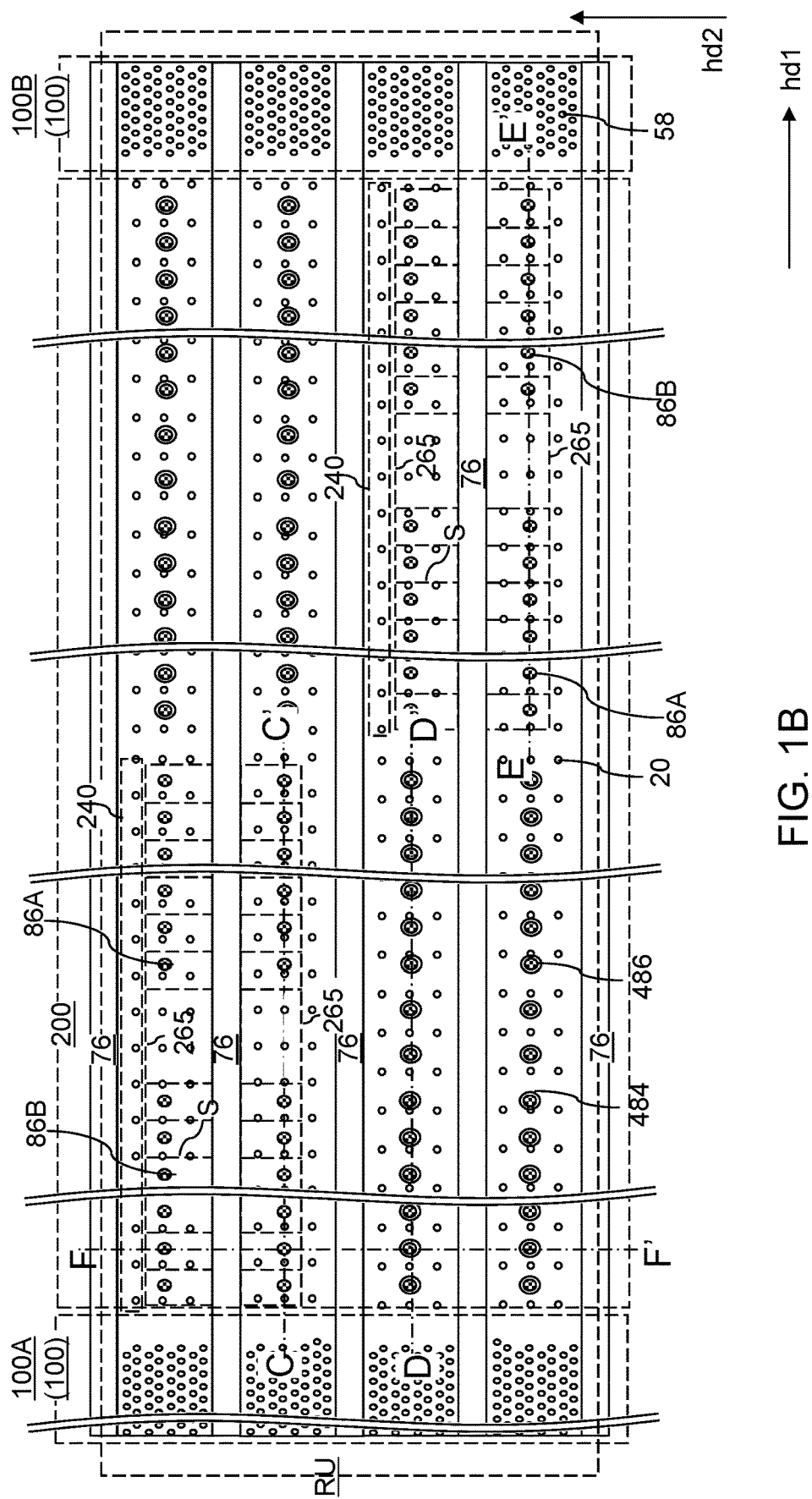
FIG. 1B is a schematic see-through top-down view of region M1 of FIG. 1A.
Figure 1C:
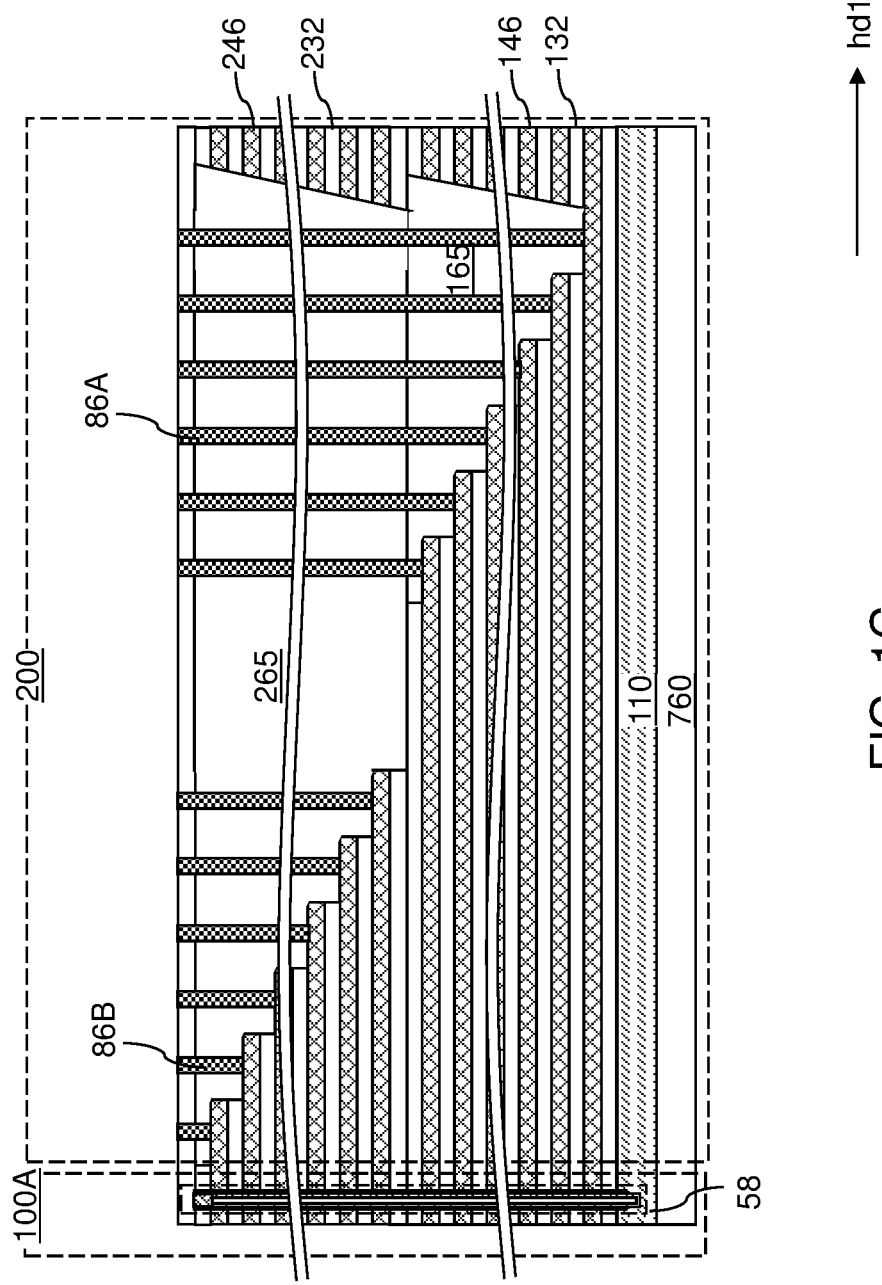
FIG. 1C is a schematic vertical cross-sectional view of a region of the first exemplary semiconductor die along the vertical plane C-C' of FIG. 1B.
Figure 1D:
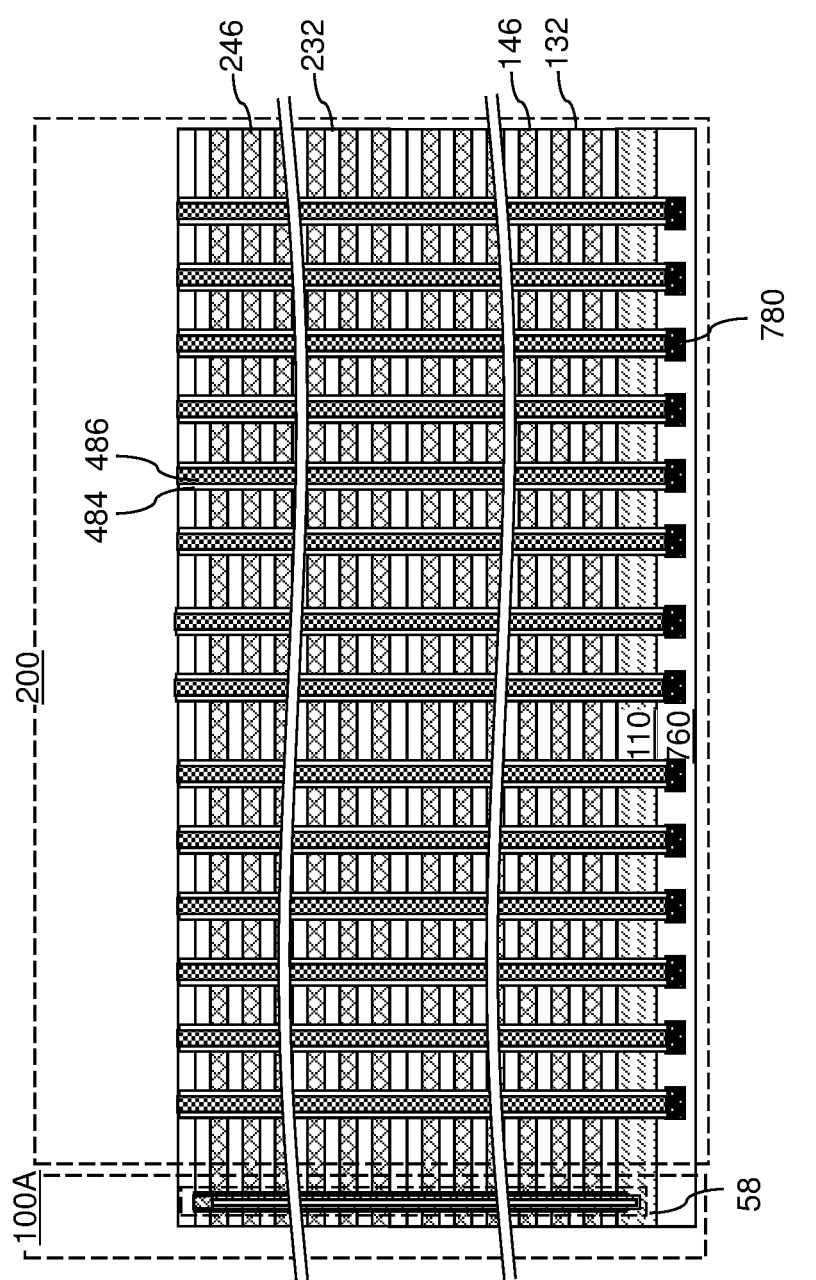
FIG. 1D is a schematic vertical cross-sectional view of a region of the first exemplary semiconductor die along the vertical plane D-D' of FIG. 1B.
Figure 1E:
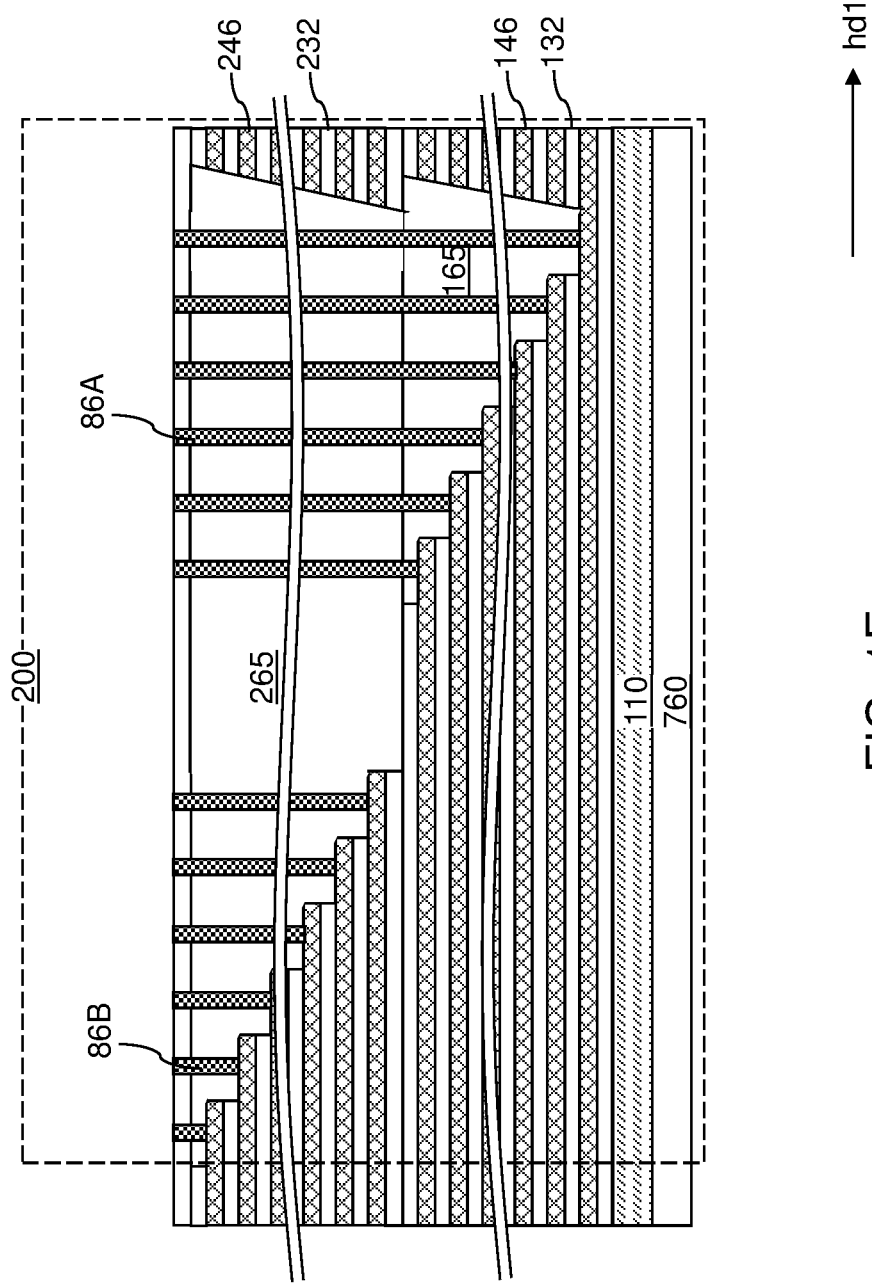
FIG. 1E is a schematic vertical cross-sectional view of a region of the first exemplary semiconductor die along the vertical plane E-E' of FIG. 1B.
Figure 1F:
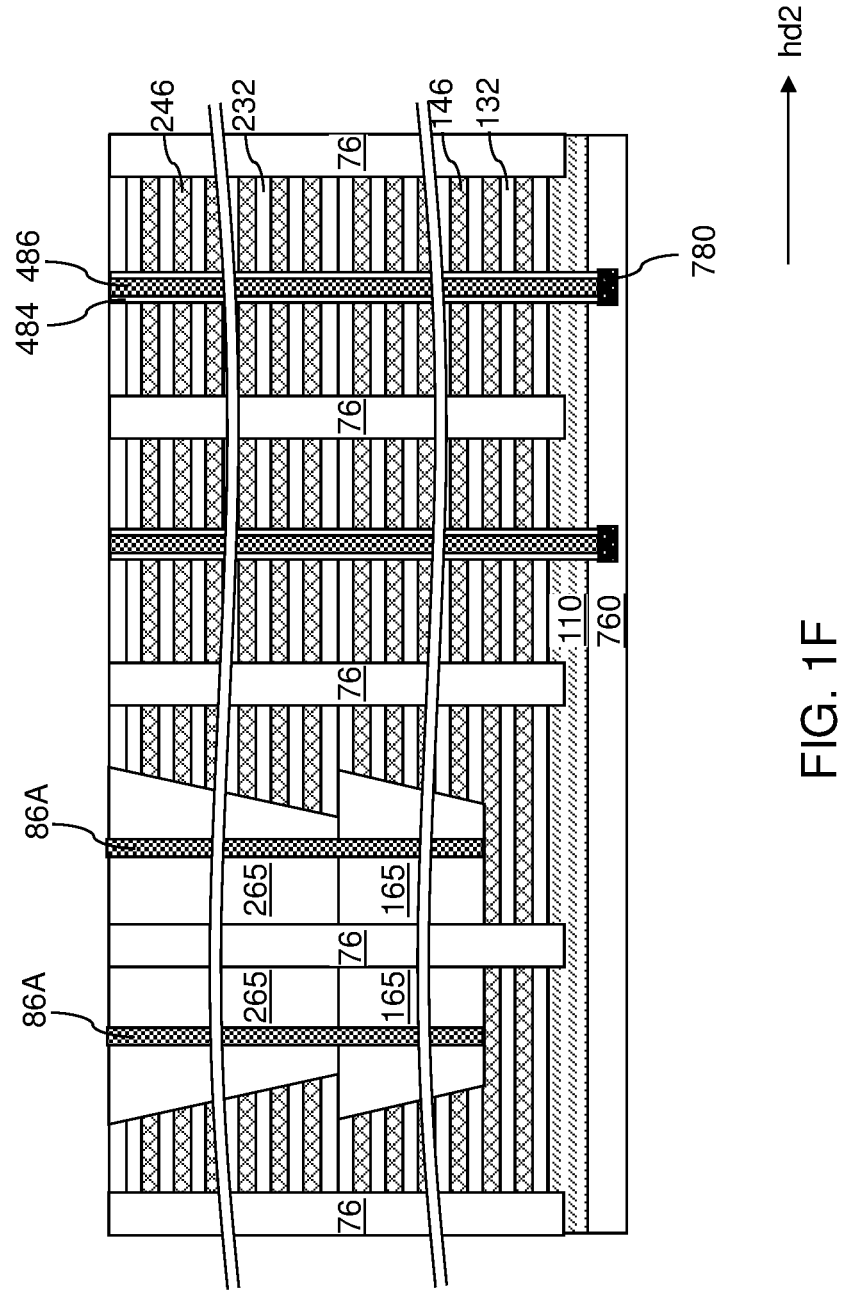
FIG. 1F is a schematic vertical cross-sectional view of a region of the first exemplary semiconductor die along the vertical plane F-F' of FIG. 1B.

Generally, each of the sidewall of the retro-stepped dielectric material portion (165, 265) laterally extending along the first horizontal direction hd1 has a tapered sidewall such that a bottom portion of each retro-stepped dielectric material portion (165 or 265) has a lesser (i.e., narrower) width than a top portion of each retro-stepped dielectric material portion (166 or 265), as illustrated in FIG. 1F. Thus, the effect of the increase in the electrical resistance due to the presence of the narrow strip portion of an electrically conductive layer (146 or 246) in the bridge region 240 between a layer contact via structure (86A, 86B) and a most proximal portion of the second memory array region 100B tends to increases with a vertical distance from the substrate (760, 110) for the set of all first electrically conductive layers 146, and for the set of all second electrically conductive layers 246.

Figure 2:
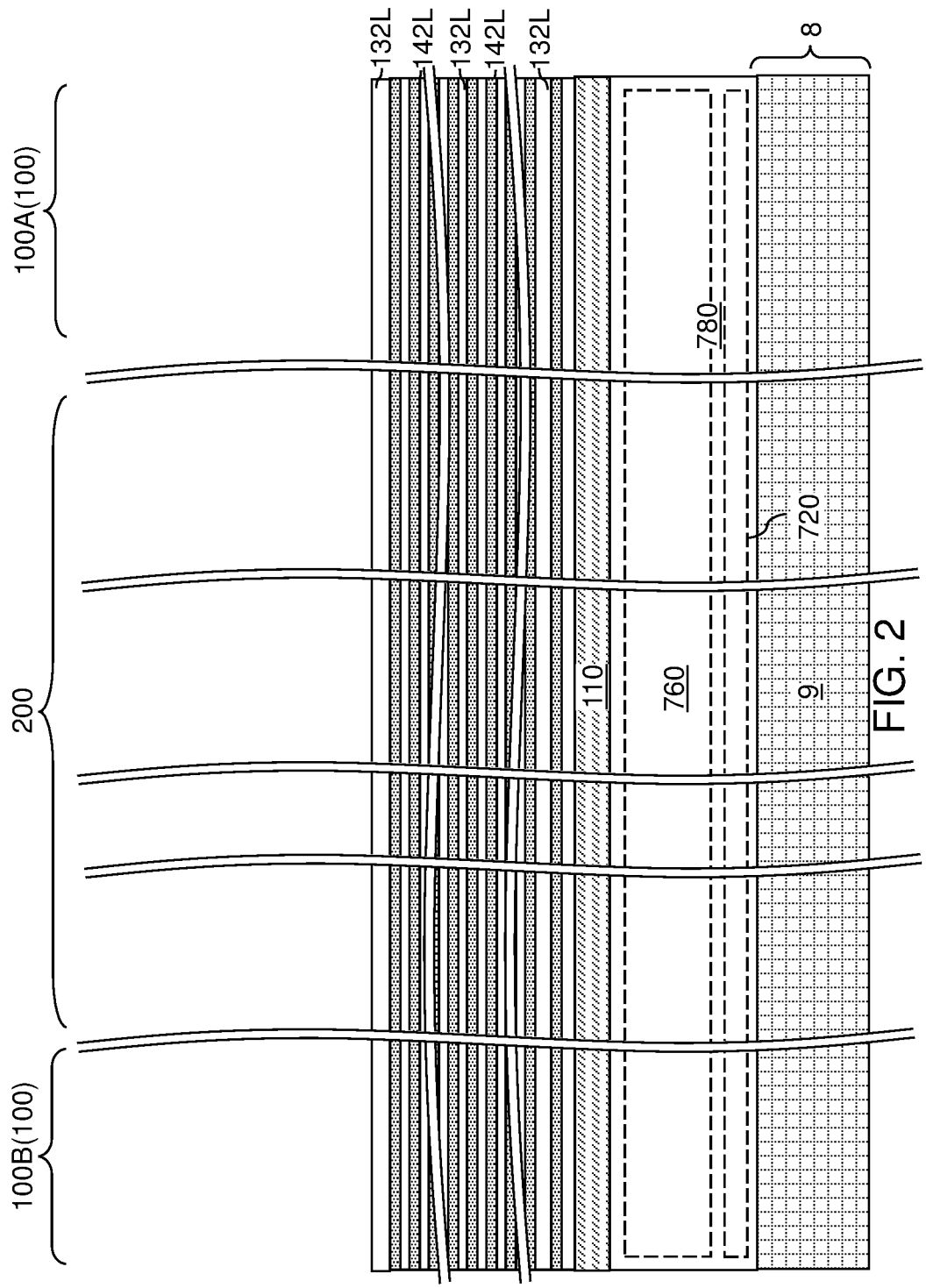
FIG. 2 is a vertical cross-sectional view of a first exemplary structure for forming a semiconductor die after formation of optional semiconductor devices, optional lower level dielectric layers, optional lower metal interconnect structures, a semiconductor material layer, and a first vertically alternating sequence of first continuous insulating layers and first continuous sacrificial material layers according to the first embodiment of the present disclosure.

The first exemplary semiconductor die 1000 of FIGS. 1A-1F can be manufactured employing a sequence of processing steps. Referring to FIG. 2, a first exemplary structure for formation of the structure of FIGS. 1A-1F is illustrated in a vertical cross sectional view along the first horizontal direction hd1 (e.g., the word line direction) according to the first embodiment of the present disclosure. The structure shown in FIG. 2 is provided after formation of semiconductor devices 720 on a substrate semiconductor layer 9 (which is provided at least within an upper portion of a substrate 8), lower level dielectric layers 760, lower-level metal interconnect structures 780 (schematically represented by a dotted area including physical implementations of the lower level metal interconnect structures) that are embedded in the lower-level dielectric layers 760, a semiconductor material layer 110, and a first vertically alternating sequence of first continuous insulating layers 132L and first continuous sacrificial material layers 142L. The substrate semiconductor layer 9 may comprise a top portion (e.g., a doped well) of a substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the substrate 8, and may have a uniform thickness throughout. Each of the first continuous sacrificial material layers 142L includes is a sacrificial material layer that includes a dielectric material and continuously extends over the entire area of the substrate 8, and may have a uniform thickness throughout. Insulating materials that may be used for the first continuous insulating layers 132L include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be a first silicon oxide material.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

While the present disclosure is described employing an embodiment in which the first continuous sacrificial material layers 142L are formed as sacrificial material layers, embodiments are expressly contemplated herein in which first continuous electrically conductive layers are formed in lieu of the first continuous sacrificial material layers 142L. In this case, the first continuous electrically conductive layers can be subsequently divided into first electrically conductive layers upon formation of backside trenches. Processes for replacing remaining portions of the first continuous sacrificial material layers 142L with electrically conductive layers can be omitted in this case.

Generally, a vertically alternating sequence of unit layer stacks over a substrate. Each of the unit layer stacks comprises a first insulating layer (such as a first continuous insulating layer 132L) and a first spacer material layer (such as a first continuous sacrificial material layer 142L). Generally, the first spacer material layers are formed as, or are subsequently replaced with, first electrically conductive layers. While the present disclosure is described employing an embodiment in which the first spacer material layers are formed as first continuous sacrificial material layers 142L that are subsequently replaced with first electrically conductive layers, embodiments are expressly contemplated herein in which the first spacer material layers are formed as first electrically conductive layers. In such embodiments, steps for replacing the material of the first spacer material layers with an electrically conductive material can be omitted.

Figure 3B:
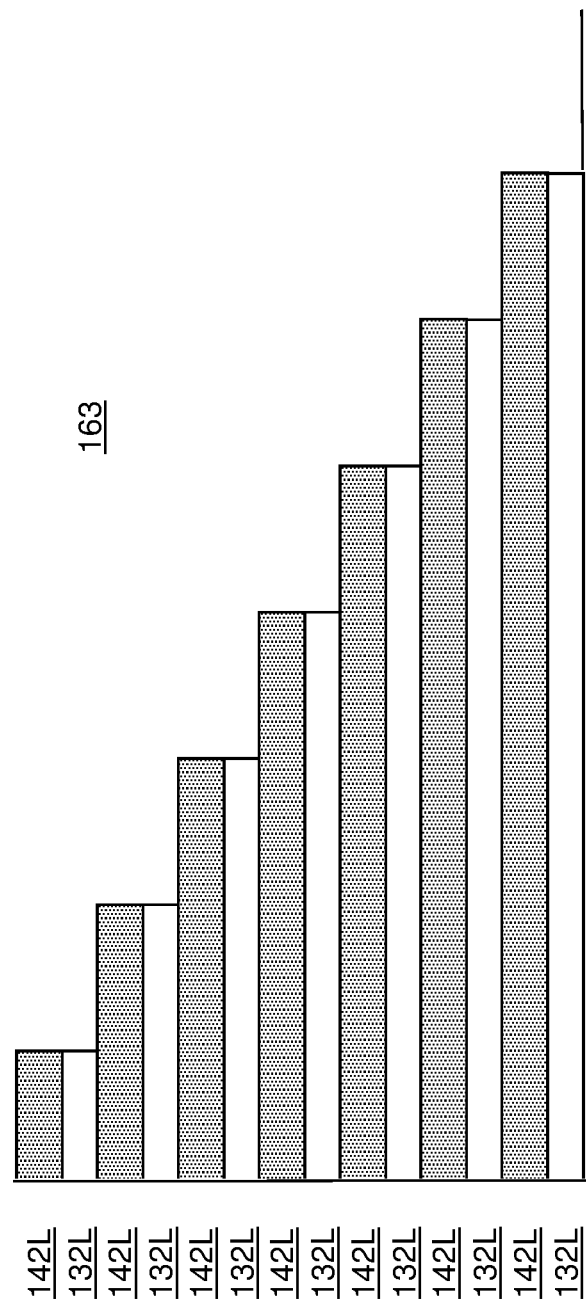
FIG. 3B is a magnified view of a portion of the first stepped surfaces of the first exemplary structure of FIG. 3A.
Figure 3C:
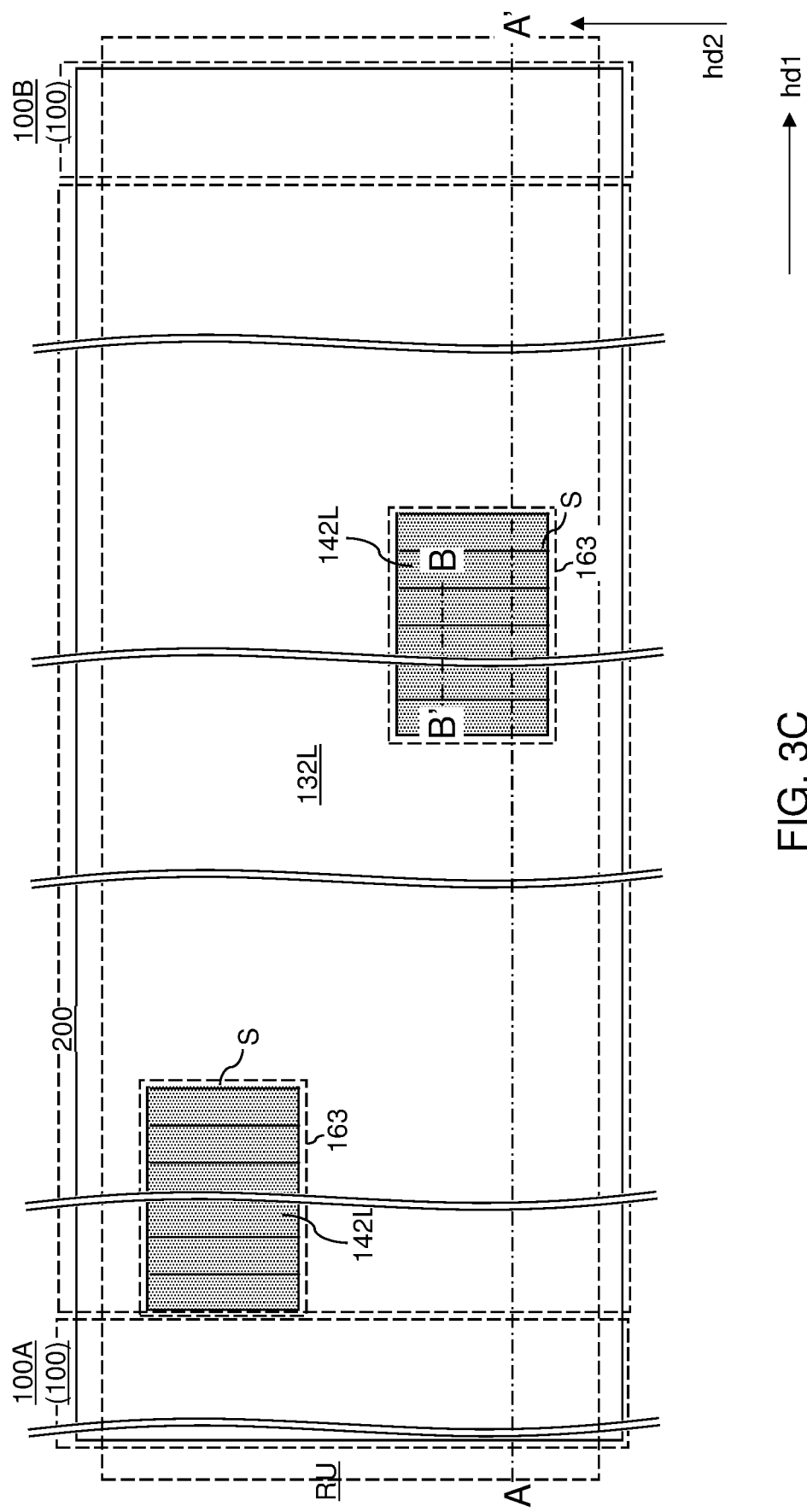
FIG. 3C is a top-down view of a region of the first exemplary structure of FIGS. 3A and 3B. The vertical cross-sectional plane A-A' is the plane of the vertical cross-sectional view of FIG. 3A. The vertical cross-sectional plane B-B' is the plane of the vertical cross-sectional view of FIG. 3B.

Referring to FIGS. 3A-3C, first stepped surfaces can be formed within the staircase regions of the inter-array region 200 which will be filled with the first-tier retro-stepped dielectric material portions 165. As shown in FIG. 3C, the vertical planes A-A' and B-B' extend in opposite directions. Therefore, the stepped surfaces S ascend in opposite directions in FIGS. 3A and 3B to show that the stepped surfaces S may ascend in any desired direction (e.g., left to right or right to left). For example, a combination of a sacrificial hard mask layer and a trimming mask layer may be employed to form the first stepped surfaces. In one embodiment, a row of multiple first staircase regions can be formed within each area that corresponds to a combination of the area of a laterally-neighboring pair of first-tier retro-stepped dielectric material portions 165 and an intervening area. In this case, the multiple first staircase regions can be subsequently vertically offset by different depths by subsequently performing area recess etch processes.

In a non-limiting illustrative example, $2^M$ sets of first stepped surfaces can be formed within a combination of the area of a laterally-neighboring pair of first-tier retro-stepped dielectric material portions 165 and an intervening area. M can be an integer in a range from 1 to 8. Each set of first stepped staircases may include P steps such that sidewalls of P first continuous spacer material layers are physically exposed with lateral offsets. P may be an integer from 2 to 64. M area recess etch processes can be performed such that each area recess etch process vertically recesses P times $2^i$ sets of a first continuous insulating layer 132L and a first continuous sacrificial material layer 142L, in which i is a different integer from 0 to (M−1). A total of up to $2^M \times P$ stepped surfaces can be formed for the first vertically alternating sequence of the first continuous insulating layers 132L and the first continuous sacrificial material layers 142L. The total number of the stepped surfaces within each continuous cavity overlying the first stepped surfaces can be the same as the total number of the first continuous sacrificial material layers 142L in the first vertically alternating sequence (132L, 142L). A first stepped cavity 163 can be formed over the first stepped surfaces of the first vertically alternating sequence (132L, 142L).

In one embodiment, the first stepped cavity may have a straight sidewall that vertically extends from a bottom surface of the bottommost layer within the first vertically alternating sequence (132L, 142L) to a top surface of the topmost layer of the first vertically alternating sequence (132L, 142L) with a straight vertical surface or with a straight tapered surface.

Generally, an alternating stack of insulating layers and spacer material layers (such as the first vertically alternating sequence (132L, 142L)) can be formed over a substrate 8 such that the spacer material layers are formed are, or are subsequently replaced with, electrically conductive layers. Each layer of the alternating stack is present in at least one memory array region 100 and a staircase region (located within an inter-array region 200) comprising stepped surfaces of the alternating stack.

Figure 4C:
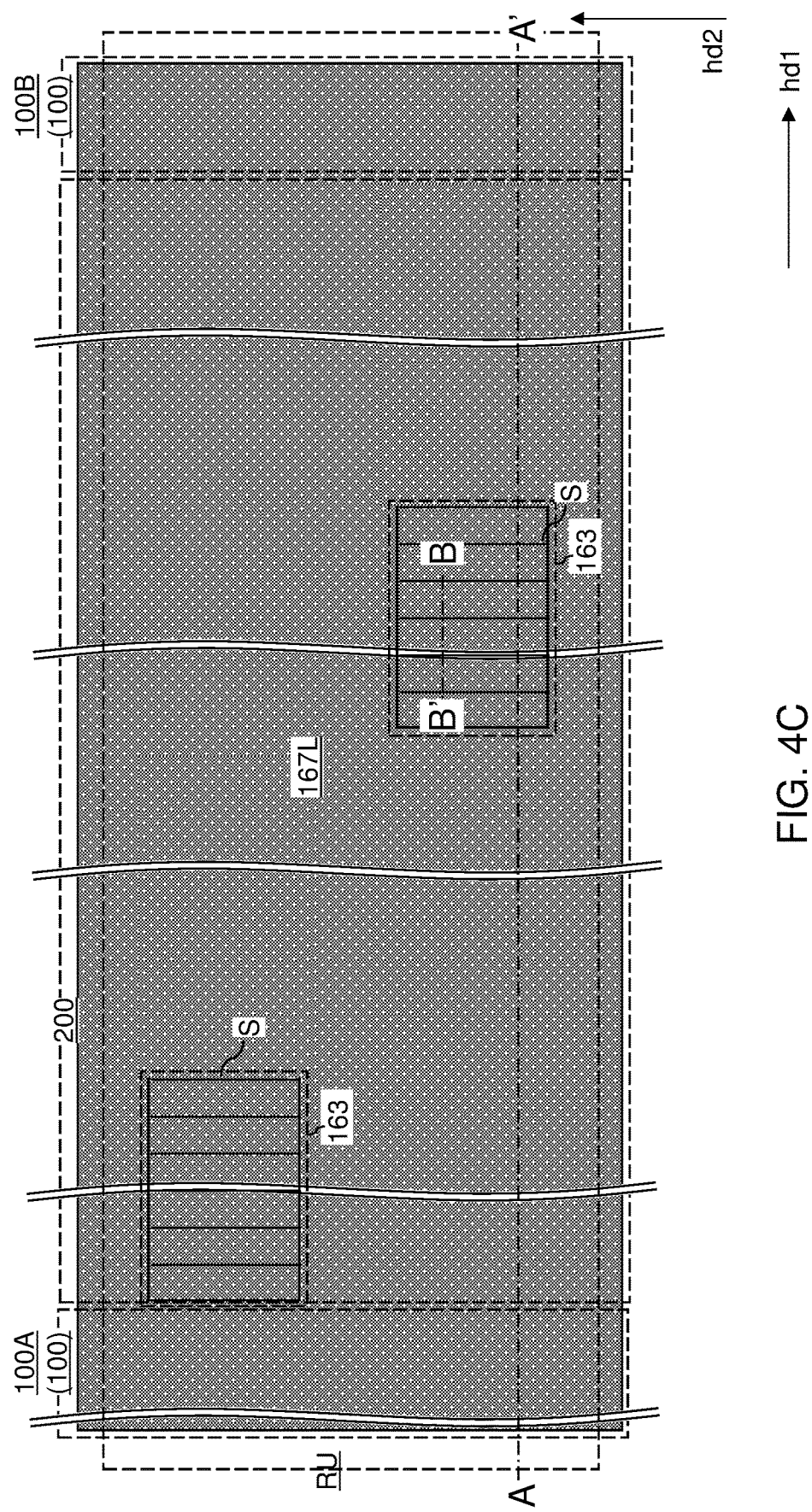
FIG. 4C is a top-down view of a region of the first exemplary structure of FIGS. 4A and 4B. The vertical cross-sectional plane A-A' is the plane of the vertical cross-sectional view of FIG. 4A. The vertical cross-sectional plane B-B' is the plane of the vertical cross-sectional view of FIG. 4B.

Referring to FIGS. 4A-4C, a first insulating liner 166 can be deposited over and on the first stepped surfaces of the first vertically alternating sequence (132L, 142L) by a conformal deposition process. The first insulating liner 166 comprises a dielectric material that is different from the material of the first continuous sacrificial material layers 142L. In one embodiment, the first insulating liner 166 comprises silicon oxide or a dielectric metal oxide material such as aluminum oxide, titanium oxide, tantalum oxide, hafnium oxide, lanthanum oxide, etc. In one embodiment, the first insulating liner 166 consists essentially of a second silicon oxide material. The first insulating liner 166 can be deposited by a conformal deposition process such as a chemical vapor deposition process. The first insulating liner 166 overlies the stepped surfaces of the first vertically alternating sequence (132L, 142L) and comprises horizontal top surface segments and vertical sidewall segments that are adjoined to each other. The thickness of the first insulating liner 166 may be greater than, equal to, or less than the thickness of each of the first continuous insulating layers 132L. In one embodiment, the thickness of the first insulating liner 166 may be less than the thickness of a first continuous insulating layer 132L. For example, the thickness of the first insulating liner 166 may have a thickness in a range from 3 nm to 60 nm, such as from 6 nm to 30 nm, although lesser and greater thicknesses may also be employed.

A first continuous dielectric liner 167L comprising a different dielectric material than the material of the first insulating liner 166 can be conformally deposited over and directly on the physically exposed surfaces of the first insulating liner 166. In one embodiment, the first continuous dielectric liner 167L may comprise a same dielectric material as the first continuous sacrificial material layers 142L. In one embodiment, the first continuous dielectric liner 167L may comprise and/or may consist essentially of silicon nitride. The first continuous dielectric liner 167L can be deposited by a conformal deposition process such as a chemical vapor deposition process. The first continuous dielectric liner 167L overlies the stepped surfaces of the first vertically alternating sequence (132L, 142L) and comprises horizontal top surface segments and vertical sidewall segments that are adjoined to each other. The thickness of the first continuous dielectric liner 167L may be greater than, equal to, or less than the thickness of each of the first continuous insulating layers 132L. In one embodiment, the thickness of the first continuous dielectric liner 167L may be less than the thickness of a first continuous insulating layer 132L. For example, the thickness of the first continuous dielectric liner 167L may have a thickness in a range from 3 nm to 60 nm, such as from 6 nm to 30 nm, although lesser and greater thicknesses may also be employed.

Figure 5B:
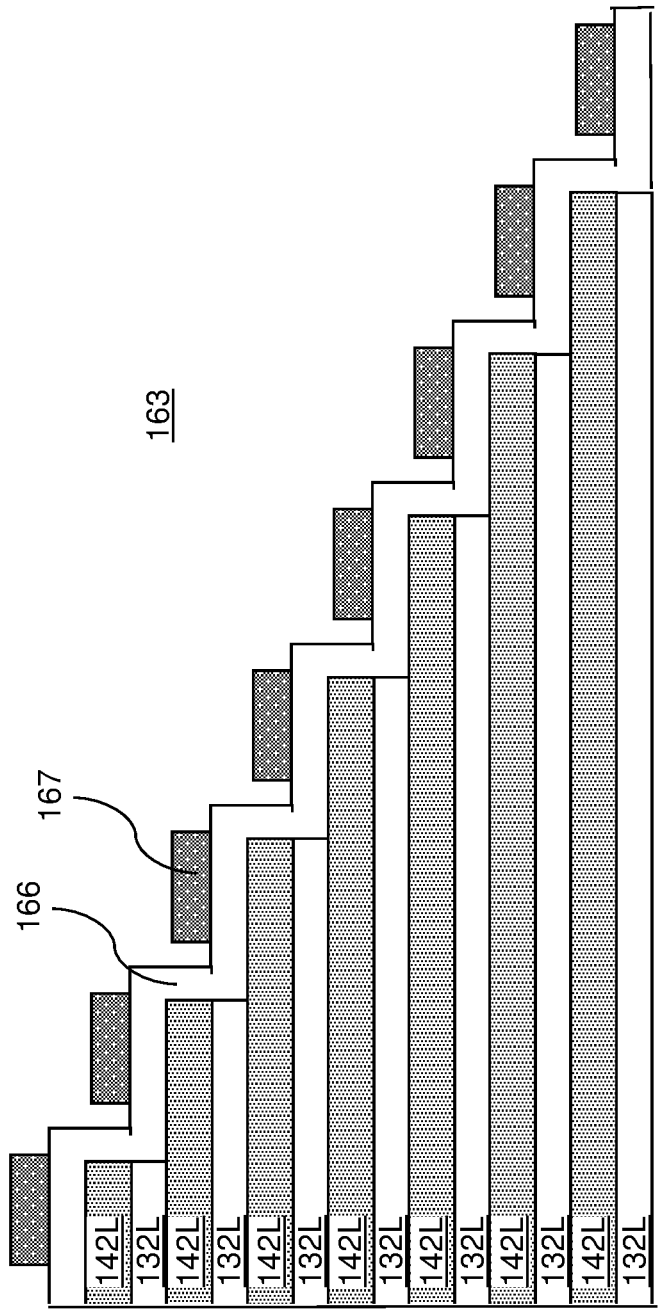
FIG. 5B is a magnified view of a portion of the first stepped surfaces of the first exemplary structure of FIG. 5A.
Figure 5C:
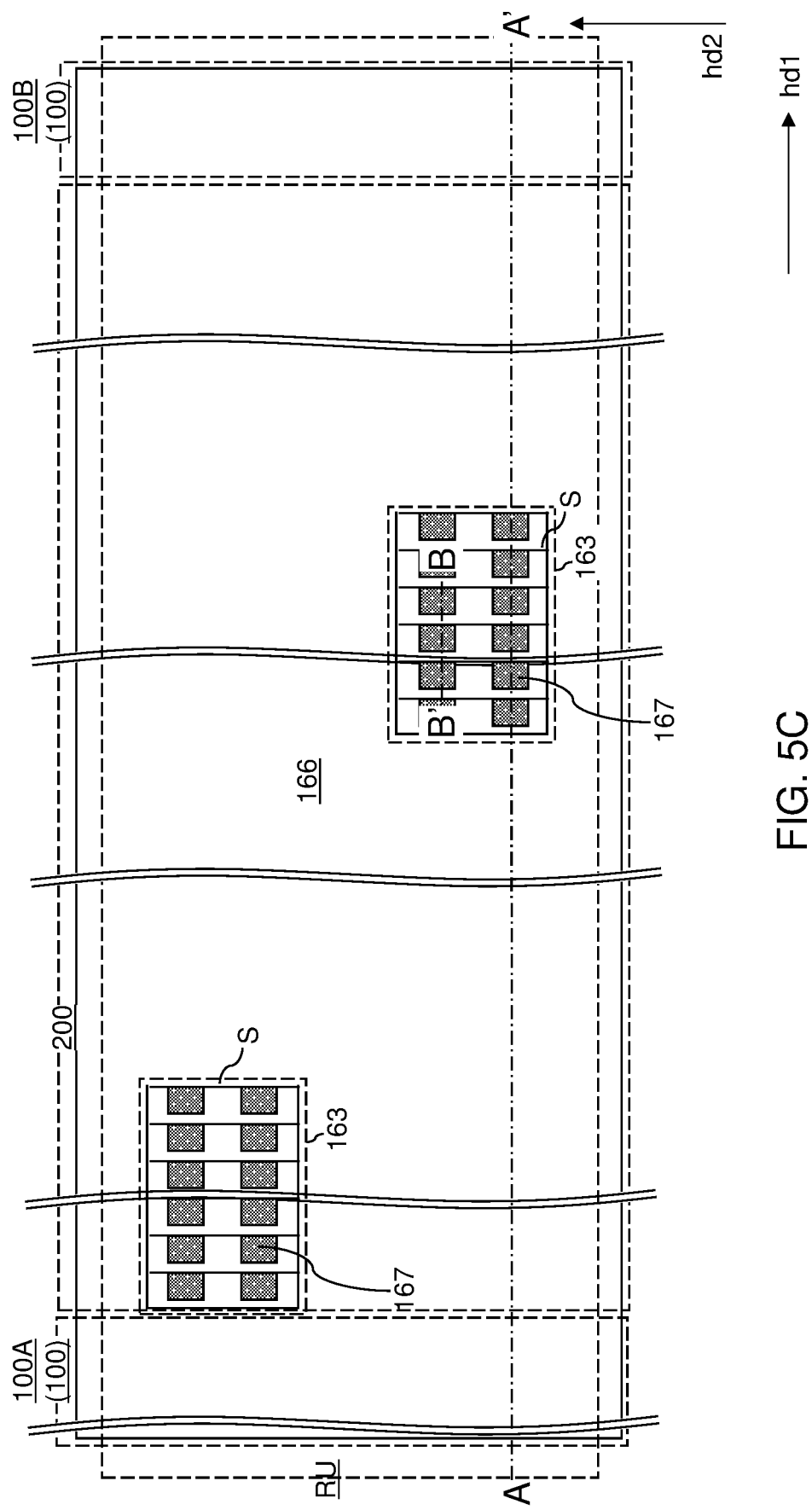
FIG. 5C is a top-down view of a region of the first exemplary structure of FIGS. 5A and 5B. The vertical cross-sectional plane A-A' is the plane of the vertical cross-sectional view of FIG. 5A. The vertical cross-sectional plane B-B' is the plane of the vertical cross-sectional view of FIG. 5B.

Referring to FIGS. 5A-5C, a photoresist layer (not shown) can be applied over the first continuous dielectric liner 167L, and can be lithographically patterned to cover horizontally-extending segments of the first continuous dielectric liner 167L located within areas of horizontally-extending segments of first stepped surfaces of the first vertically alternating sequence (132L, 142L). According to an aspect of the present disclosure, at least two rows of discrete patterned photoresist portions can be formed within each of the first stepped cavities 163. Each row of discrete patterned photoresist portions can be arranged along the first horizontal direction (i.e., word line direction) hd1, which is the horizontal direction that is perpendicular to the vertically-extending surfaces segments of the first stepped surfaces. In one embodiment, two rows of discrete patterned photoresist portions may be formed within each of the first stepped cavities 163. In this case, two rows of layer contact via structures can be subsequently formed in each area of a first stepped cavity. Alternatively, 2k rows of discrete patterned photoresist portions may be formed within each of the first stepped cavities 163, where the number k may be a positive integer greater than 1, such as 2 to 10. In this case, 2k rows of layer contact via structures can be subsequently formed in each area of a first stepped cavity. The photoresist layer does not cover the area outside the areas of the first stepped cavities 163. Generally, a photoresist layer can be applied and patterned over the first continuous dielectric liner 167L into rows of discrete patterned photoresist material portions within each of the first stepped cavities 163.

An etch process can be performed to remove portions of the first continuous dielectric liner 167L that are not masked by the discrete photoresist material portions. The etch process may be selective to the material of the first insulating liner 166 so that collateral etching of the first insulating liner 166 is minimal or non-existent. The etch process may comprise an isotropic etch process (such as a wet etch process) or an anisotropic etch process (such as a reactive ion etch process). Remaining portions of the first continuous dielectric liner 167L comprise a plurality of first discrete dielectric plates 167. The plurality of first discrete dielectric plates 167 may comprise multiple rows of first discrete dielectric plates 167 arranged along the first horizontal direction hd1 and located within a respective one of the first stepped cavities 163. At least two rows of first discrete dielectric plates 167 may be formed within each of the first stepped cavities 163. In one embodiment, the first continuous dielectric liner 167L may be patterned such that each of the plurality of first discrete dielectric plates 167 contacts a respective one of the horizontal top surface segments of the first insulating liner 166, and does not contact the vertical sidewall segments of the first insulating liner 166. The plurality of first discrete dielectric plates 167 are spaced apart from each other. Each row of first discrete dielectric plates 167 comprises a set of discrete dielectric plates 167 that are laterally spaced apart from each other along the first horizontal direction hd1 and vertically spaced apart from each other, i.e., have different vertical distances from the substrate 8.

Figure 6B:
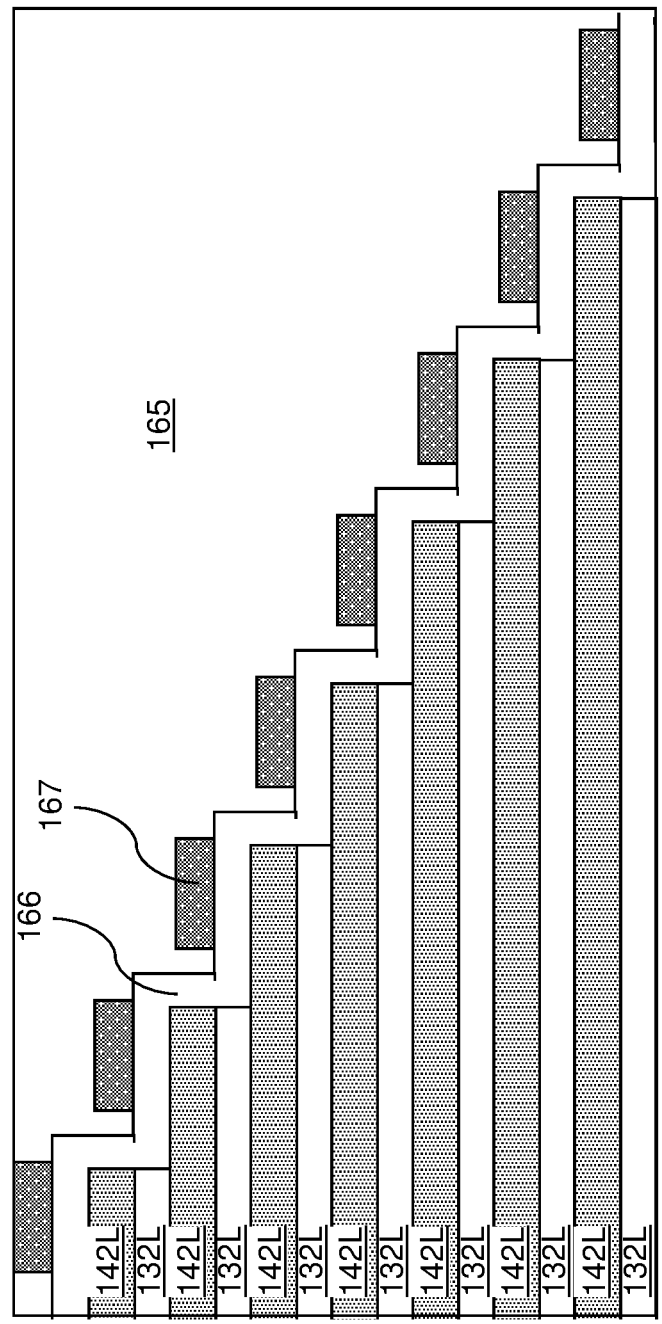
FIG. 6B is a magnified view of a portion of the first stepped surfaces of the first exemplary structure of FIG. 6A.

Referring to FIGS. 6A and 6B, a first dielectric fill material (such as undoped silicate glass (i.e., silicon oxide) or a doped silicate glass) can be deposited in each first continuous retro-stepped cavity. In one embodiment, the first dielectric fill material may comprise a third silicon oxide material (such as undoped silicate glass or a doped silicate glass). The first dielectric fill material can be planarized to remove excess portions of the first dielectric fill material from above the horizontal plane including the topmost surface of the first vertically alternating sequence (132L, 142L). Each remaining portion of the first dielectric fill material that fills a respective first continuous retro-stepped cavity constitutes a first-tier retro-stepped dielectric material portion 165. Generally, the first-tier retro-stepped dielectric material portions 165 can be formed in inter-array regions 200 located between a respective first memory array region 100A and a respective second memory array region 100B that are laterally spaced apart along the first horizontal direction hd1. Each discrete dielectric plate 167 comprises a top surface and at least two sidewalls that are contacted by surfaces of a respective one of the first-tier retro-stepped dielectric material portions 165.

Figure 7:
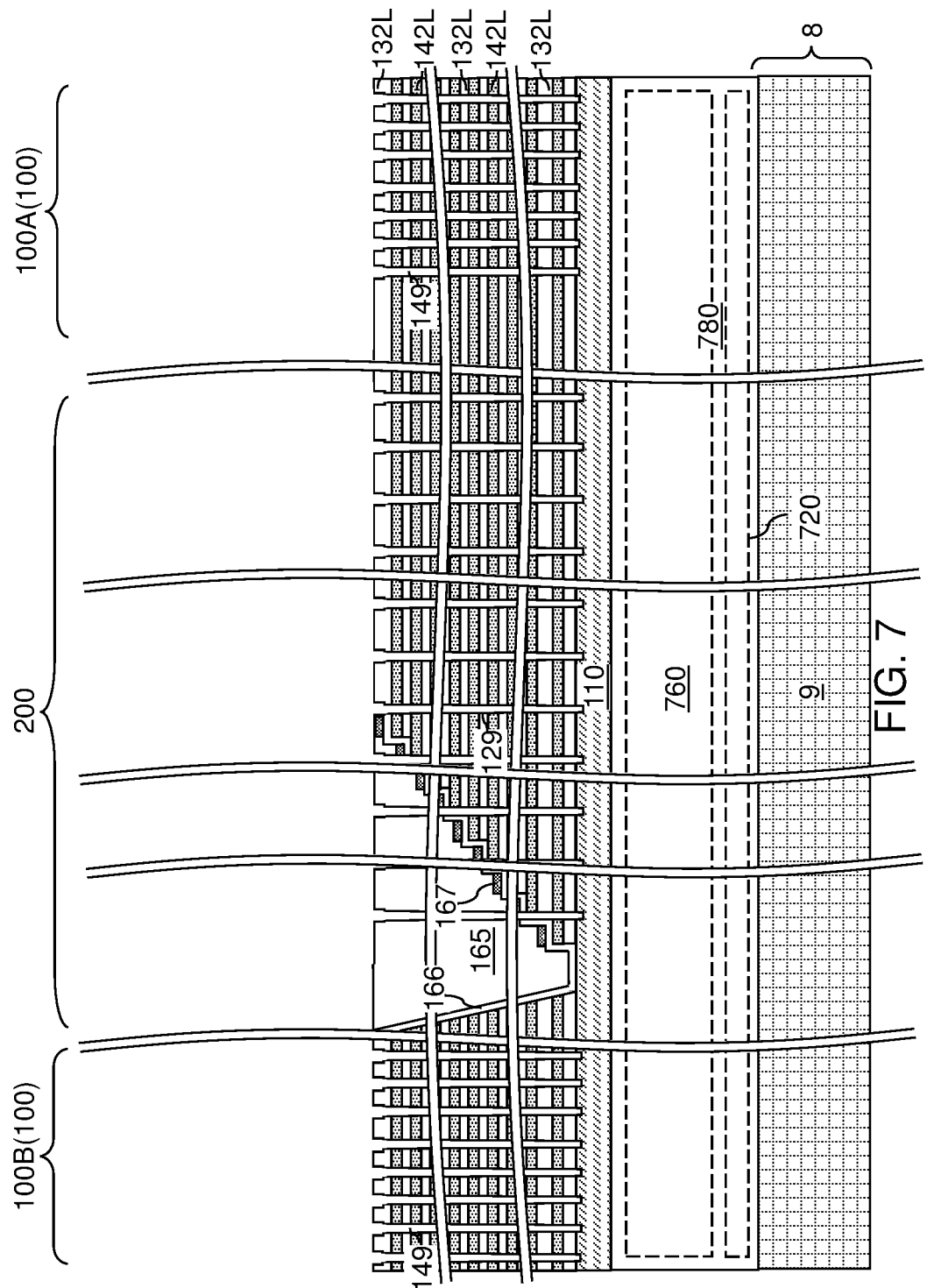
FIG. 7 is a vertical cross-sectional view of the first exemplary structure after formation of first-tier openings according to the first embodiment of the present disclosure.

Referring to FIG. 7, various first-tier openings may be formed through the first vertically alternating sequence (132L, 142L) and into the semiconductor material layer 110. A photoresist layer (not shown) may be applied over the first vertically alternating sequence (132L, 142L), and may be lithographically patterned to form various openings therethrough. The pattern of openings in the photoresist layer may be transferred through the first vertically alternating sequence (132L, 142L) and into the semiconductor material layer 110 by a first anisotropic etch process to form the various first-tier openings concurrently, i.e., during the first isotropic etch process. The various first-tier openings may include first-tier memory openings formed in the memory array regions 100 and first-tier support openings formed in the inter-array region 200. Each cluster of first-tier memory openings may be formed as a two-dimensional array of first-tier memory openings. The first-tier support openings are openings that are formed in the inter-array region 200, and are subsequently employed to form support pillar structures. A subset of the first-tier support openings may be formed through a respective horizontal surface of the first stepped surfaces.

Figure 8:
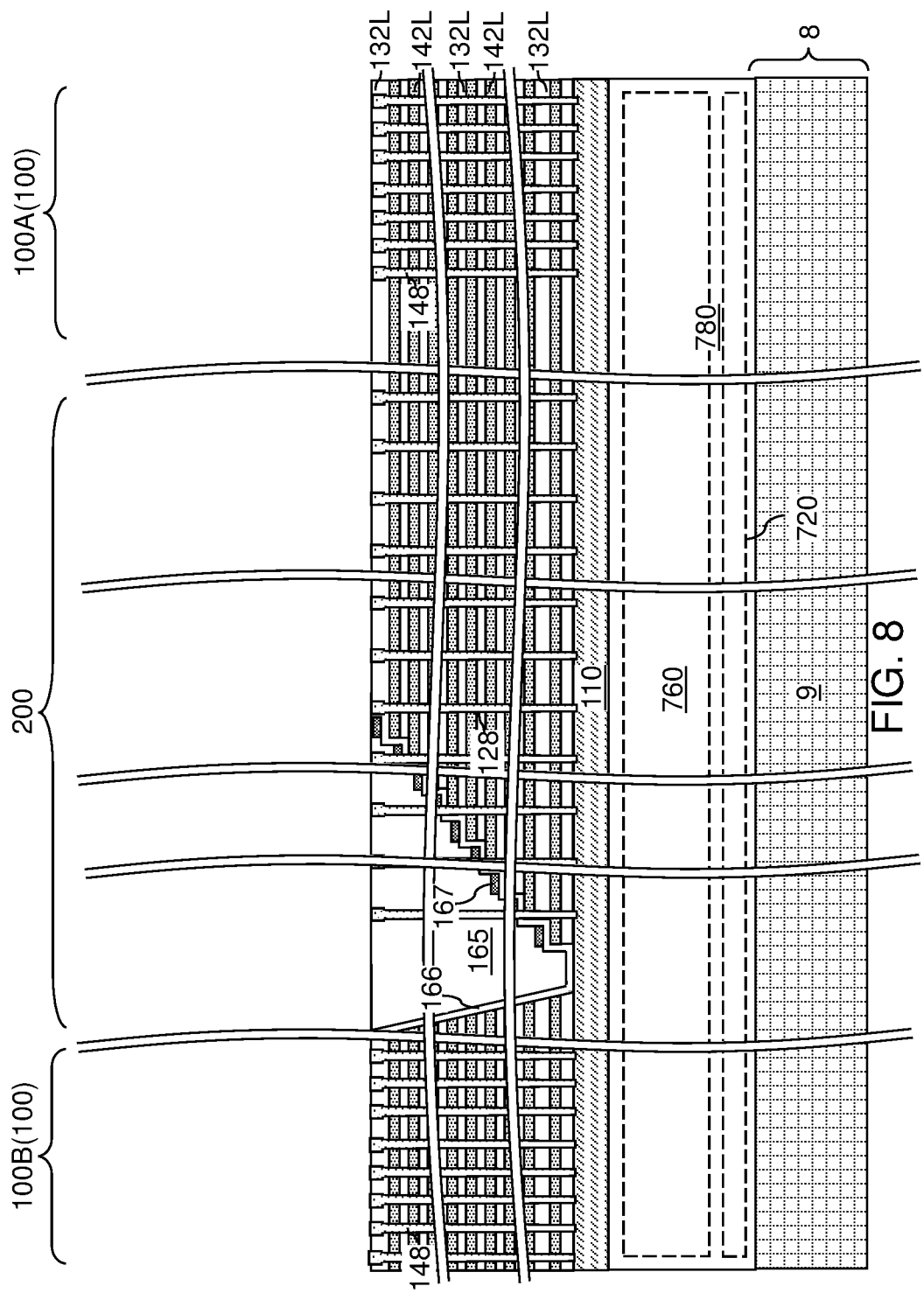
FIG. 8 is a vertical cross-sectional view of the first exemplary structure after formation of sacrificial first-tier opening fill portions according to the first embodiment of the present disclosure.

Referring to FIG. 8, sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first continuous insulating layers 132L and the first continuous sacrificial material layers 142L. In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first continuous insulating layers 132L. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetra-ethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132L, 142L).

Portions of the deposited sacrificial material may be removed from above the topmost layer of the first vertically alternating sequence (132L, 142L), such as from above the topmost first continuous insulating layer 132L. For example, the sacrificial first-tier fill material may be recessed to a top surface of the topmost first continuous insulating layer 132L using a planarization process. The planarization process may include a recess etch, chemical mechanical planarization (CMP), or a combination thereof. The top surface of the topmost first continuous insulating layer 132L may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first vertically alternating sequence (132L, 142L) (such as from above the top surface of the topmost first continuous insulating layer 132L). The top surfaces of the sacrificial first-tier opening fill portions (148, 128) may be coplanar with the top surface of the topmost first continuous insulating layer 132L. Each of the sacrificial first-tier opening fill portions (148, 128) may, or may not, include cavities therein. The set of all structures located between the bottommost surface of the first vertically alternating sequence (132L, 142L) and the topmost surface of the first vertically alternating sequence (132L, 142L) or embedded within the first vertically alternating sequence (132L, 142L) constitutes a first-tier structure.

Figure 9:
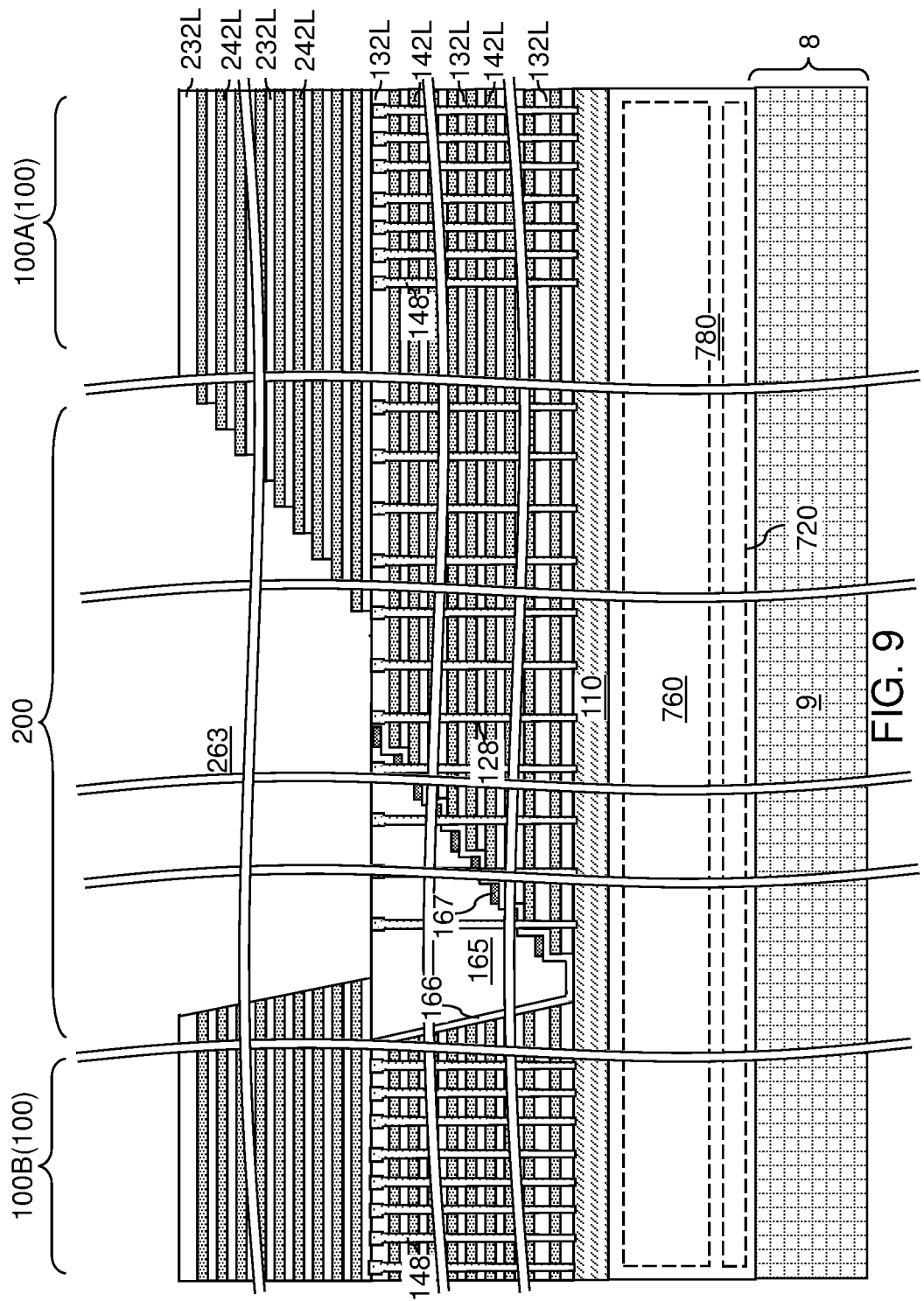
FIG. 9 is a vertical cross-sectional view of the first exemplary structure after formation of a second vertically alternating sequence of second continuous insulating layers and second continuous sacrificial material layers and second stepped surfaces according to the first embodiment of the present disclosure.

Referring to FIG. 9, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second sacrificial material layers 242L includes is a sacrificial material layer that includes a dielectric material and continuously extends over the entire area of the substrate 8, and may have a uniform thickness throughout. The second continuous insulating layers 232L can have the same material composition and the same thickness as the first continuous insulating layers 132L. The second sacrificial material layers 242L can have the same material composition and the same thickness as the first continuous sacrificial material layers 142L.

Generally, at least one additional vertically alternating sequence of additional continuous insulating layers and additional continuous sacrificial material layers can be optionally formed over the first vertically alternating sequence (132L, 142L) and the first-tier retro-stepped dielectric material portions 165.

Second stepped surfaces can be formed within the staircase regions of the inter-array region 200. For example, a combination of a sacrificial hard mask layer and a trimming mask layer may be employed to form the second stepped surfaces. In one embodiment, a row of multiple second staircase regions can be formed within each area that corresponds to a combination of the area of a laterally-neighboring pair of second-tier retro-stepped dielectric material portions 265 and an intervening area. In this case, the multiple second staircase regions can be subsequently vertically offset by different depths by subsequently performing area recess etch processes.

In an illustrative example, $2^N$ sets of second stepped surfaces can be formed within a combination of the area of a laterally-neighboring pair of second-tier retro-stepped dielectric material portions 265 and an intervening area. N can be an integer in a range from 2 to 8. Each set of second stepped staircases may include P steps such that sidewalls of Q second continuous spacer material layers are physically exposed with lateral offsets. Q may be an integer from 2 to 64. M area recess etch processes can be performed such that each area recess etch process vertically recesses Q times $2^j$ sets of a second continuous insulating layer 232L and a second continuous sacrificial material layer 242L, in which j is a different integer from 0 to (N−1). A total of up to $2^N \times Q$ stepped surfaces can be formed for the second vertically alternating sequence of the second continuous insulating layers 232L and the second continuous sacrificial material layers 242L. The total number of the stepped surfaces within each continuous cavity overlying the second stepped surfaces can be the same as the total number of the second continuous sacrificial material layers 242L in the second vertically alternating sequence (132L, 242L). A second stepped cavity 263 overlies each continuous set of second stepped surfaces.

Figure 10:
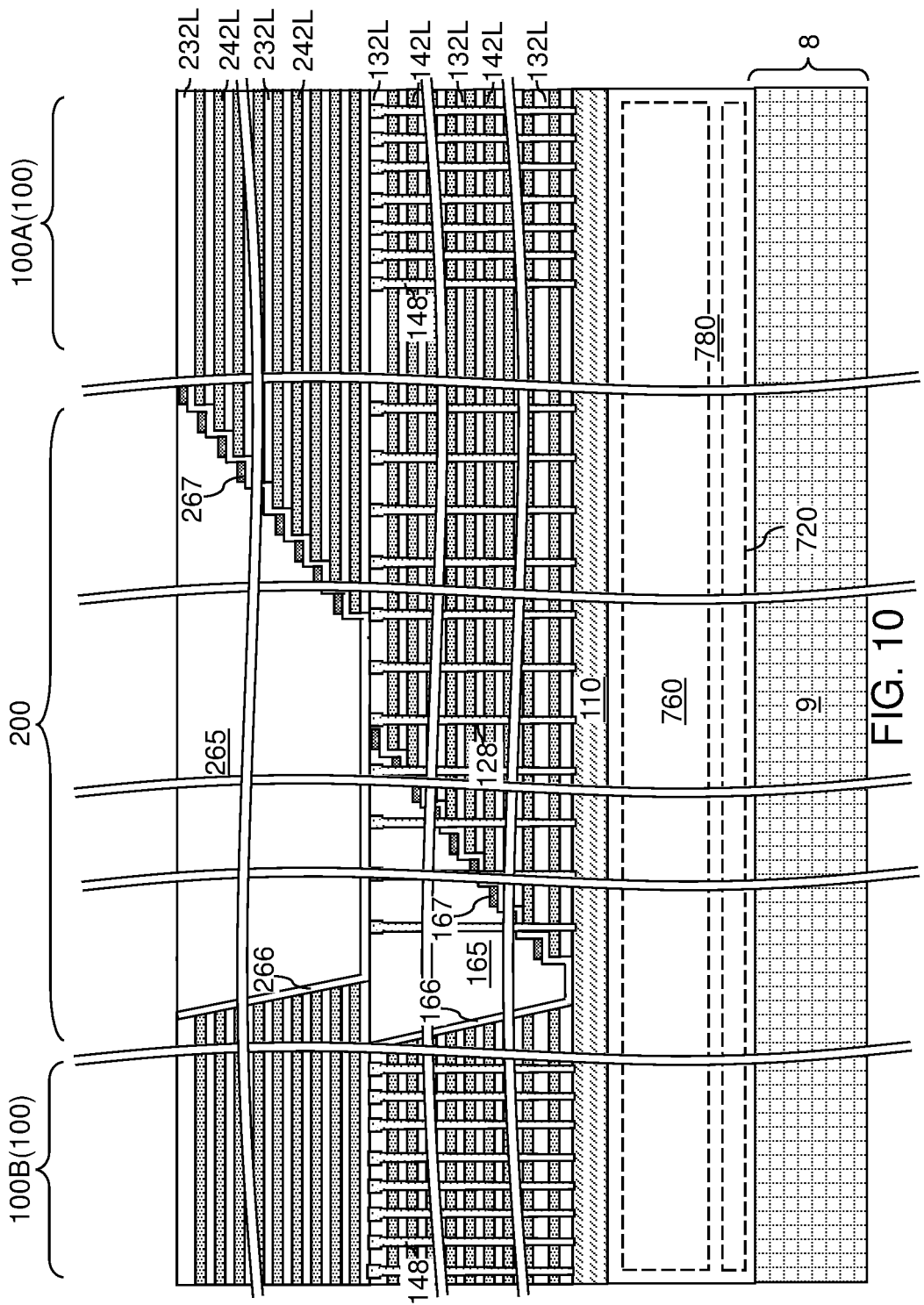
FIG. 10 is a vertical cross-sectional view of the first exemplary structure after formation of a second insulating liner, second discrete dielectric plates, and a second-tier retro-stepped dielectric material portion according to the first embodiment of the present disclosure.

Referring to FIGS. 10, the processing steps of FIGS. 4A-4C, 5A-5C, and 6A and 6B can be performed with any needed changes to form a second insulating liner 266, second discrete dielectric plates 267, and second retro-stepped dielectric material portions 265 filling the second stepped cavities 263. The material and/or the thickness of the second insulating liner 266 may be the same as the material and/or the thickness of the first insulating liner 166. The material and/or the thickness of the second discrete dielectric plates 267 may be the same as the material and/or the thickness of the first discrete dielectric plates 167. At least two rows of second discrete dielectric plates 267 arranged along the first horizontal direction hd1 may be formed within each of the second stepped cavities 263. In one embodiment, the second discrete dielectric plates 267 may be formed by depositing and patterning a second dielectric liner in the same manner that is employed to form the first discrete dielectric plates 167 with modifications to the processing steps as needed. The material of the second retro-stepped dielectric material portion 265 may be the same as the material of the first retro-stepped dielectric material portion 165.

For formation of the second retro-stepped dielectric material portions 265, a second dielectric fill material (such as undoped silicate glass (i.e., silicon oxide) or a doped silicate glass) can be deposited in each second continuous retro-stepped cavity. The second dielectric fill material can be planarized to remove excess portions of the second dielectric fill material from above the horizontal plane including the topmost surface of the second vertically alternating sequence (232L, 242L). Each remaining portion of the second dielectric fill material that fills a respective second continuous retro-stepped cavity constitutes a second-tier retro-stepped dielectric material portion 265.

Generally, a second-tier structure is formed, which comprises a second vertically alternating sequence of second continuous insulating layers 232L and second continuous sacrificial material layers 242L and second-tier retro-stepped dielectric material portions 265 overlying second stepped surfaces of the second vertically alternating sequence that are located in the inter-array regions 200.

Figure 11:
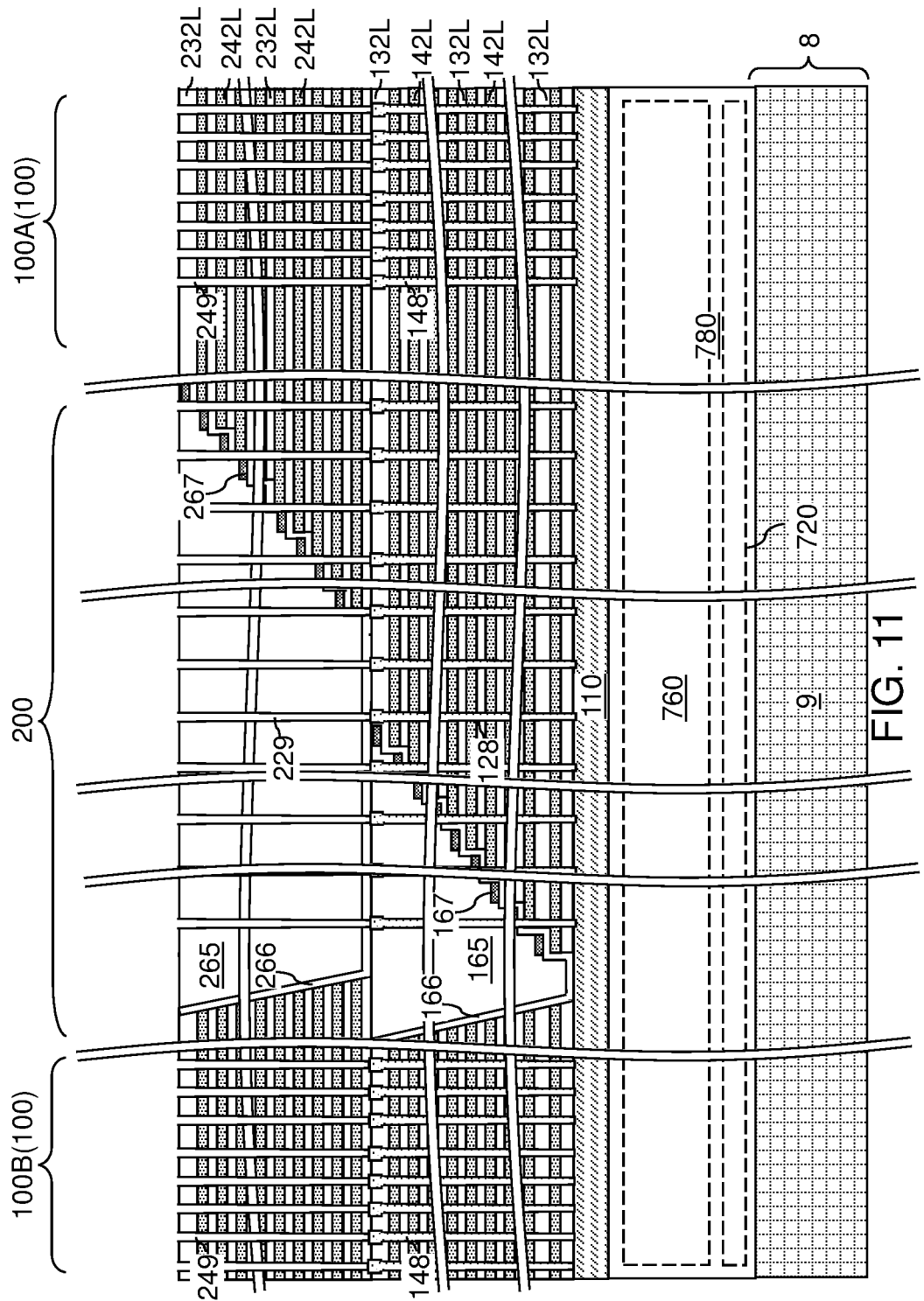
FIG. 11 is a vertical cross-sectional view of the first exemplary structure after formation of second-tier openings according to the first embodiment of the present disclosure.

Referring to FIG. 11, various second-tier openings (249, 229) may be formed through the second vertically alternating sequence (232L, 242L) and over the sacrificial first-tier opening fill portions (148, 128). A photoresist layer (not shown) may be applied over the second vertically alternating sequence (232L, 242L), and may be lithographically patterned to form various openings therethrough. The pattern of openings in the photoresist layer may be transferred through the second vertically alternating sequence (232L, 242L) to form the various second-tier openings (249, 229) concurrently, i.e., during the second isotropic etch process.

The various second-tier openings (249, 229) may include second-tier memory openings 249 formed in the memory array regions 100 and second-tier support openings 229 formed in the inter-array region 200. Each second-tier opening (249, 229) may be formed within the area of a respective one of the sacrificial first-tier opening fill portions (148, 128). Thus, a top surface of a sacrificial first-tier opening fill portion (148, 128) can be physically exposed at the bottom of each second-tier opening (249, 229). Specifically, each second-tier memory openings 249 can be formed directly over a respective sacrificial first-tier memory opening fill portion 148, and each second-tier support opening 229 can be formed directly over a respective sacrificial first-tier support opening fill portion 128. Each cluster of second-tier memory openings 249 may be formed as a two-dimensional array of second-tier memory openings 249. The second-tier support openings 229 are openings that are formed in the inter-array region 200, and are subsequently employed to form support pillar structures. A subset of the second-tier support openings may be formed through a respective horizontal surface of the second stepped surfaces.

Figure 12A:
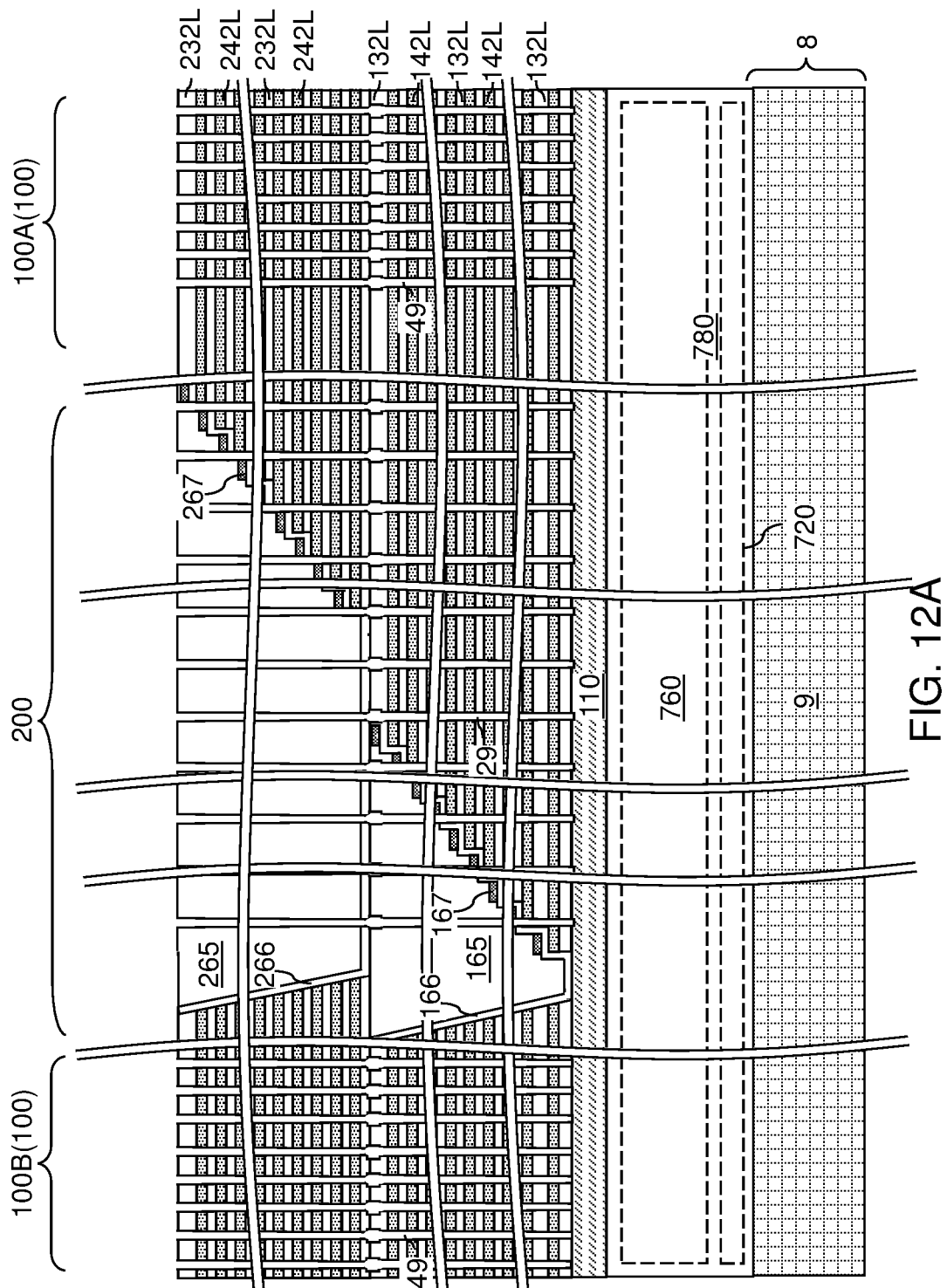
FIG. 12A is a vertical cross-sectional view of the first exemplary structure after formation of inter-tier memory openings and inter-tier support openings according to the first embodiment of the present disclosure.
Figure 12B:
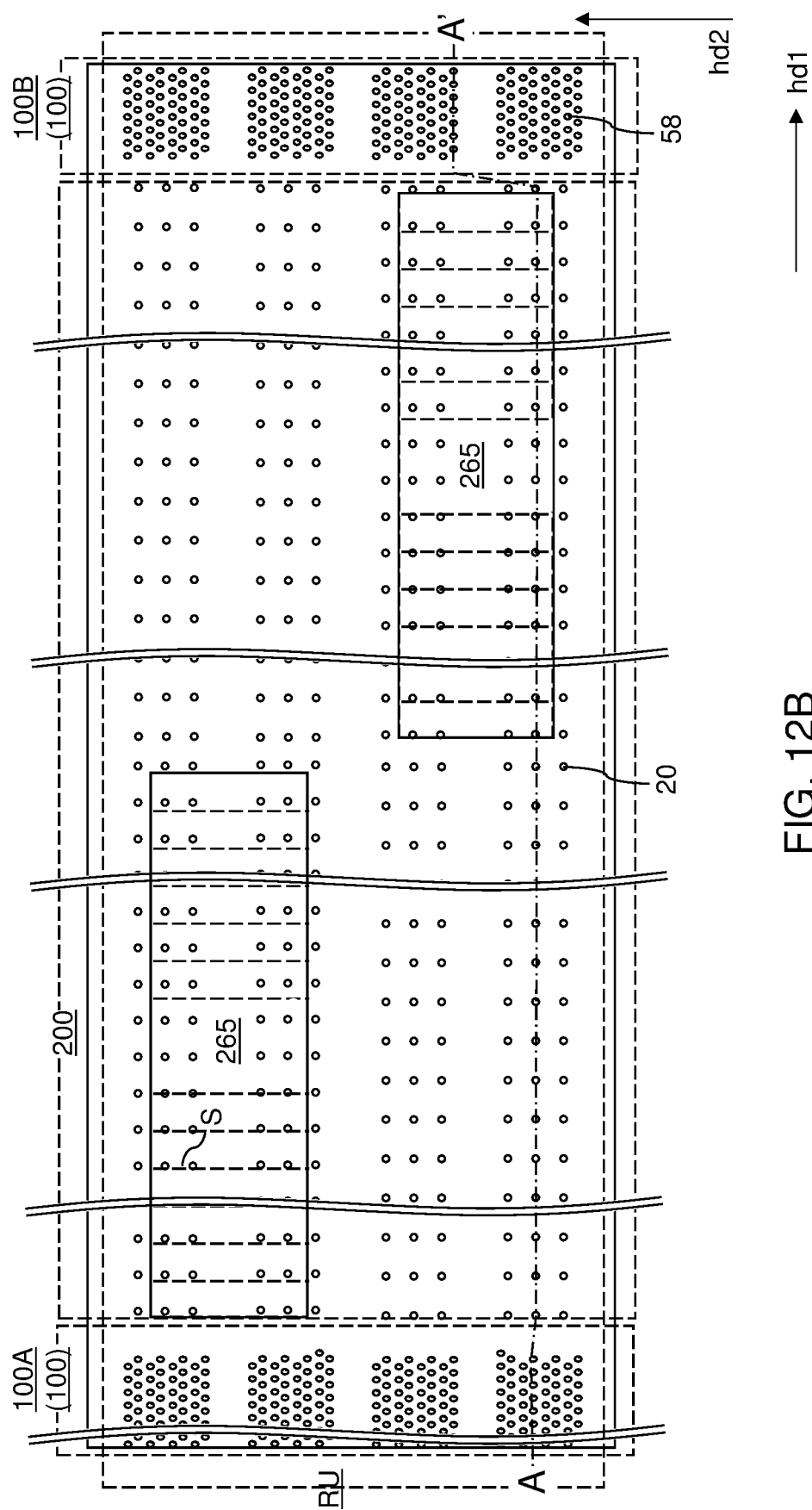
FIG. 12B is a top-down view of a region of the first exemplary structure of FIG. 12A. The vertical cross-sectional plane A-A' is the plane of the vertical cross-sectional view of FIG. 12A.

Referring to FIGS. 12A and 12B, the sacrificial first-tier fill material of the sacrificial first-tier opening fill portions (148, 128) may be removed using an etch process that etches the sacrificial first-tier fill material selective to the materials of the first and second continuous insulating layers (132L, 232L) and the first and second continuous sacrificial material layers (142L, 242L). A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening 29, is formed in each combination of a second-tier support openings and a volume from which a sacrificial first-tier support opening fill portion 128 is removed. The inter-tier memory opening 49 extends through the first-tier structure and the second-tier structure. Generally, memory openings 49 can be formed within each memory array region 100, in which each layer of the first vertically alternating sequence (132L, 142L) and each layer within the second vertically alternating sequence (232L, 242L) are present.

FIGS. 13A-13D illustrate sequential vertical cross-sectional views of a memory opening during formation of a memory opening fill structure 58 according to the first embodiment of the present disclosure.

Figures 13A, 13B:
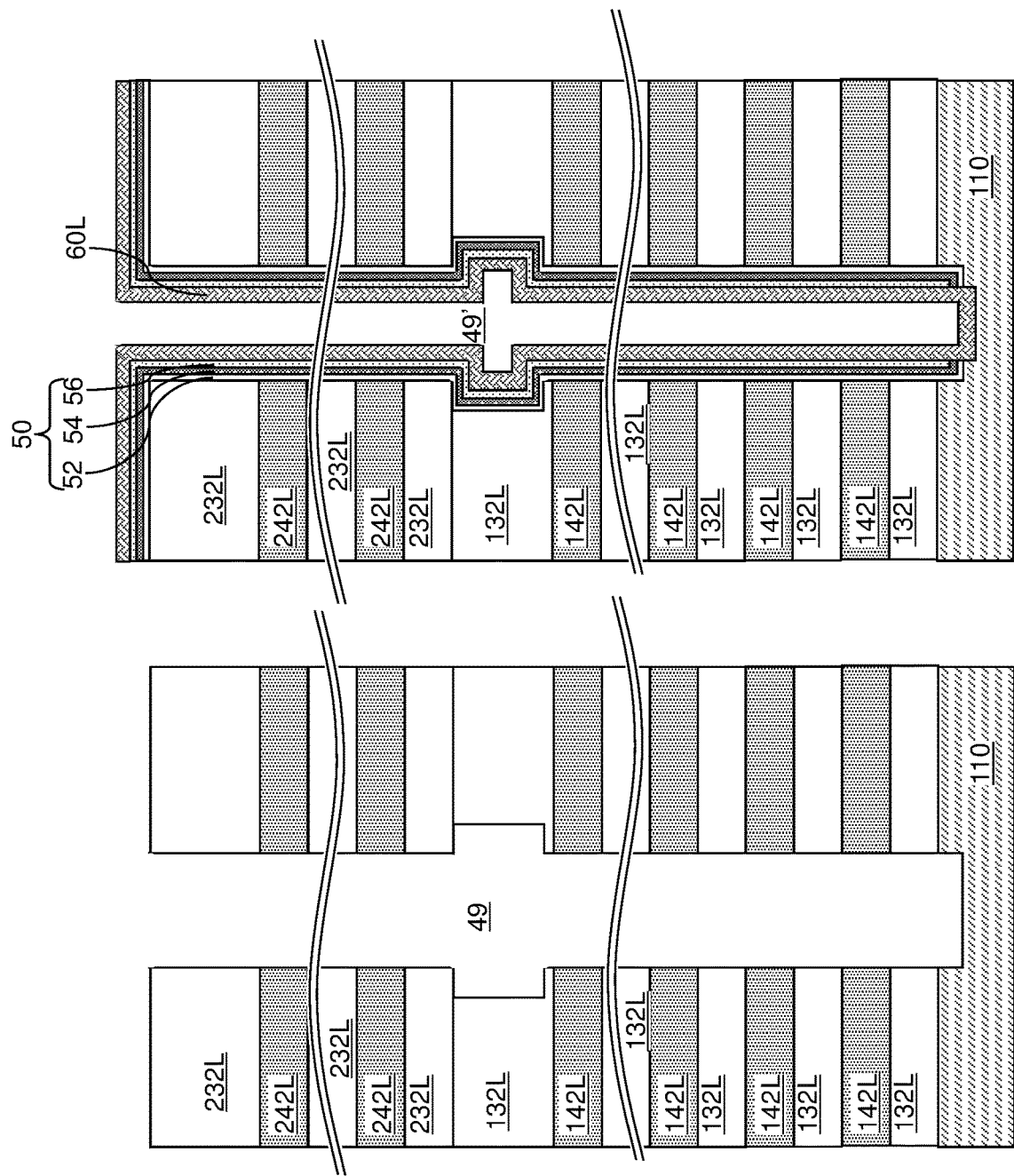
FIGS. 13A-13D illustrate sequential vertical cross-sectional views of a memory opening during formation of a memory opening fill structure according to the first embodiment of the present disclosure.

Referring to FIG. 13A, a memory opening 49 in the first exemplary structure of FIGS. 12A and 12B is illustrated.

Referring to FIG. 13A, a memory opening 49 in the first exemplary structure of FIGS. 12A and 12B is illustrated.

Referring to FIG. 13B, a stack of layers including a blocking dielectric layer 52, a memory material layer 54, a tunneling dielectric layer 56, and a sacrificial cover layer (not shown) may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include a layer stack of an aluminum oxide layer and a silicon oxide layer.

Subsequently, the memory material layer 54 may be formed. In one embodiment, the memory material layer 54 may be a continuous layer or patterned discrete portions of a charge trapping material including a dielectric charge trapping material, which may be, for example, silicon nitride. Alternatively, the memory material layer 54 may include a continuous layer or patterned discrete portions of a conductive material such as doped polysilicon or a metallic material that is patterned into multiple electrically isolated portions (e.g., floating gates), for example, by being formed within lateral recesses into continuous sacrificial material layers (142L, 242L). The thickness of the memory material layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. The thickness of the tunneling dielectric layer 56 may be in a range from 2 nm to 20 nm, although lesser and greater thicknesses may also be used. The stack of the blocking dielectric layer 52, the memory material layer 54, and the tunneling dielectric layer 56 constitutes a memory film 50 that stores memory bits. The sacrificial cover layer includes a sacrificial material that may be removed selective to the tunneling dielectric layer 56. For example, the sacrificial cover layer may comprise amorphous carbon or amorphous silicon.

An anisotropic etch process may be performed to remove horizontally-extending portions of the sacrificial cover layer. Each remaining contiguous set of cylindrical portions of the blocking dielectric layer 52, the memory material layer 54, and the tunneling dielectric layer 56 constitutes a memory film 50.

A semiconductor channel material layer 60L can be subsequently deposited on the physically exposed surfaces of the memory substrate 108 and on inner sidewalls of the memory films 50. The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L). A cavity 49' may be present in an unfilled volume of each memory opening 49.

Figure 13D:
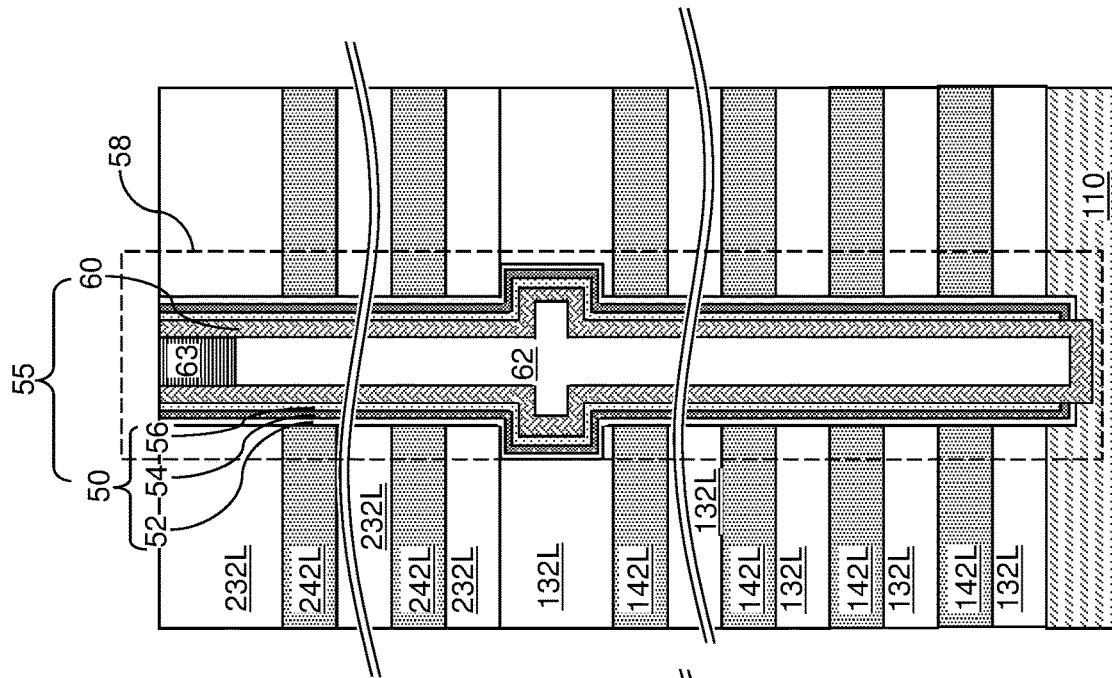
Figure 13C:
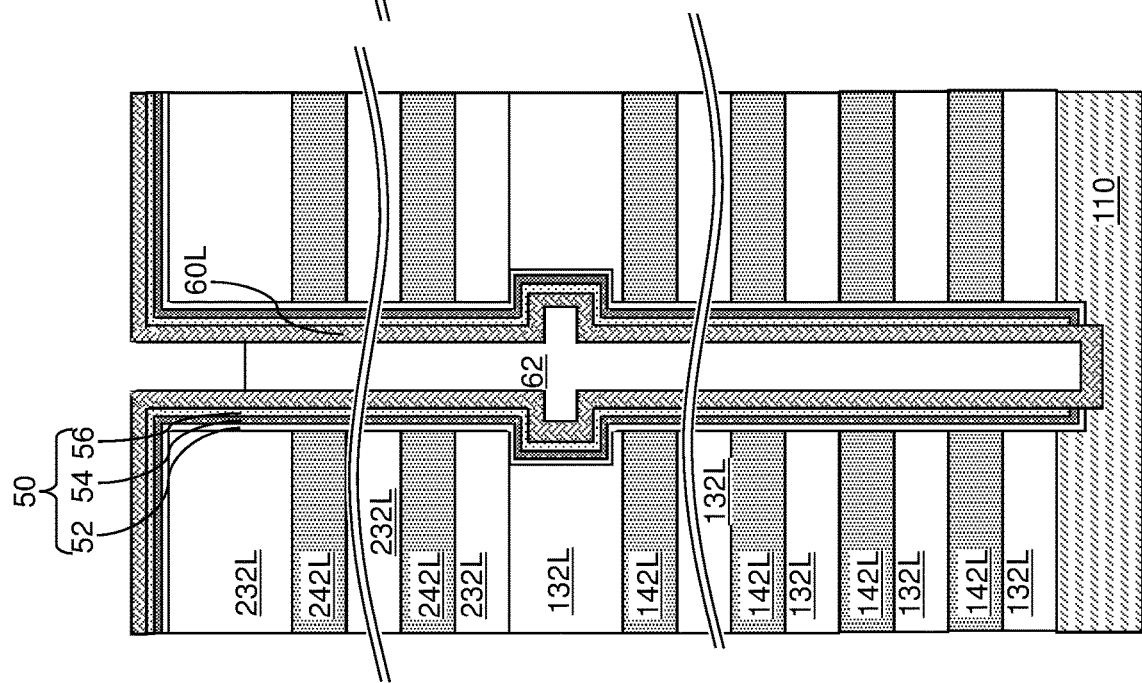

Referring to FIG. 13C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second continuous insulating layer 232L may be removed, for example, by a recess etch. The recess etch continues until top surfaces of the remaining portions of the dielectric core layer are recessed to a height between the top and bottom surfaces of the topmost second insulating layer 232L. Each remaining portion of the dielectric core layer constitutes a dielectric core 62.

Referring to FIG. 13D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the memory material layer 54, and the blocking dielectric layer 52 that overlie the horizontal plane including the top surface of the topmost second continuous insulating layer 232L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a memory material layer 54, and laterally surrounds a vertical semiconductor channel 60. Each adjoining set of a blocking dielectric layer 52, a memory material layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the memory material layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58.

Generally, memory opening fill structures 58 are formed within the memory openings 49. Each of the memory opening fill structures 58 comprises a respective memory film 50 and a respective vertical semiconductor channel 60.

In one embodiment, each of the memory stack structures 55 comprises vertical NAND string including the respective vertical stack of memory elements (comprising portions of a memory material layer 54 located at levels of the continuous sacrificial material layers (142L, 242L)) and a vertical semiconductor channel 60 that vertically extend through the continuous sacrificial material layers (142L, 242L) adjacent to the respective vertical stack of memory elements.

Figure 14:
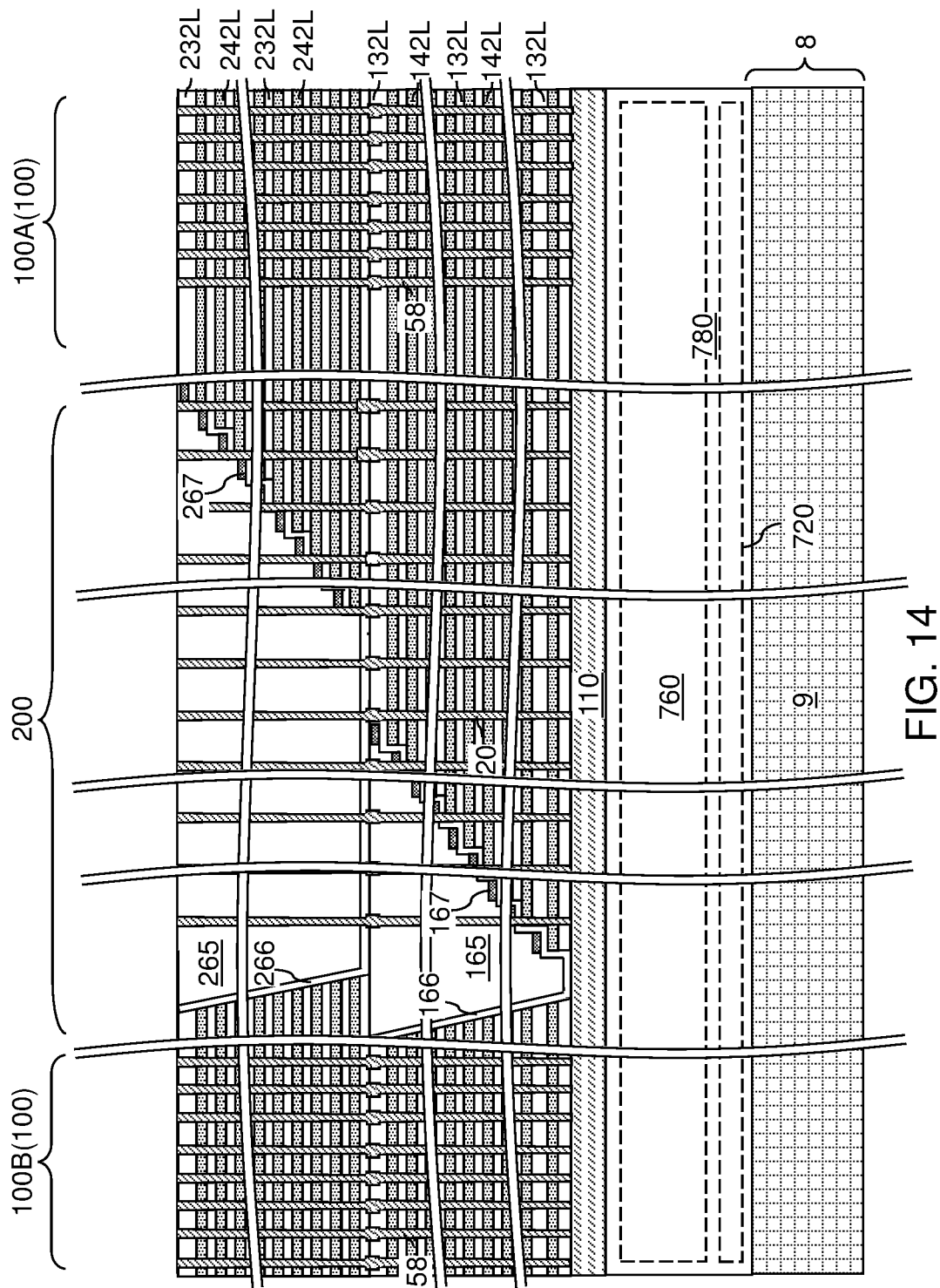
FIG. 14 is a schematic vertical cross-sectional view of the first exemplary structure after formation of memory opening fill structures and support pillar structures according to the first embodiment of the present disclosure.

Referring to FIG. 14, the first exemplary structure is illustrated after formation of the memory opening fill structures 58 and the support pillar structures 20. Generally arrays of memory opening fill structures 58 can be formed within the arrays of memory openings 49. Support pillar structures 20 are formed in the inter-array region 200. The support pillar structures 20 include first support pillar structures 20 that vertically extend through the second vertically alternating sequence (232L, 242L), a first-tier retro-stepped dielectric material portion 165, and a portion of the first vertically alternating sequence (132L, 142L) that underlies the first-tier retro-stepped dielectric material portion 165. The support pillar structures 20 further include second support pillar structures 20 that vertically extend through a second-tier retro-stepped dielectric material portion 265, a portion of the second vertically alternating sequence (232L, 242L) that underlies the second-tier retro-stepped dielectric material portion 265, and each layer within the first vertically alternating sequence (132L, 142L).

Figure 15A:
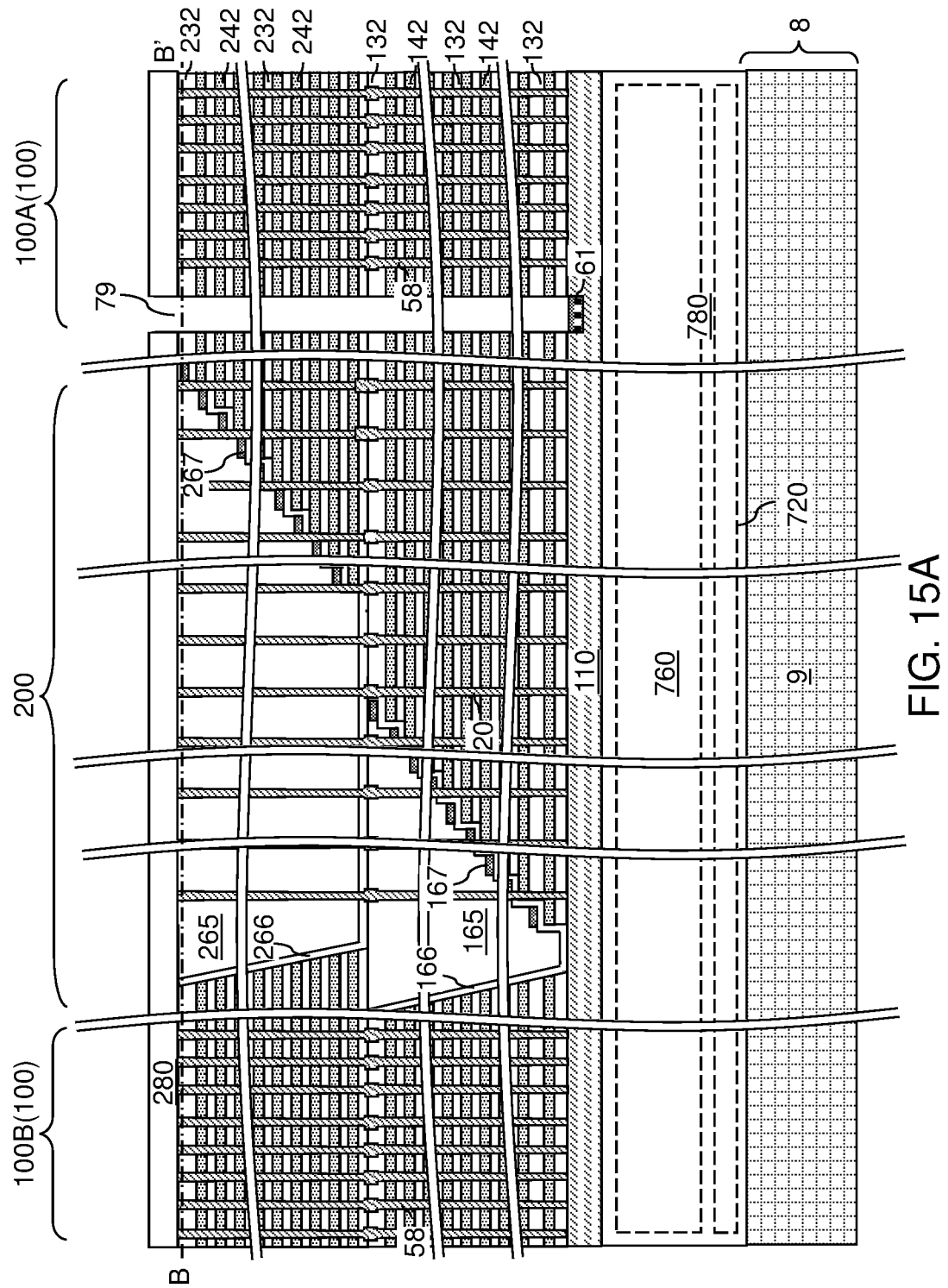
FIG. 15A is a schematic vertical cross-sectional view of the first exemplary structure after formation of a contact-level dielectric layer, backside trenches, and source regions according to the first embodiment of the present disclosure.
Figure 15B:
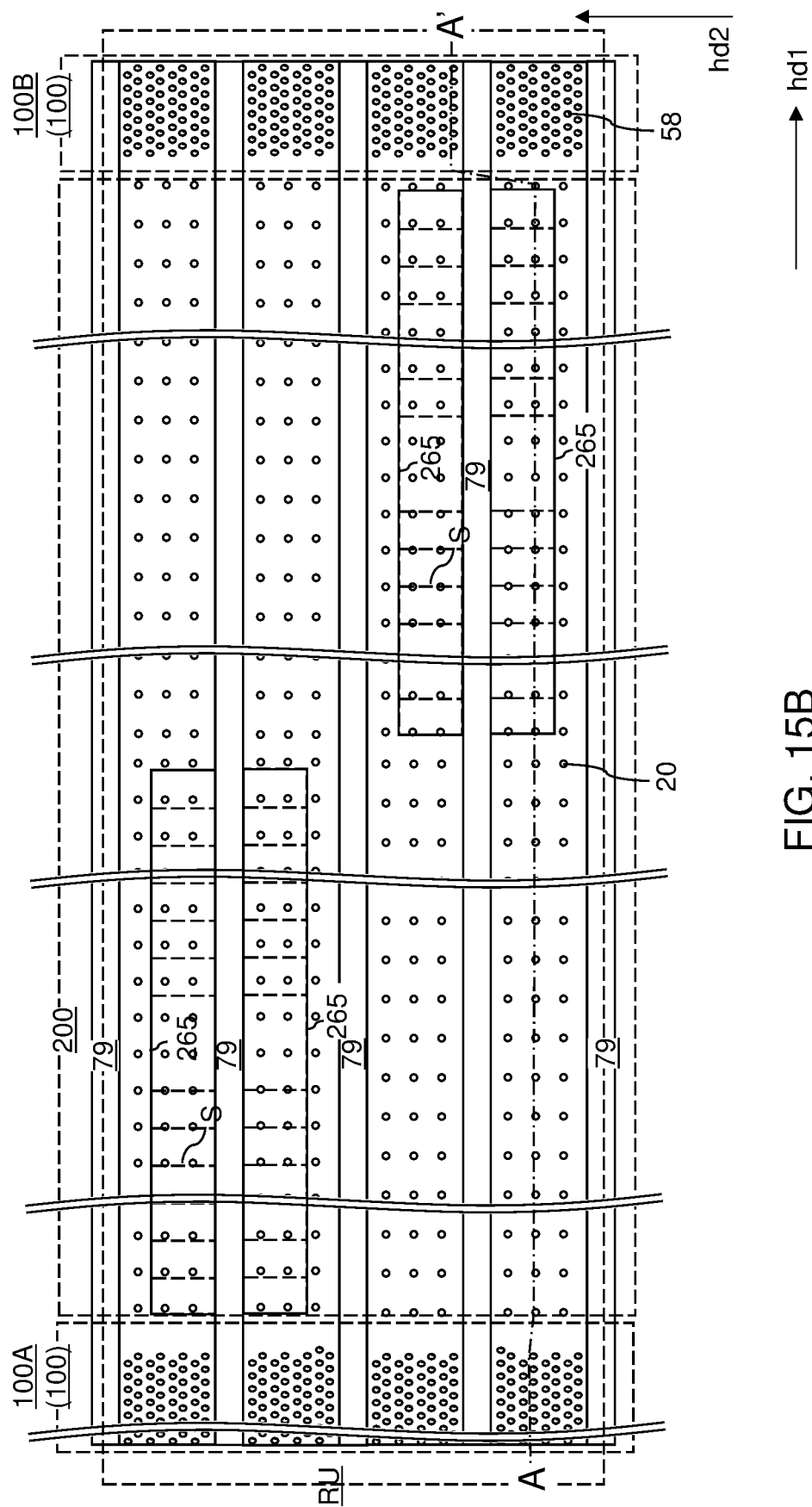
FIG. 15B is a top-down view of a region of the first exemplary structure of FIG. 15A. The vertical cross-sectional plane A-A' is the plane of the vertical cross-sectional view of FIG. 15A.

Referring to FIGS. 15A and 15B, a contact-level dielectric layer 280 may be formed over the second vertically alternating sequence (232L, 242L). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the trench fill structures 76 illustrated in FIGS. 1B-1F. The linear openings in the photoresist layer can be formed within areas in which memory opening fill structures 58 or the support pillar structures 20 are not present.

Backside trenches 79 may be formed by transferring the pattern in the photoresist layer (not shown) through the contact-level dielectric layer 280, the second-tier structure (232L, 242L, 265), and the first-tier structure (132L, 142L, 165), and into the semiconductor material layer 110. The pattern of the backside trenches 79 can be identical to the pattern of the trench fill structures 76 illustrated in FIGS. 1B-1F. Portions of the contact-level dielectric layer 280, the second-tier structure (232L, 242L, 265), the first-tier structure (132L, 142L, 165), and the semiconductor material layer 110 that underlie the linear openings in the photoresist layer may be removed by an anisotropic etch process to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 can be formed as a periodic one-dimensional array with a periodicity along the second horizontal direction hd2. The backside trenches 79 can be sequentially numerically numbered with positive integers from one side to another along the second horizontal direction hd2. In one embodiment, every odd-numbered backside trench 79 can extend through the second vertically alternating sequence (232L, 242L) and the first vertically alternating sequence (132L, 142L) without etching through the first-tier retro-stepped dielectric material portions 165 or the second-tier retro-stepped dielectric material portions 265. Every even-numbered backside trench 79 can extend through the second vertically alternating sequence (232L, 242L) and the first vertically alternating sequence (132L, 142L) and cut through a respective first-tier retro-stepped dielectric material portion 165 and a respective second-tier retro-stepped dielectric material portion 265.

Each vertically alternating sequence {(132L, 142L), (232L, 242L)} is divided into a plurality of alternating stacks of insulating layers (132 or 232) and sacrificial material layers (142, 242) (which correspond to volumes of memory blocks) by the backside trenches 79. Each backside trench 79 can laterally extend along the first horizontal direction hd1 through an inter-array region 200 and a pair of memory array regions 100 that are adjoined to inter-array region 200. Further, each backside trench 79 can vertically extend through an entire thickness of the vertically alternating sequences {(132L, 142L), (232L, 242L)}. Each patterned portion of the first vertically alternating sequence (132L, 142L) located between a neighboring pair of backside trenches 79 constitutes a first-tier alternating stack of first insulating layers 132 and first sacrificial material layers 142. Each patterned portion of the second vertically alternating sequence located between a neighboring pair of backside trenches 79 constitutes a second-tier alternating stack of second insulating layers 232L and second sacrificial material layers 242. A plurality of alternating stacks of insulating layers (132 or 232) and sacrificial material layers (which may be first sacrificial material layers 142 or second sacrificial material layers 242) can be formed.

Each first-tier retro-stepped dielectric material portion 165 may be divided into two disjoined first-tier retro-stepped dielectric material portions 165 by a backside trench 79. Each second-tier retro-stepped dielectric material portion 265 may be divided into two disjoined second-tier retro-stepped dielectric material portions 265 by a backside trench 79. Each contiguous combination of a first-tier alternating stack (132, 142) and a second-tier alternating stack (232, 242) can be laterally bounded by a neighboring pair of backside trenches 79. One of the neighboring pair of backside trenches 79 can divide a first-tier retro-stepped dielectric material portion 165 into two discrete dielectric material portions, such as a first portion of the first-tier retro-stepped dielectric material portion 165 and a second portion of the first-tier retro-stepped dielectric material portion 165. Further, one of the neighboring pair of backside trenches 79 can divide a second-tier retro-stepped dielectric material portion 265 into two discrete dielectric material portions, such as a first portion of the second-tier retro-stepped dielectric material portion 265 and a second portion of the second-tier retro-stepped dielectric material portion 265.

In one embodiment, the semiconductor material layer 110 can have a doping of the same conductivity type as the vertical semiconductor channels 60, i.e., a first conductivity type, and a source region 61 having a doping of a second conductivity type (which is the same conductivity type as the doping of the drain regions 63) can be formed underneath each backside trench 79 by implantation of dopants of the second conductivity type.

Figure 16:
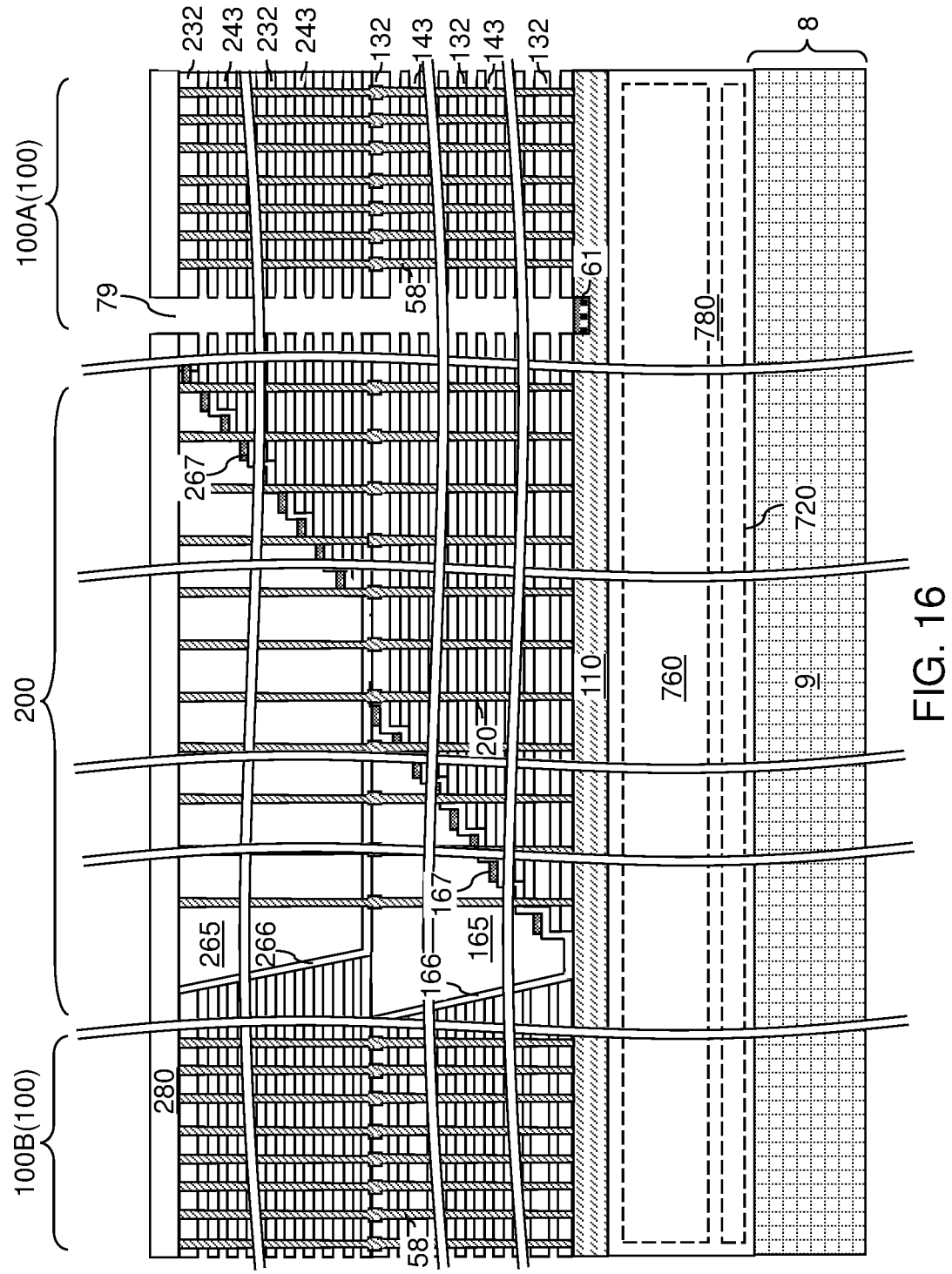
FIG. 16 is a schematic vertical cross-sectional view of the first exemplary structure after formation of backside recesses according to the first embodiment of the present disclosure.

Referring to FIG. 16, the sacrificial material layers (142, 242) are removed selective to the insulating layers (132, 232), the contact-level dielectric layer 280, and the semiconductor material layer 110. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Generally, the backside recesses (143, 243) can be formed by removing the patterned portions of the first continuous sacrificial material layers 142L and the second sacrificial material layers 242L selective to patterned portions of the first continuous insulating layers 132L and the second continuous insulating layers 232L after formation of the backside trenches 79. The backside recesses (143, 243) can be formed by performing an isotropic etch process that supplies an isotropic etchant that etches the patterned portions of the first continuous sacrificial material layers 142L and the second continuous sacrificial material layers 242L selective to patterned portions of the first continuous insulating layers 132L and the second continuous insulating layers 232L.

Figure 17A:
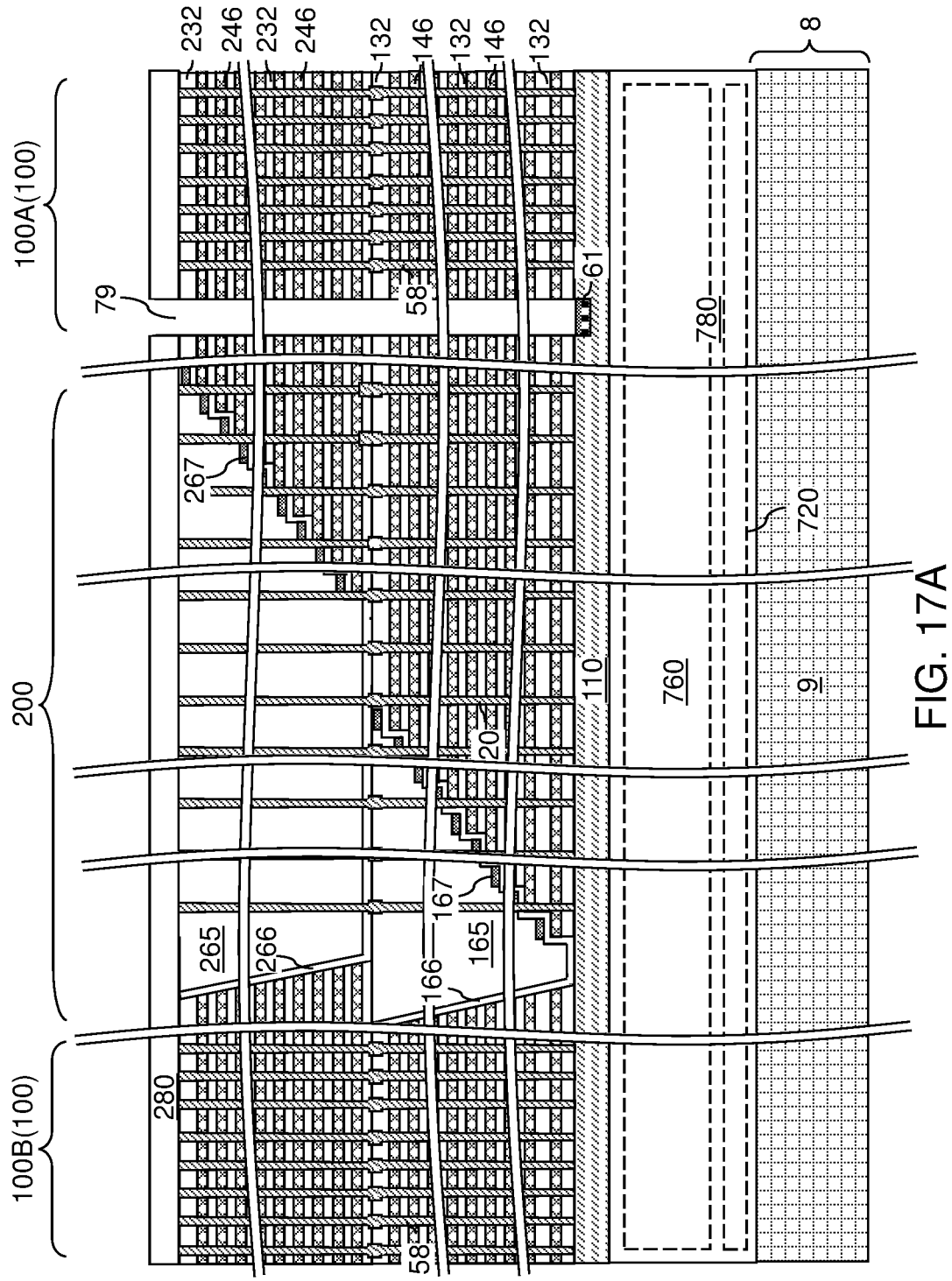
FIG. 17A is a schematic vertical cross-sectional view of the first exemplary structure after formation of electrically conductive layers and trench fill structures according to the first embodiment of the present disclosure.
Figure 17B:
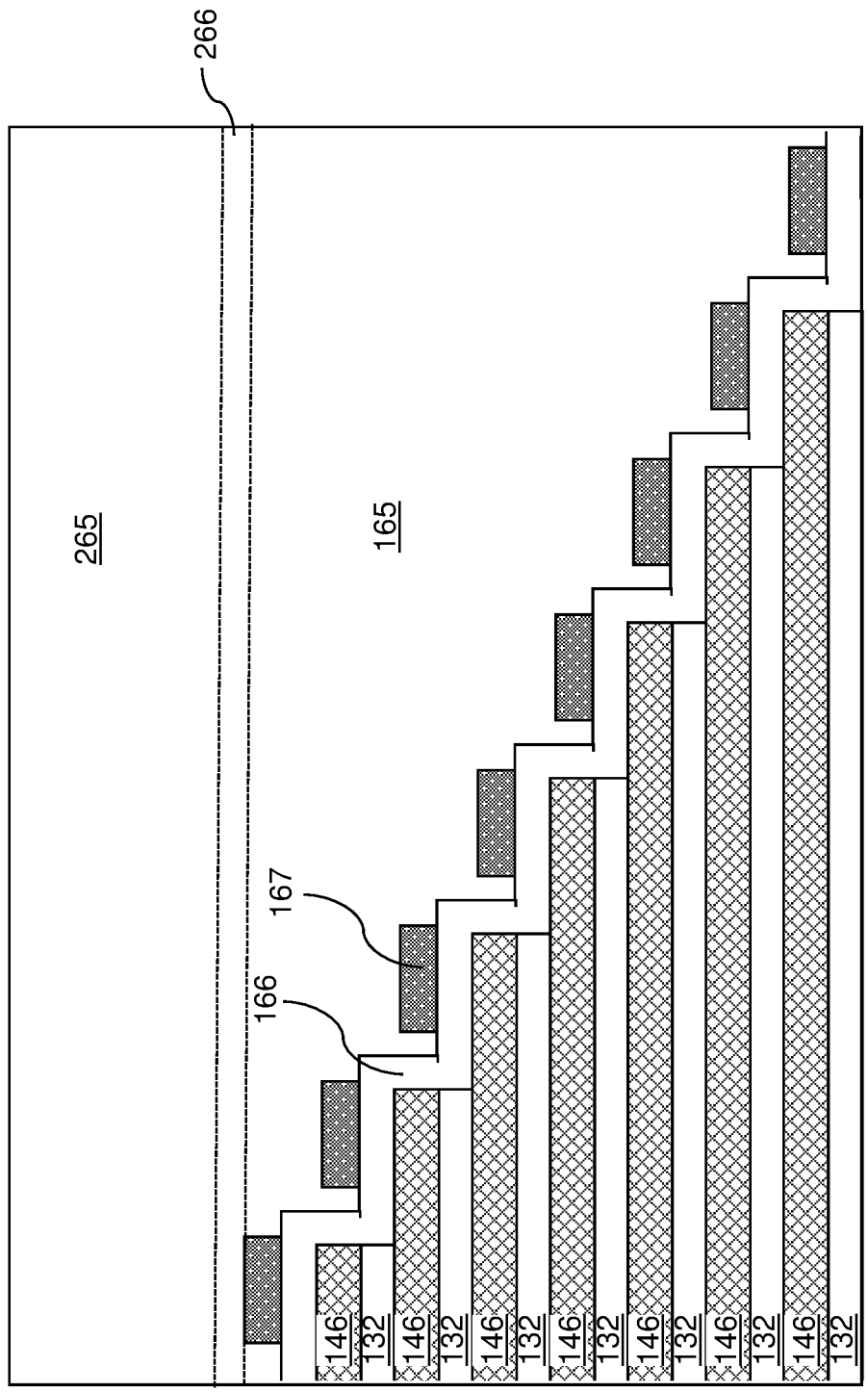
FIG. 17B is a magnified view of a region including first stepped surfaces in the first exemplary structure of FIG. 17A.

Referring to FIGS. 17A and 17B, an optional backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting first exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, MoN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers 246 may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first continuous sacrificial material layers 142L and the second continuous sacrificial material layers 242L are replaced with the electrically conductive layers (146, 246). A first-tier alternating stack of first insulating layers 132 and first electrically conductive layers 146 can be formed between each neighboring pair of backside trenches 79. The first insulating layers 132 comprise patterned portions of the first continuous insulating layers 132L, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of backside trenches 79. The second insulating layers 232 comprise patterned portions of the second continuous insulating layers 232L, and the second electrically conductive layers 246 comprise a second subset of the electrically conductive layers (146, 246) that is interlaced with the second insulating layers 246.

Figure 18:
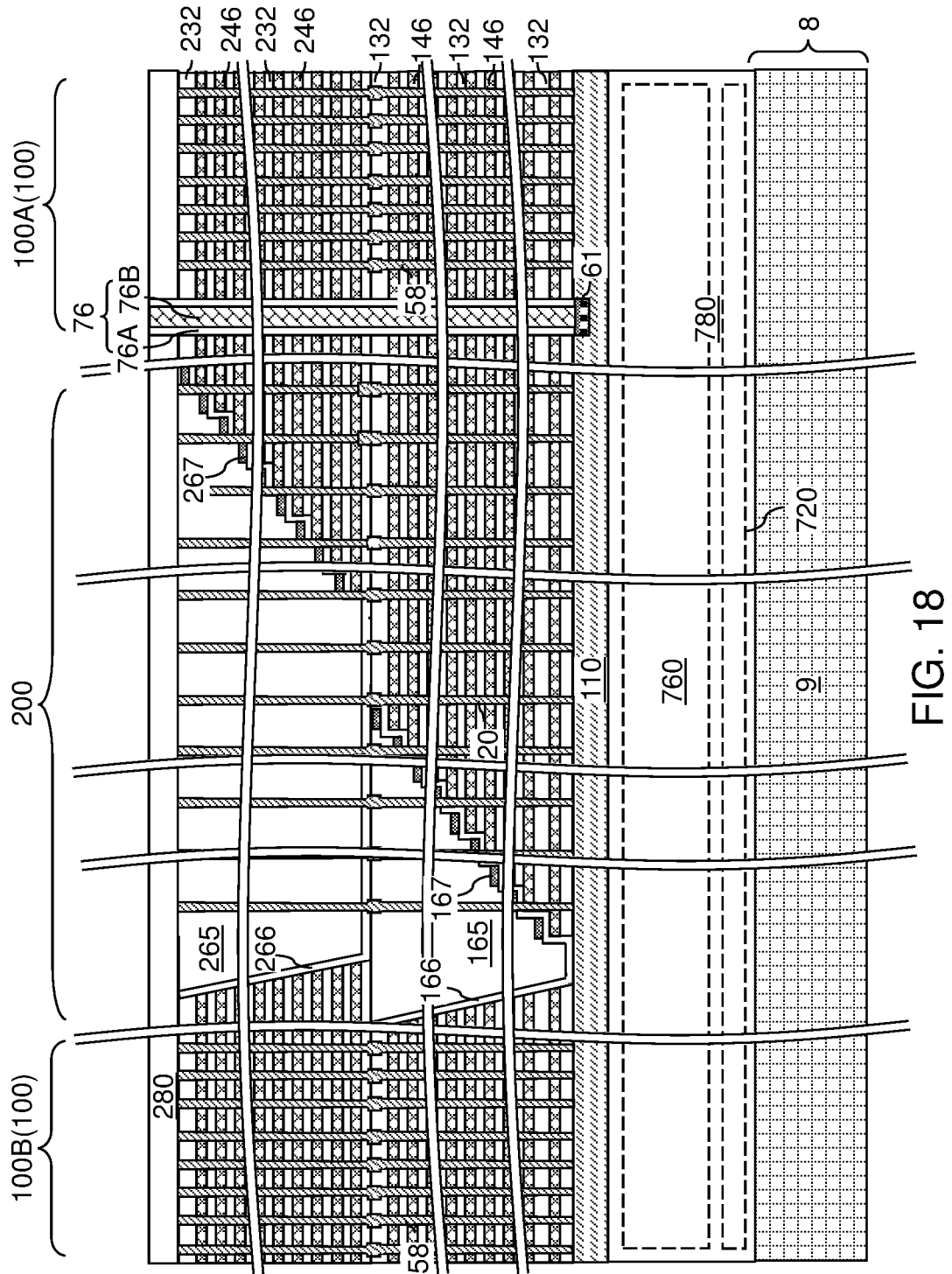
FIG. 18 is a schematic vertical cross-sectional view of the first exemplary structure after formation of backside trench fill structures according to the first embodiment of the present disclosure.

Referring to FIG. 18, a trench fill structure 76 can be formed in each backside trench 79. In one embodiment, an insulating liner layer including a dielectric material (such as silicon oxide) can be conformally deposited at a periphery of each backside trench 79, and can be anisotropically etched to form an insulating spacer 76A within each backside trench 79. At least one conductive material can be deposited in remaining volumes of the backside trenches 79, and excess portions of the at least one conductive material can be removed from above the top surface of the contact-level dielectric layer 280 by a planarization process. Each remaining portion of the at least one conductive material contacting a source region 61 and laterally surrounded by a respective insulating spacer 76A constitutes a backside contact via structure 76B, which laterally extends along the first horizontal direction hd1. Each contiguous combination of an insulating spacer 76A and a backside contact via structure 76B that fills a backside trench 79 constitutes a trench fill structure 76.

Alternatively, at least one dielectric material, such as silicon oxide, may be conformally deposited in the backside trenches 79 by a conformal deposition process. Each portion of the deposited dielectric material that fills a backside trench 79 constitutes a trench fill structure 76. In this case, each trench fill structure may fill the entire volume of a backside trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

The trench fill structures 76 can be arranged in a configuration illustrated in FIGS. 1B-1F. In one embodiment, each first-tier retro-stepped dielectric material portion 165 and each second-tier retro-stepped dielectric material portion 265 can be located between a neighboring pair of the trench fill structures 76.

Figure 19A:
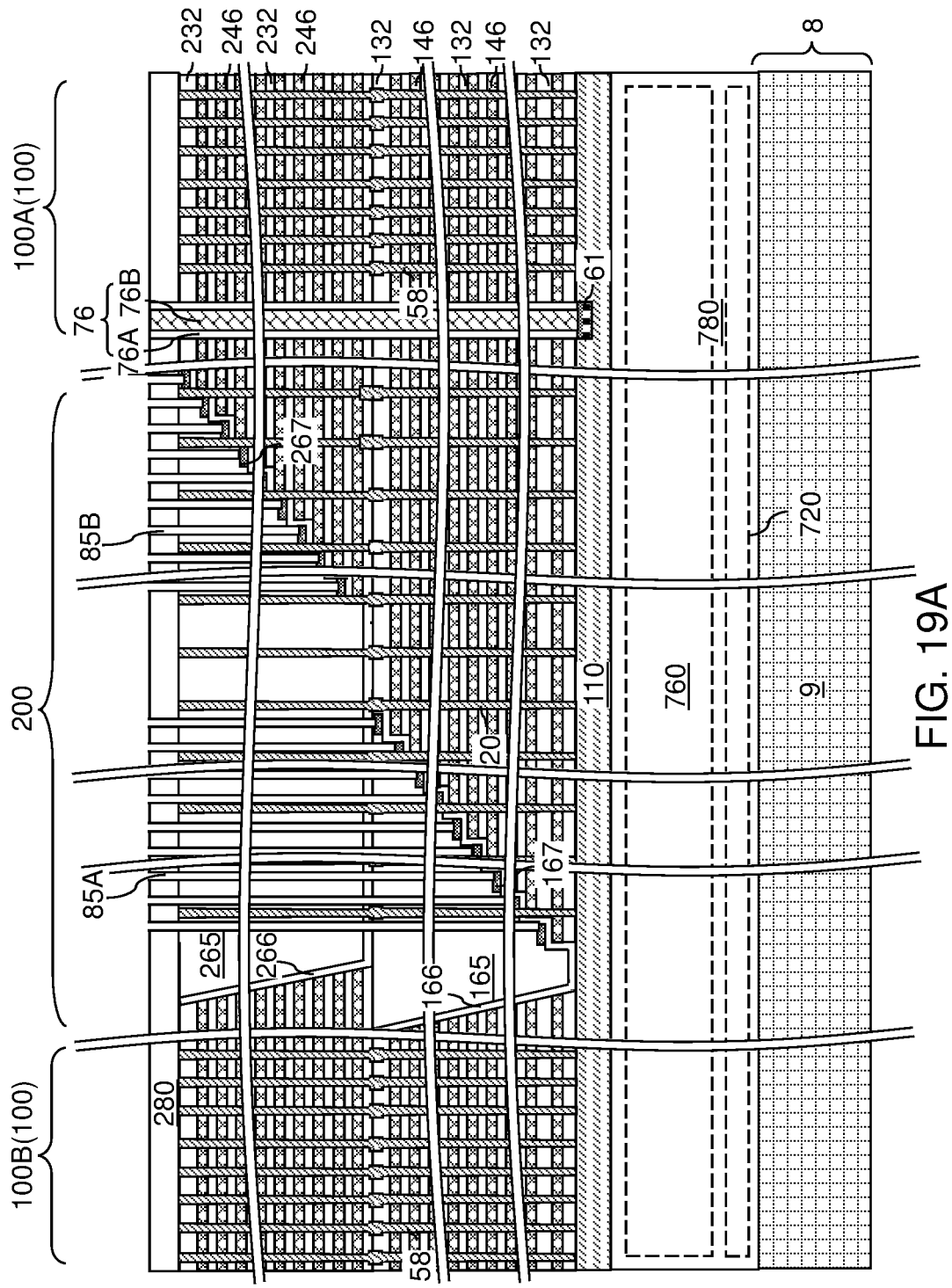
FIG. 19A is a schematic vertical cross-sectional view of the first exemplary structure after formation of layer contact via cavities according to the first embodiment of the present disclosure.
Figure 19B:
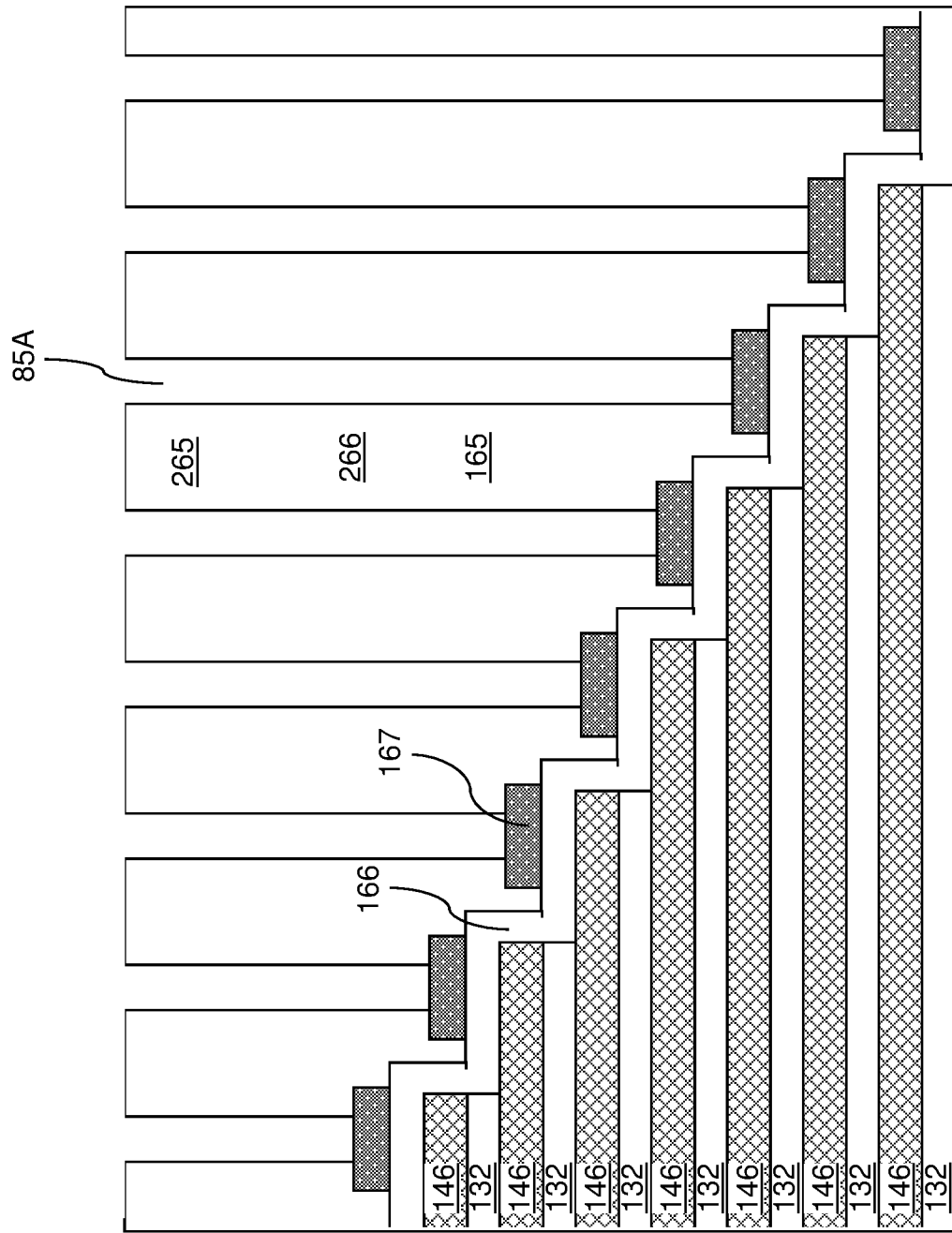
FIG. 19B is a magnified view of a region including first stepped surfaces in the first exemplary structure of FIG. 19A.

Referring to FIGS. 19A and 19B, a photoresist layer (not shown) may be applied over the contact-level dielectric layer 280, and may be lithographically patterned to form various discrete openings in areas that overlie horizontal surface segments of the first stepped surfaces of the first-tier alternating stacks (132, 146) and the second stepped surfaces of the second-tier alternating stacks (232, 246). In one embodiment, each opening in the photoresist layer may be formed entirely within an area of a respective horizontal surface segment of the first stepped surfaces and the second stepped surface.

An anisotropic etch process can be performed to transfer the pattern of the discrete openings in the photoresist layer through the contact-level dielectric layer 280, underlying regions of the retro-stepped dielectric material portions (165, 265), the discrete dielectric plates (167, 267), and the insulating liners (166, 266). In one embodiment, the anisotropic etch process may comprise a first etch step that etches the material of the contact-level dielectric layer 280 and the materials of the retro-stepped dielectric material portions (165, 265). In one embodiment, the chemistry of the first etch step of the anisotropic etch process may have an etch chemistry that etches the materials of the retro-stepped dielectric material portions (165, 265) selective to the dielectric materials of the discrete dielectric plates (167, 267). In one embodiment, the retro-stepped dielectric material portions (165, 265) may comprise a third silicon oxide material (such as undoped silicate glass or a doped silicate glass), and the discrete dielectric plates (167, 267) may consist essentially of silicon nitride. In this case, an etch the first etch step of the anisotropic etch process can etch silicon oxide selective to silicon nitride. First layer contact via cavities 85A and second layer contact via cavities 85B are formed through the contact-level dielectric layer 280 and the retro-stepped dielectric material portions (165, 265). Specifically, the first layer contact via cavities 85A vertically extend through the contact-level dielectric layer 280, the second-tier retro-stepped dielectric material portion 265, and the first-tier dielectric material portion 165 to a top surface of a respective first discrete dielectric plate 167. The second layer contact via cavities 85B vertically extend through the contact-level dielectric layer 280 and the second-tier retro-stepped dielectric material portion 265 to a top surface of a respective second discrete dielectric plate 267.

Figure 20B:
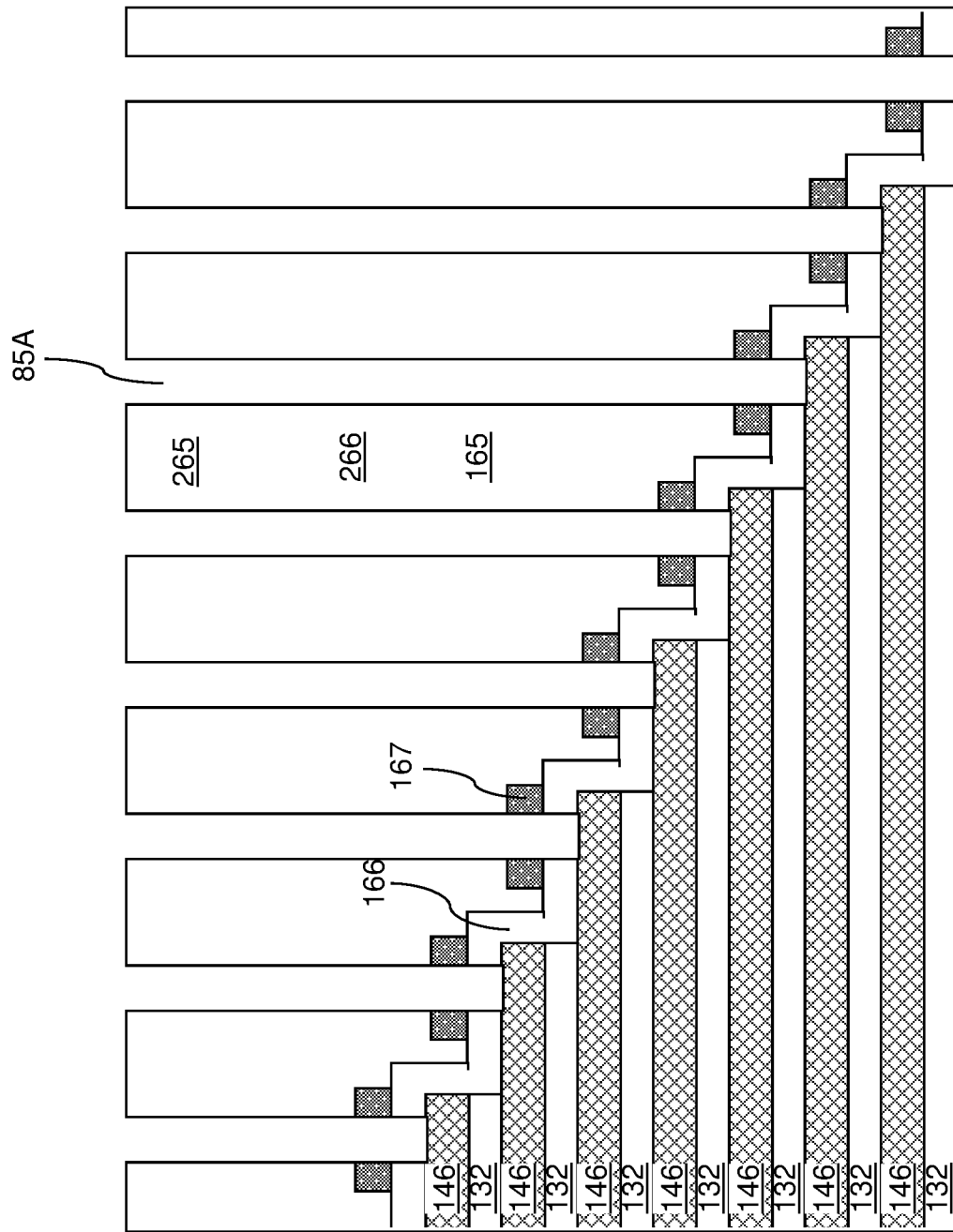
FIG. 20B is a magnified view of a region including first stepped surfaces in the first exemplary structure of FIG. 20A.

Referring to FIGS. 20A and 20B, a second etch step of the anisotropic etch process can be performed to etch the materials of the dielectric plates (167, 267) selective to the materials of the insulating liners (166, 266). For example, if the dielectric plates (167, 267) comprise silicon nitride and if the insulating liners (166, 266) comprise a second silicon oxide material (such as undoped silicate glass or a doped silicate glass), the second etch step of the anisotropic etch process can have an etch chemistry that etches silicon nitride selective to the second silicon oxide material. The first layer contact via cavities 85A and the second layer contact via cavities 85B are vertically extended through the dielectric plates (167, 267) by the second etch step of the anisotropic etch process. In one embodiment, each of the dielectric plates (167, 267) may comprise an opening therethrough.

A third etch step of the anisotropic etch process can be performed to etch the materials of the insulating liners (166, 167) that etches the material of the insulating liner selective to a material of the electrically conductive layers (146, 246). For example, if the insulating liners (166, 266) comprise the second silicon oxide material (such as undoped silicate glass or a doped silicate glass), the third etch step of the anisotropic etch process can have an etch chemistry that etches silicon oxide and the material of backside blocking dielectric layers (if present) selective to the metallic material of the electrically conductive layers (146, 246). The first layer contact via cavities 85A and the second layer contact via cavities 85B are vertically extended through the insulating liners (166, 266) by the third etch step of the anisotropic etch process. Top surfaces of the first electrically conductive layers 146 are physically exposed underneath the first layer contact via cavities 85A, and top surfaces of the second electrically conductive layers 246 are physically exposed underneath the second layer contact via cavities 85B. The photoresist layer may be subsequently removed, for example, by ashing.

Figure 21:
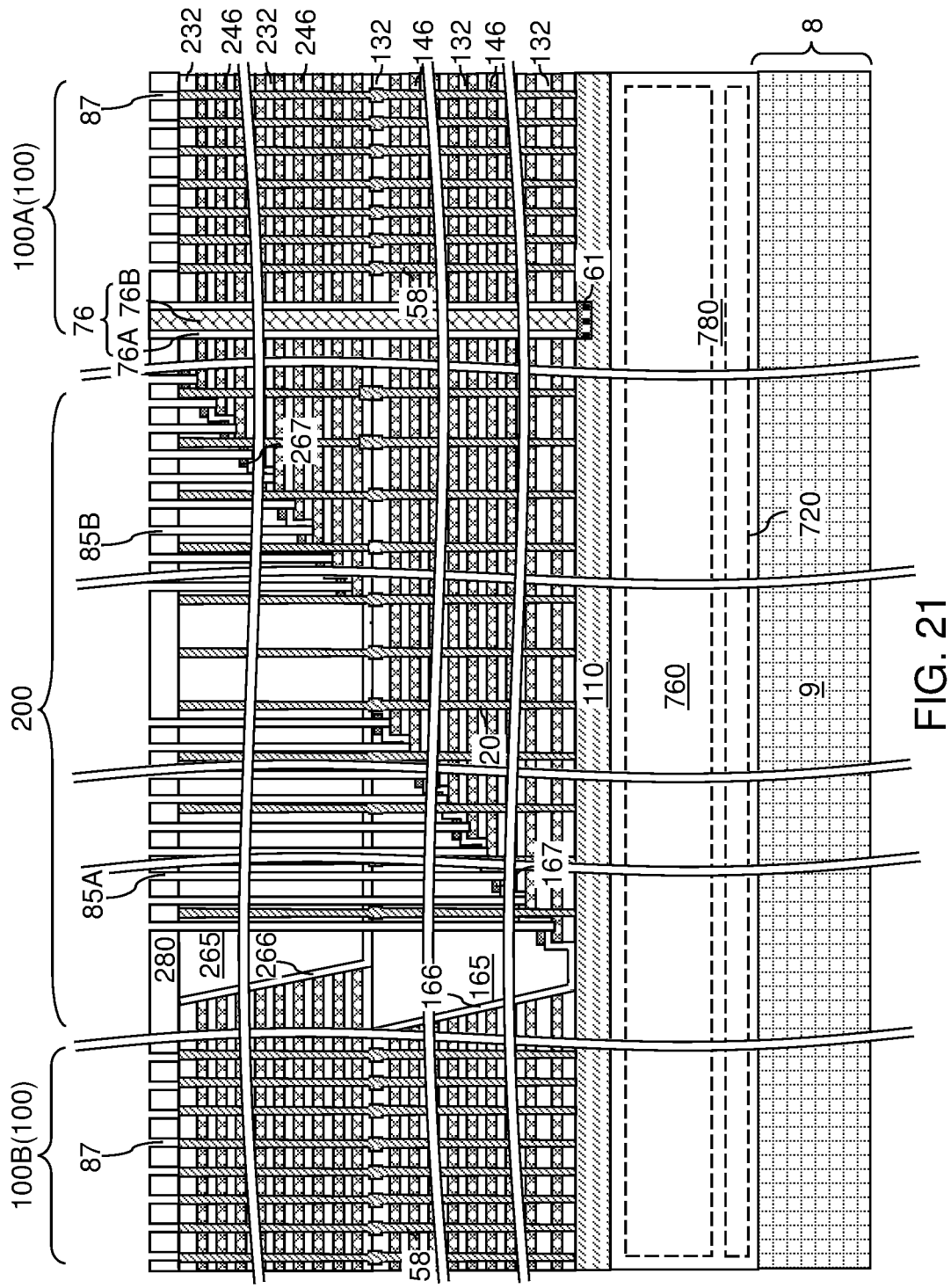
FIG. 21 is a schematic vertical cross-sectional view of the first exemplary structure after formation of drain contact via cavities according to the first embodiment of the present disclosure.

Referring to FIG. 21, an additional photoresist layer (not shown) can be applied over the contact-level dielectric layer 280, and can be lithographically patterned to form openings in areas that overlap with the areas of the memory opening fill structures 58. An anisotropic etch process can be performed to form drain contact via cavities 87 vertically extending through the contact-level dielectric layer 280 down to a top surface of a respective one of the drain regions 63 of the memory opening fill structures 58.

Figure 22A:
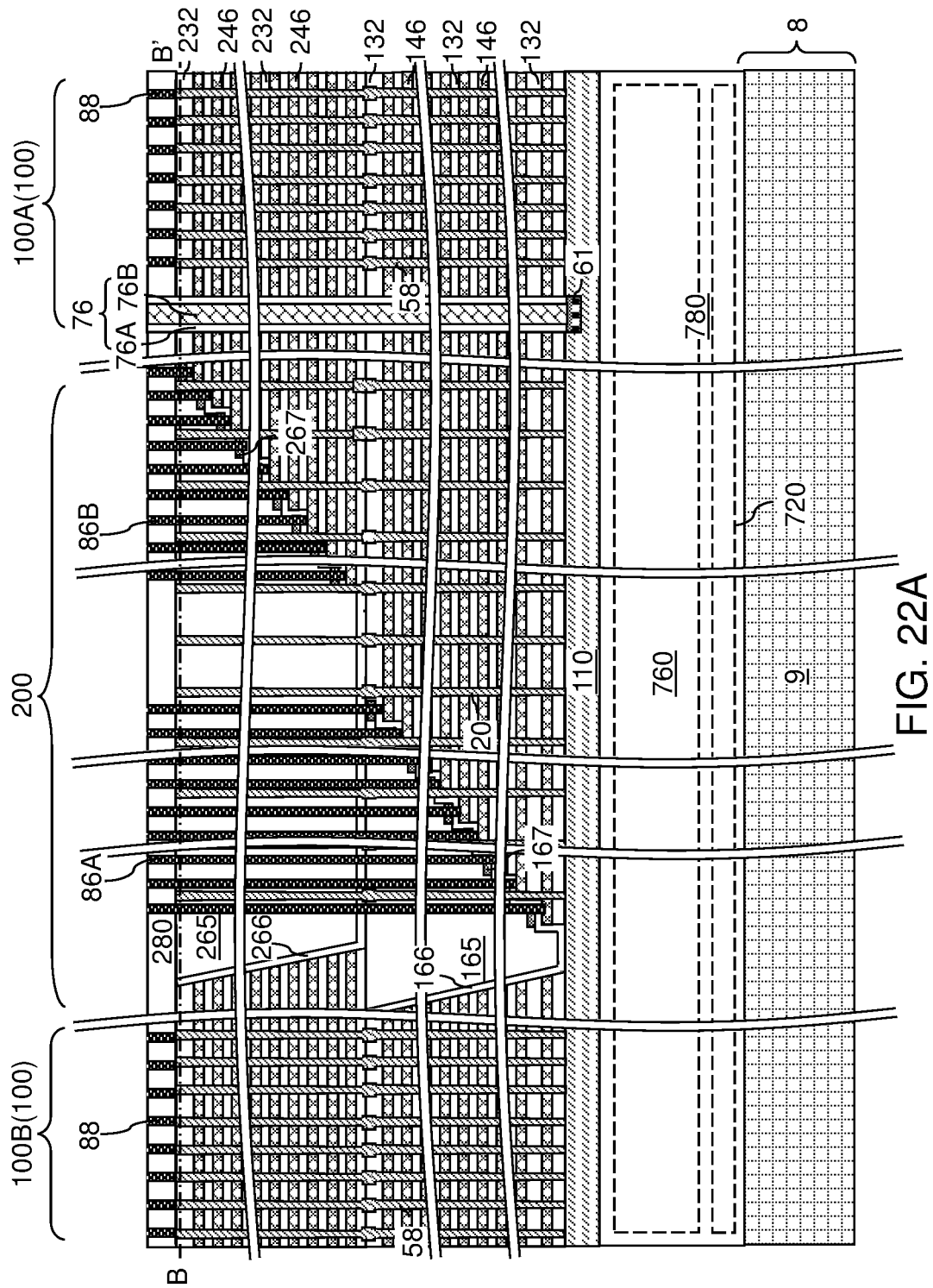
FIG. 22A is a schematic vertical cross-sectional view of the first exemplary structure after formation of various contact via structures according to the first embodiment of the present disclosure.
Figure 22B:
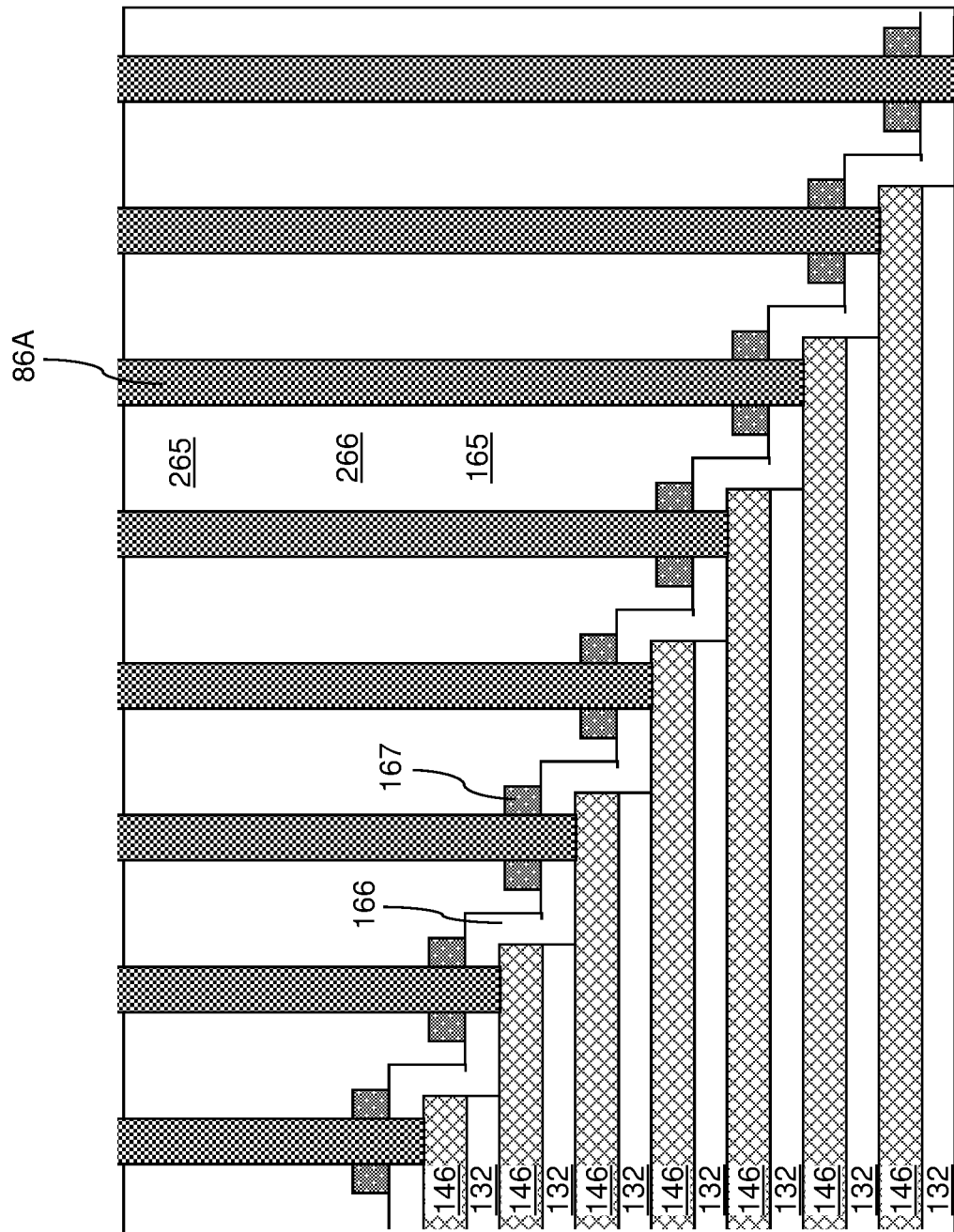
FIG. 22B is a magnified view of a region including first stepped surfaces in the first exemplary structure of FIG. 22A.
Figure 22C:
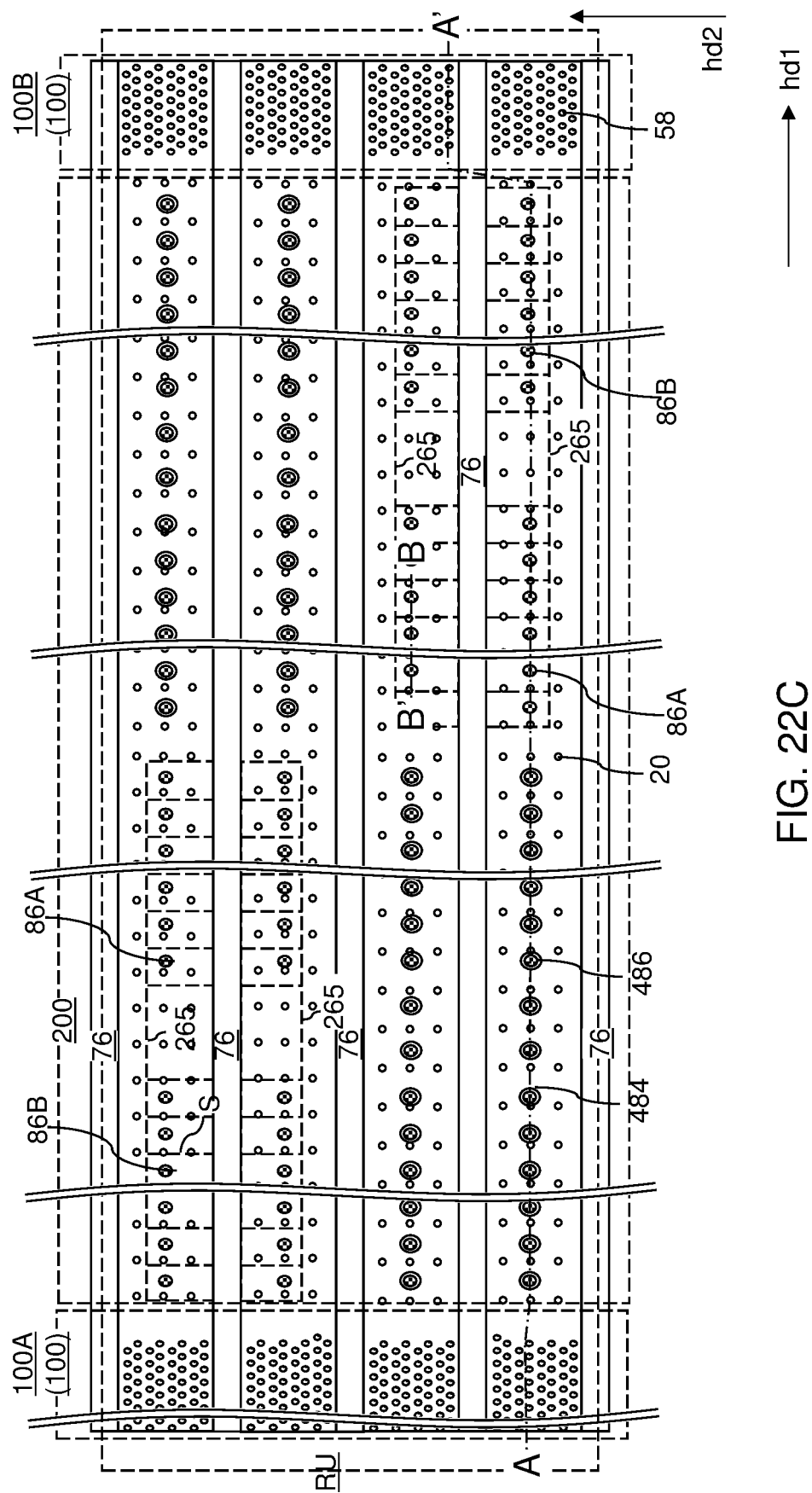
FIG. 22C is a top-down view of a region of the first exemplary structure of FIGS. 22A and 22B. The vertical cross-sectional plane A-A' is the plane of the vertical cross-sectional view of FIG. 22A. The vertical cross-sectional plane B-B' is the plane of the vertical cross-sectional view of FIG. 22B.

Referring to FIGS. 22A-22C, at least one conductive material can be deposited in each of the first layer contact via cavities 85A, the second layer contact via cavities 85B, and the drain contact via cavities 87. The at least one conductive material can include, for example, a metallic barrier material (such as TiN, TaN, MoN and/or WN) and a metallic fill material (such as W, Cu, Mo, Co, Ru, etc.). Excess portions of the at least one conductive material can be removed from above the horizontal plane including the top surface of the contact-level dielectric layer employing a planarization process (such as a chemical mechanical planarization process). Each remaining portion of the at least one conductive material filling the first layer contact via cavities 85A comprises a first contact via structure 86A. Each remaining portion of the at least one conductive material filling the second layer contact via cavities 85B comprise a second contact via structure 86B. Each remaining portion of the at least one conductive material filling the drain contact via cavities comprises drain contact via structures 88.

The first layer contact via structures 86A can be formed through a respective second-tier retro-stepped dielectric material portion 265 and through a respective first-tier retro-stepped dielectric material portion 165 and directly on a first subset of the electrically conductive layers, i.e., the first electrically conductive layers 146. Each first layer contact via structure 86A can contact an inner sidewall of a respective first discrete dielectric plate 167 and a sidewall of an opening through a first insulating liner 166. The second layer contact via structures 86B can be formed through a respective second-tier retro-stepped dielectric material portion 265 and directly on a second subset of the electrically conductive layers (i.e., the second electrically conductive layers 246) that is located over a horizontal plane including top surfaces of the first-tier retro-stepped dielectric material portions 165. Each second layer contact via structure 86B can contact an inner sidewall of a respective second discrete dielectric plate 267 and a sidewall of an opening through a second insulating liner 266.

Figure 22D:
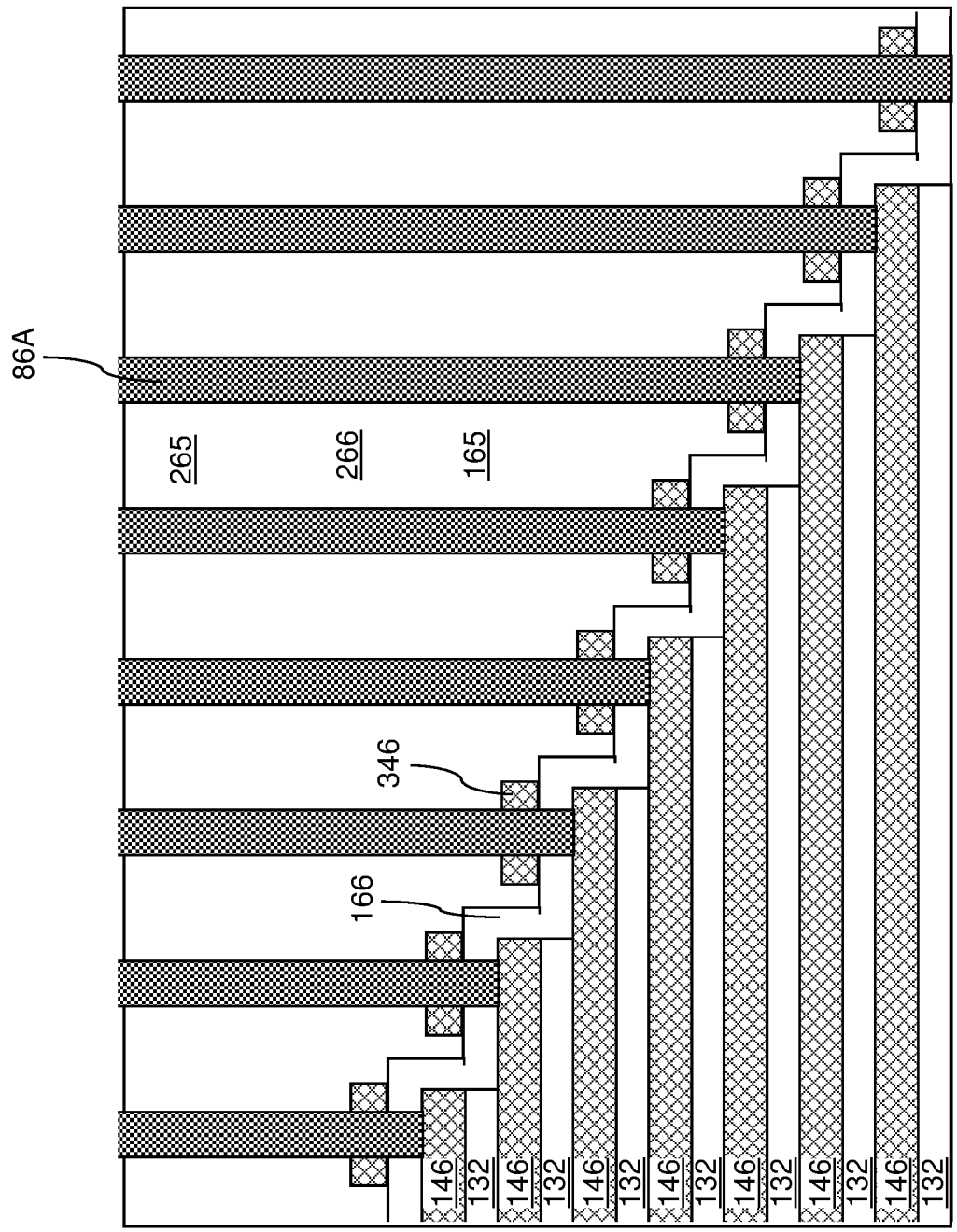
FIG. 22D is a magnified view of a region including first stepped surfaces in an alternative configuration of the first exemplary structure of FIG. 22A.

Referring to FIG. 22D, an alternative configuration of the first exemplary structure is illustrated. In this case, one or more of the first discrete dielectric plates 167 and the second discrete dielectric plates 267 may be intentionally or unintentionally physically exposed to a backside trench 79 at the processing steps of FIGS. 15A and 15B. In this case, one or more of the first discrete dielectric plates 167 and the second discrete dielectric plates 267 may be collaterally etched during the processing steps of FIG. 16. In one embodiment, the sacrificial material layers (142, 242) and the discrete dielectric plates (167, 267) may comprise a same dielectric material such as silicon nitride, and one, a subset, or all, of the first discrete dielectric plates 167 and the second discrete dielectric plates 267 may be collaterally removed during formation of the backside recesses (143, 243). In this case, metal plates 346 may be formed within the volumes of the discrete dielectric plates (167, 267) during the processing steps of FIGS. 17A and 17B. The metal plates 346 can be etched through during the second etch step of the anisotropic etch process that form the layer contact via cavities (85A, 85B). At least one of the first layer contact via structures 86A and the second layer contact via structures 86B may be formed through a respective metal plate 346, a first or second insulating liner (166 or 266), and a respective subset of the retro-stepped dielectric material portions (165, 265).

Therefore, even if the dielectric plates 167 and/or 267 are unintentionally exposed to the backside trenches 79 and are unintentionally replaced with the laterally separated metal plates 346, then the laterally separated metal plates 346 would not short adjacent layer contact via structures 86A and/or 86B to each other. Thus, the word lines in different vertical levels are also not electrically shorted to each other. In contrast, if the continuous dielectric liners 167L and/or 267L are not laterally separated into the respective dielectric plates (167, 267) and if the continuous dielectric liners are exposed to the backside trenches 79 (e.g., due to photolithography alignment error, etc.), then the continuous dielectric liners would be replaced with continuous electrically conductive liners at the steps of FIGS. 17A and 17B. The continuous electrically conductive liners would short adjacent layer contact via structures 86A and/or 86B to each other. Thus, the word lines in different vertical levels would also be electrically shorted to each other.

Referring to FIGS. 1A-22D and according to various embodiments of the present disclosure, a three-dimensional memory device is provided, which comprises: an alternating stack of insulating layers (132, 232) and electrically conductive layers (146, 246), wherein the alternating stack comprises at least one memory array region 100 in which each layer of the alternating stack {(132, 146) and/or (232, 246)} is present and a staircase region comprising stepped surfaces of the alternating stack {(132, 146) and/or (232, 246)}; memory openings 49 vertically extending through the alternating stack {(132, 146) and/or (232, 246)} in the memory array region 100; memory opening fill structures 58 located in the memory openings 49 and comprising a respective vertical stack of memory elements; an insulating liner (166 or 266) overlying the stepped surfaces of the alternating stack {(132, 146) and/or (232, 246)}; a plurality of discrete dielectric plates (167 or 267) located over the insulating liner (166 or 266) and spaced apart from each other; a dielectric material portion (such as a first-tier retro-stepped dielectric material portion 165 or a second-tier retro-stepped dielectric material portion 265) overlying the plurality of discrete dielectric plates (167 or 267); and contact via structures (86A, 86B) vertically extending through the dielectric material portion (165 and/or 265), a respective one of the plurality of discrete dielectric plates (167 or 267), and a respective portion of the insulating liner (166 or 266), and contacting a respective one of the electrically conductive layers (146 or 246).

In one embodiment, horizontal surfaces and vertical steps are adjoined to each other within the staircase region to provide a continuous set of surface segments vertically extending from a bottommost layer of the alternating stack {(132, 146) and/or (232, 246)} to a topmost layer of the alternating stack {(132, 146) and/or (232, 246)}.

In one embodiment, the insulating liner (166 or 266) overlies the stepped surfaces of the alternating stack {(132, 146) and/or (232, 246)} and comprises horizontal top surface segments and vertical sidewall segments that are adjoined to each other. In one embodiment, each of the plurality of discrete dielectric plates (167 or 267) contacts a respective one of the horizontal top surface segments of the insulating liner (166 or 266), and does not contact the vertical sidewall segments of the insulating liner (166 or 266).

In one embodiment, the dielectric material portion 265 has a planar top surface located at, or above, a horizontal plane including topmost surfaces of the memory opening fill structures 58. In one embodiment, each of the contact via structures (86A, 86B) comprises a respective straight sidewall that extends at least from the planar top surface of the dielectric material portion 265 to the respective one of the electrically conductive layers (146, 246).

In one embodiment, the insulating liner (166 or 266) has a uniform thickness throughout; and the plurality of discrete dielectric plates (167 or 267) have a uniform vertical thickness.

In one embodiment, the insulating layers (132 and/or 232) comprise a first silicon oxide material; the insulating liner (166 or 266) comprises a second silicon oxide material; the plurality of discrete dielectric plates (167 or 267) comprise silicon nitride; and the dielectric material portion (165 and/or 265) comprises a third silicon oxide material.

In one embodiment, each of the plurality of discrete dielectric plates (167, 267) has a respective sidewall and a respective top surface that contact the dielectric material portion (165 or 265), and a respective bottom surface that contacts the insulating liner (166 or 266).

In one embodiment, the insulating liner (166 or 266) comprises horizontally-extending portions and vertically-extending portions that are adjoined to each other; and the plurality of dielectric material plates (167 or 267) is in contact with top surfaces of the horizontally-extending portions of the insulating liner (166 or 266) and does not contact any sidewall of the vertically-extending portions of the insulating liner (166 or 266).

In one embodiment, the at least one memory array region 100 comprises a pair of memory array regions 100 that are laterally spaced apart along a first horizontal direction hd1; the staircase region is located between the pair of memory array regions 100; and an interconnecting strip region is located between the pair of memory array regions 100 and is laterally offset from the staircase region along a second horizontal direction hd2 that is perpendicular to the first horizontal direction hd1, wherein each layer within the alternating stack {(132, 146) and/or (232, 246)} extends along the first horizontal direction hd1 in the interconnecting strip region with a lesser with than a width of the alternating stack {(132, 146) and/or (232, 246)} in the pair of memory array regions 100 (for example, as illustrated in FIG. 1B).

In one embodiment, the dielectric material portion (165 or 265) comprises a lengthwise sidewall that laterally extends along the first horizontal direction hd1; and the lengthwise sidewall comprises a stepped bottom edge adjoining horizontal top surface segments of the insulating liner (166 or 266) located at different levels (which are levels of the horizontal surface segments of the first stepped surfaces and/or the second stepped surfaces.

In one embodiment, the insulating liner (166 or 266) comprises a vertically-extending portion that contacts sidewalls of portions within the alternating stack {(132, 146) and/or (232, 246)} in the interconnecting strip region and contacts the lengthwise sidewall of the dielectric material portion (165 or 265) that laterally extend along the first horizontal direction hd1. In one embodiment, the vertically-extending portion of the insulating liner (166 or 266) may comprise a straight vertical or tapered sidewall that is parallel to the second horizontal direction hd2 and vertically extends from a bottommost layer of the alternating stack {(132, 146) or (232, 246)} to the topmost layer of the alternating stack {(132, 146) or (232, 246)}.

In one embodiment, each of the memory opening fill structures 58 further comprises a respective vertical semiconductor channel 60; a semiconductor material layer is located in a substrate 8 or between the alternating stack {(132, 146) and/or (232, 246)} and the substrate 8 (as in the case of a semiconductor material layer 110); and each of the vertical semiconductor channels 60 contacts the semiconductor material layer.

According to another aspect of the present disclosure, a second exemplary structure according to a second embodiment of the present disclosure can be derived from the first exemplary structure by making modifications to the processing steps and structures after formation of stepped surfaces (such as the first stepped surfaces and the second stepped surfaces) and prior to formation of a respective retro-stepped dielectric material portion (such as a first-tier retro-stepped dielectric material portion 165 and the second-tier retro-stepped dielectric material portion 265).

FIGS. 23A-23F are sequential vertical cross-sectional views of a region of a second exemplary structure during formation of first stepped surfaces, discrete dielectric plates, and a first retro-stepped dielectric material portion according to a second embodiment of the present disclosure.

Figure 23A:
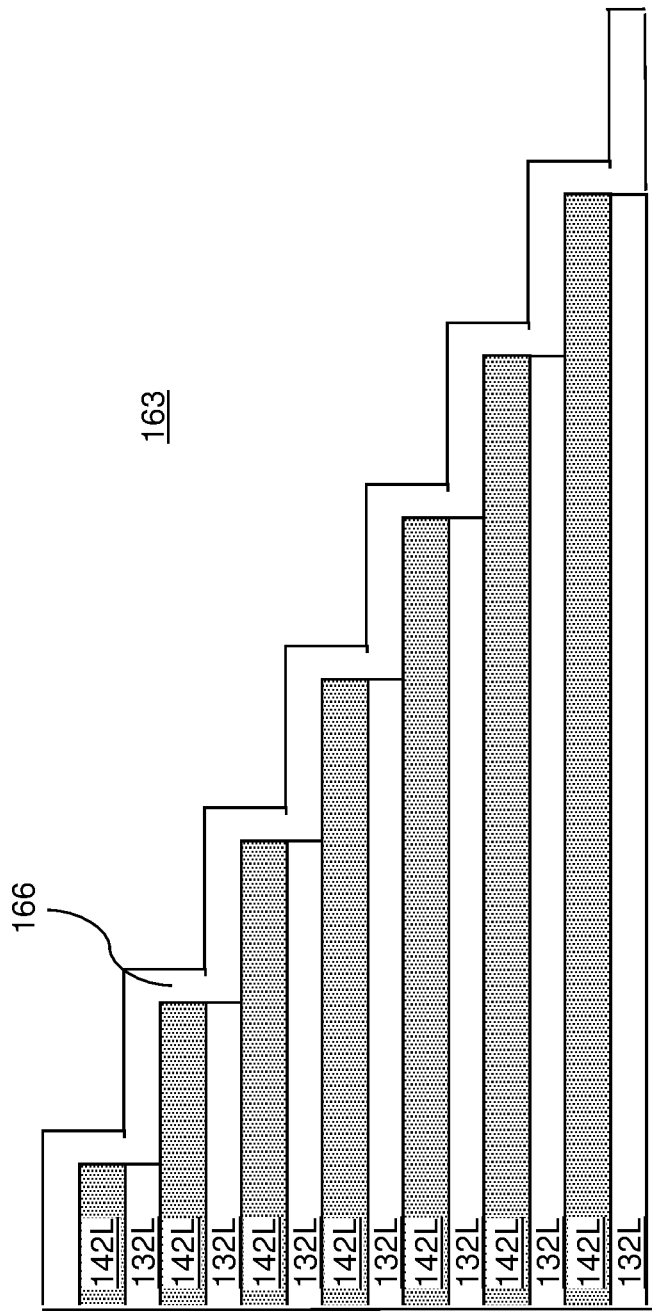
FIGS. 23A-23F are sequential vertical cross-sectional views of a region of a second exemplary structure during formation of first stepped surfaces, discrete dielectric plates, and a first retro-stepped dielectric material portion according to a second embodiment of the present disclosure.

Referring to FIG. 23A, the second exemplary structure is illustrated at the processing steps of FIGS. 3A-3C. The second exemplary structure can be the same as the first exemplary structure of FIGS. 3A-3C at this processing step.

Figure 23B:
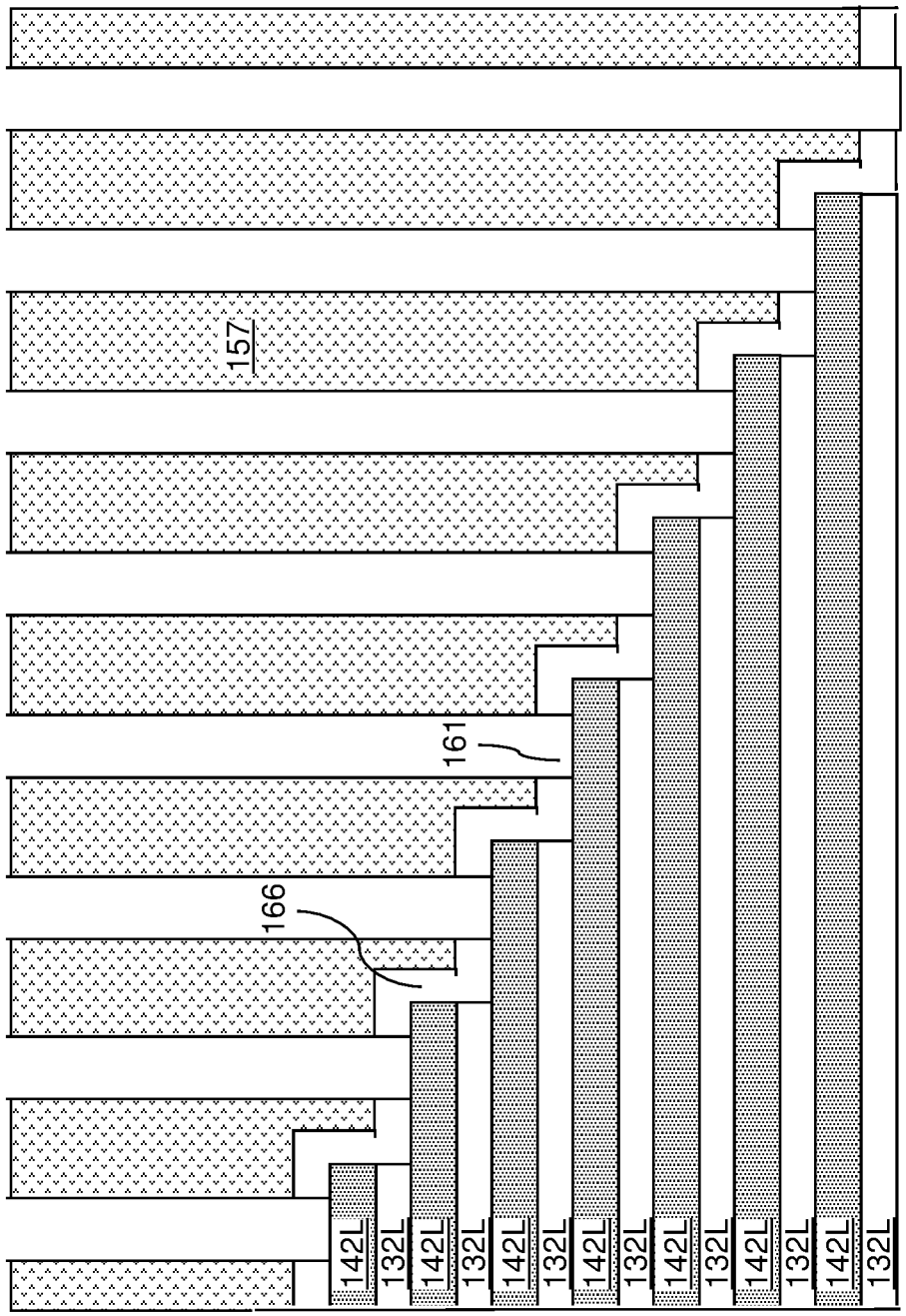

Referring to FIG. 23B, a photoresist layer 157 can be applied over the first insulating liner 166, and can be lithographically patterned to form an array of discrete openings within each staircase region. Each array of discrete openings can be formed such that at least two rows of openings arranged along the first horizontal direction hd1 are formed within each staircase region. In one embodiment, each opening in the photoresist layer may be located entirely within the area of a respective horizontal surface segment of the first stepped surfaces. An anisotropic etch process can be performed to transfer the pattern of the openings in the photoresist layer 157 through the horizontally-extending portions of the first insulating liner 166. Openings 161 are formed through the first insulating liner 166. Within each staircase region including a respective set of first stepped surfaces, at least two rows of openings 161 arranged along the first horizontal direction hd1 can be formed through the first insulating liner 166.

Figure 23C:
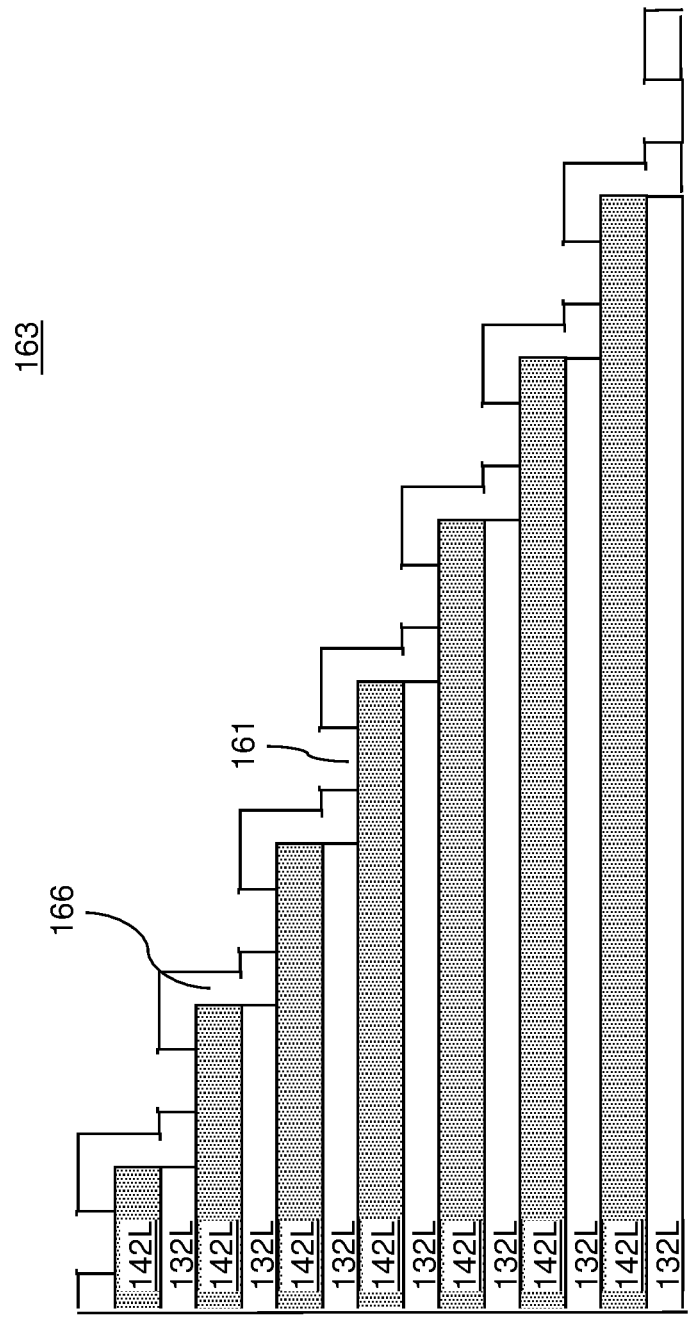

Referring to FIG. 23C, the photoresist layer 157 can be subsequently removed, for example, by ashing. Top surfaces of the first continuous sacrificial material layers 142L can be physically exposed at the bottom of each opening 161 through the first insulating liner 166.

Figure 23D:
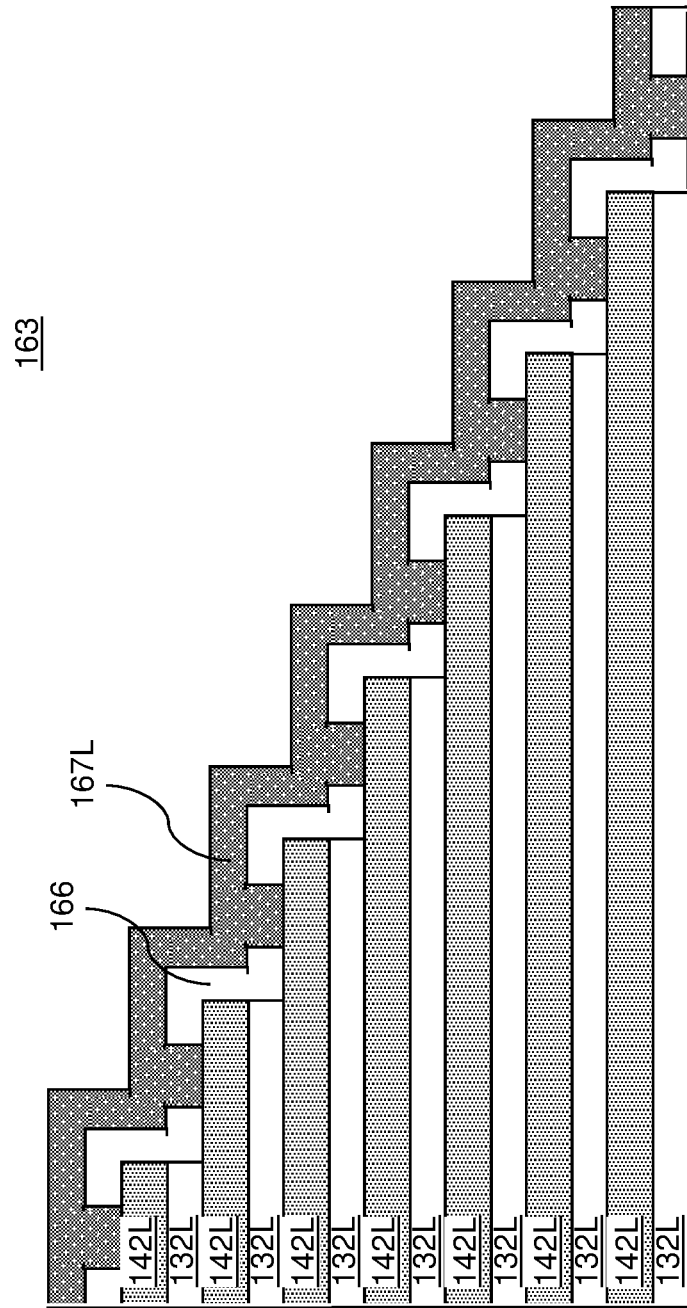

Referring to FIG. 23D, a first continuous dielectric liner 167L comprising a different dielectric material than the material of the first insulating liner 166 can be conformally deposited over, and directly on, the physically exposed surfaces of the first insulating liner 166 and the physically exposed surfaces of the first continuous sacrificial material layers 142L. The first continuous dielectric liner 167L can fill each opening 161 through the first insulating liner 166. In one embodiment, the first continuous dielectric liner 167L may comprise a same dielectric material as the first continuous sacrificial material layers 142L. In one embodiment, the first continuous dielectric liner 167L may comprise, and/or may consist essentially of, silicon nitride. The first continuous dielectric liner 167L can be deposited by a conformal deposition process such as a chemical vapor deposition process. The first continuous dielectric liner 167L overlies the stepped surfaces of the first vertically alternating sequence (132L, 142L) and comprises horizontal top surface segments and vertical sidewall segments that are adjoined to each other. Further, the first continuous dielectric liner 167L comprises downward-protruding portions that fill a respective opening 161 through the first insulating liner 166 and contacting a horizontal surface segment of a respective one of the first continuous sacrificial material layer 142. The thickness of the first continuous dielectric liner 167L may be greater than, equal to, or less than the thickness of each of the first continuous insulating layers 132L. In one embodiment, the thickness of the first continuous dielectric liner 167L may be less than the thickness of a first continuous insulating layer 132L. For example, the thickness of the first continuous dielectric liner 167L may have a thickness in a range from 3 nm to 60 nm, such as from 6 nm to 30 nm, although lesser and greater thicknesses may also be employed.

Figure 23E:
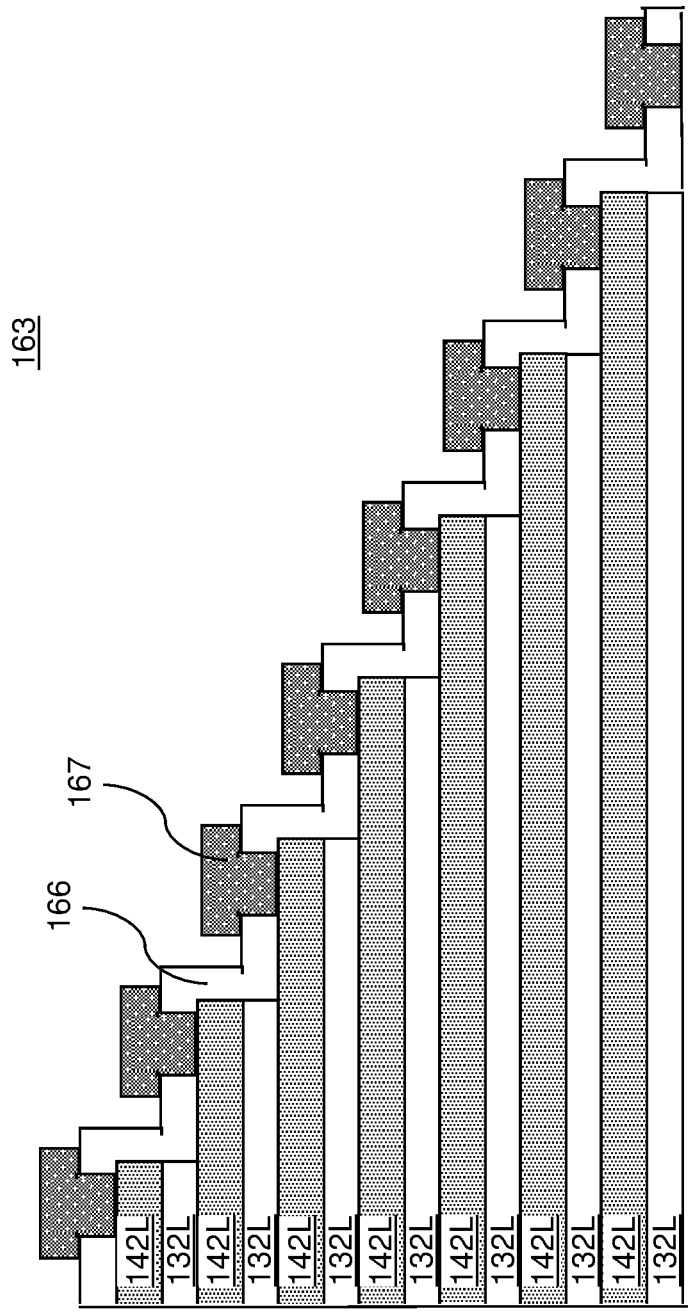

Referring to FIGS. 23E, a photoresist layer (not shown) can be applied over the first continuous dielectric liner 167L, and can be lithographically patterned to cover horizontally-extending segments of the first continuous dielectric liner 167L located within areas of horizontally-extending segments of first stepped surfaces of the first vertically alternating sequence (132L, 142L). According to an aspect of the present disclosure, at least two rows of discrete patterned photoresist portions can be formed within each of the first stepped cavities 163. Each row of discrete patterned photoresist portions can be arranged along the first horizontal direction hl, which is the horizontal direction that is perpendicular to the vertically-extending surfaces segments of the first stepped surfaces. In one embodiment, two rows of discrete patterned photoresist portions may be formed within each of the first stepped cavities 163. In this case, two rows of layer contact via structures can be subsequently formed in each area of a first stepped cavity. Alternatively, 2k rows of discrete patterned photoresist portions may be formed within each of the first stepped cavities 163, wherein the number k may be a positive integer greater than 1, such as 2 to 10. In this case, 2k rows of layer contact via structures can be subsequently formed in each area of a first stepped cavity. The photoresist layer does not cover the area outside the areas of the first stepped cavities 163. Generally, a photoresist layer can be applied and patterned over the first continuous dielectric liner 167L into rows of discrete patterned photoresist material portions within each of the first stepped cavities 163.

An etch process can be performed to remove portions of the first continuous dielectric liner 167L that are not masked by the discrete photoresist material portions. The etch process may be selective to the material of the first insulating liner 166 so that collateral etching of the first insulating liner 166 is minimal or non-existent. The etch process may comprise an isotropic etch process (such as a wet etch process) or an anisotropic etch process (such as a reactive ion etch process). Remaining portions of the first continuous dielectric liner 167L comprise a plurality of first discrete dielectric plates 167. Each first discrete dielectric plate 167 comprises a horizontally-extending portion overlying a horizontal top surface segment of the first insulating liner 166 and a downward-protruding portion that fills a respective opening 161 through the first insulating liner 166 and contacting a top surface of a respective one of the first continuous sacrificial material layers 142. The plurality of first discrete dielectric plates 167 may comprise multiple rows of first discrete dielectric plates 167 arranged along the first horizontal direction hd1 and located within a respective one of the first stepped cavities 163. At least two rows of first discrete dielectric plates 167 may be formed within each of the first stepped cavities 163. In one embodiment, the first continuous dielectric liner 167L may be patterned such that each of the plurality of first discrete dielectric plates 167 contacts a respective one of the horizontal top surface segments of the first insulating liner 166, and does not contact the vertical sidewall segments of the first insulating liner 166. The plurality of discrete dielectric plates 167 are spaced apart from each other. Each row of discrete dielectric plates 167 comprises a set of discrete dielectric plates 167 that are laterally spaced from each other along the first horizontal direction hd1 and vertically spaced apart from each other, i.e., have different vertical distances from the substrate 8.

Figure 23F:
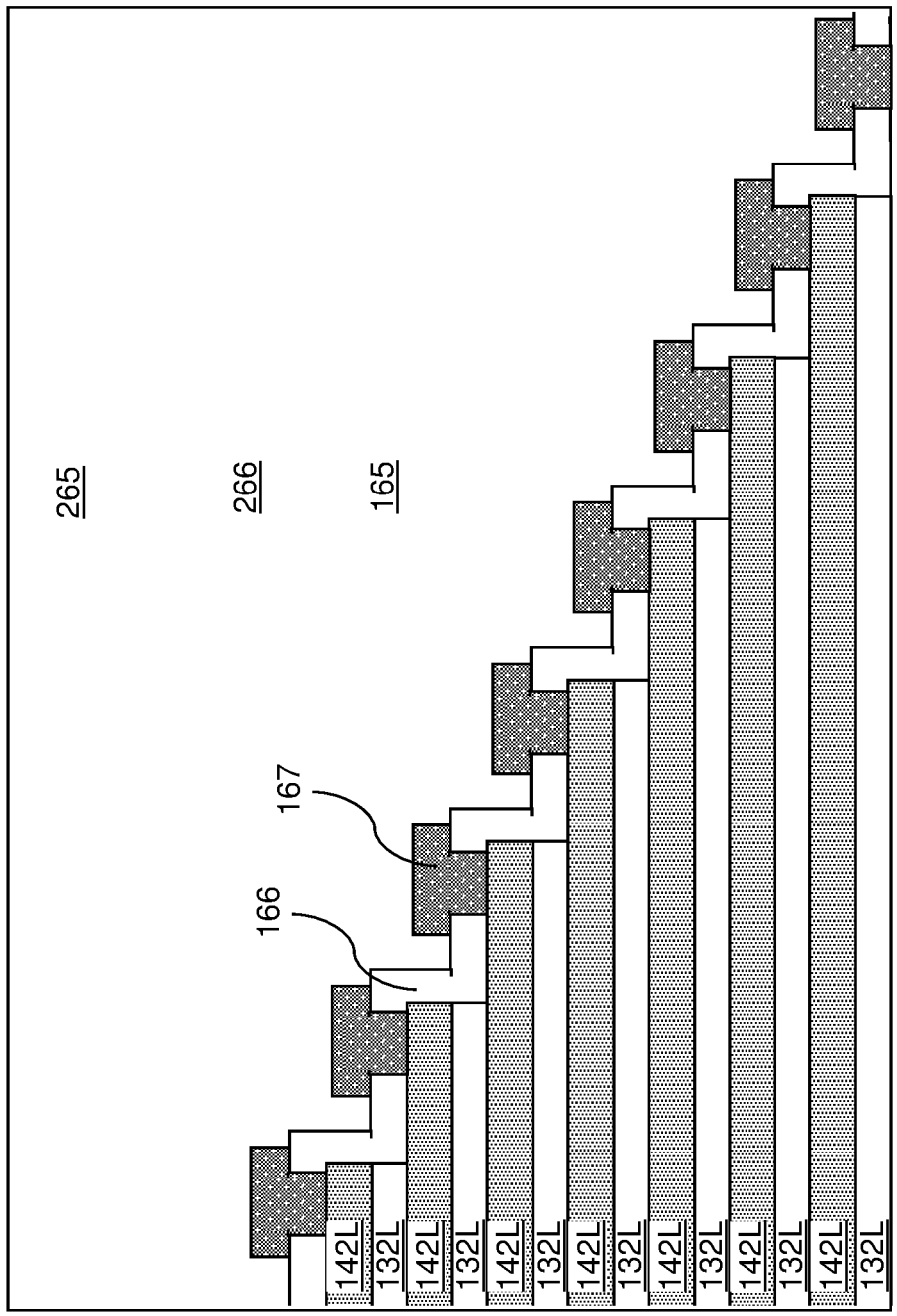

Referring to FIG. 23F, a first dielectric fill material (such as undoped silicate glass (i.e., silicon oxide) or a doped silicate glass) can be deposited in each first continuous retro-stepped cavity. In one embodiment, the first dielectric fill material may comprise a third silicon oxide material (such as undoped silicate glass or a doped silicate glass). The first dielectric fill material can be planarized to remove excess portions of the first dielectric fill material from above the horizontal plane including the topmost surface of the first vertically alternating sequence (132L, 142L). Each remaining portion of the first dielectric fill material that fills a respective first continuous retro-stepped cavity constitutes a first-tier retro-stepped dielectric material portion 165. Generally, the first-tier retro-stepped dielectric material portions 165 can be formed in inter-array regions 200 located between a respective first memory array region 100A and a respective second memory array region 100B that are laterally spaced apart along the first horizontal direction hd1. Each discrete dielectric plate 167 comprises a top surface and at least two sidewalls that are contacted by surfaces of a respective one of the first-tier retro-stepped dielectric material portions 165.

Subsequently, the processing steps of FIGS. 7, 8, and 9 can be performed, and the processing steps of FIG. 10 can be formed with modifications in the same manner as the modifications of the processing steps of FIGS. 23B-23F relative to the processing steps of FIGS. 4A-4C, 5A-5C, and 6A and 6B.

Generally, a plurality of discrete dielectric plates (167, 267) can be formed over an insulating liner (166, 266). The plurality of discrete dielectric plates (167, 267) are spaced apart from each other and fill a respective discrete opening through the insulating liner (166, 266). Each of the plurality of discrete dielectric plates (167, 267) is formed directly on a top surface of a respective sacrificial material layer (142L, 242L). The plurality of discrete dielectric plates (167, 267) can comprise a same material as the sacrificial material layers (142L, 242L). A dielectric material portion (165 or 265) can be formed over the plurality of discrete dielectric plates (167, 267).

Figure 24A:
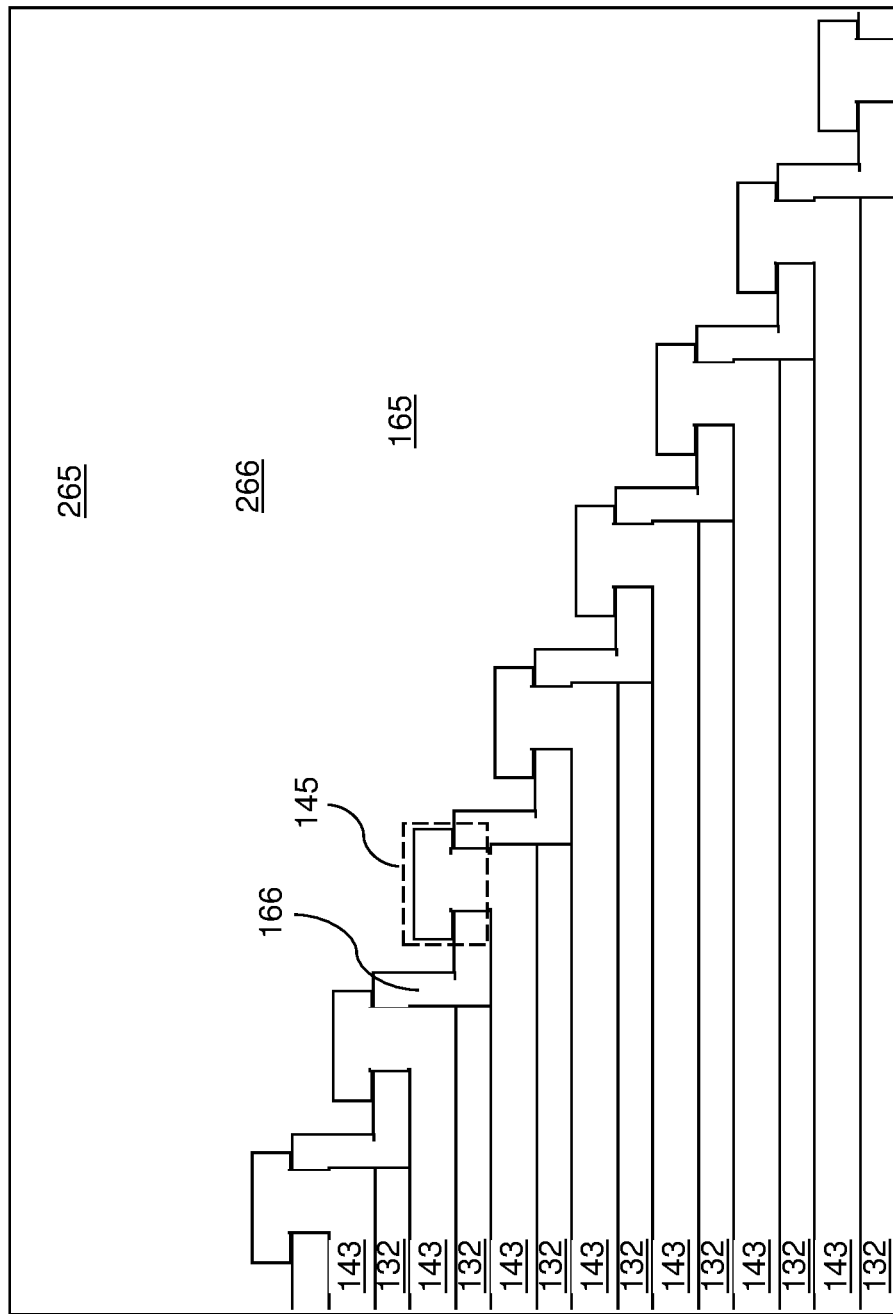
FIGS. 24A-24D are sequential vertical cross-sectional views of a region of a second exemplary structure during formation of layer contact via structures according to the second embodiment of the present disclosure.

The processing steps of FIGS. 11, 12A and 12B, 13A-13C, 14, 15A and 15B, and 16 can be subsequently performed. Referring to FIG. 24A, a region of the second exemplary structure is illustrated at a processing step that corresponds to the processing steps of FIG. 16 of the first embodiment. In the second embodiment, the isotropic etchant that etches the materials of the sacrificial material layers (142, 242), or alternatively, an additional isotropic etchant that etches the materials of the discrete dielectric plates (167, 267) selective to the materials of the insulating liners (166, 266), can be performed to remove the discrete dielectric plates (167, 267) concurrently with, or after, removal of the sacrificial material layers (142, 242). Each backside recess (143, 243) may have an upward-protruding cavity portion 145 that protrudes through a horizontally-extending portion of an insulating liner (166, 266) and extend over the horizontally-extending portion of an insulating liner (166, 266).

Figure 24B:
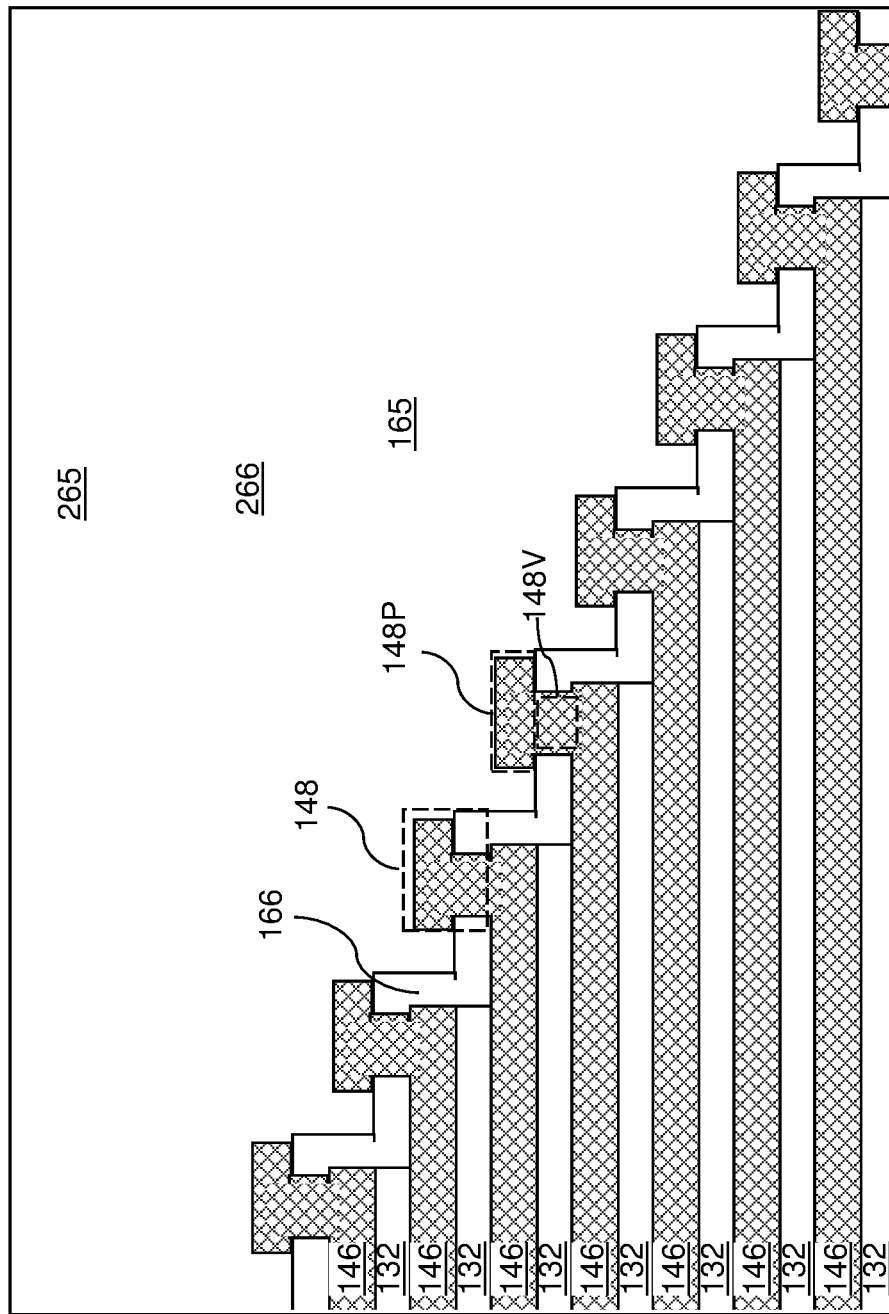

Referring to FIG. 24B, the processing steps of FIGS. 17A and 17B can be performed to form electrically conductive layers (146, 246) within the volumes of the backside recesses (143, 243). According to an aspect of an embodiment of the present disclosure, each of the electrically conductive layers (146, 246) may be formed with a respective protrusion region 148 that includes a respective combination of a protrusion via portion 148V and a protrusion pad portion 148P. Each combination of a protrusion via portion 148V and a protrusion pad portion 148P is formed within a volume of a respective one of the plurality of discrete dielectric plates (167, 267). Each protrusion via portion 148V protrudes through a respective opening in an insulating liner (166, 266). Each protrusion pad portion 148P is adjoined to an upper end of a protrusion via portion 148V.

The sacrificial material layers (142, 242) and the plurality of discrete dielectric plates (167, 267) are replaced with the electrically conductive layers (146, 246). Each of the electrically conductive layers (146, 246) is formed within a volume including a volume of a respective sacrificial material layer (142, 242) and a volume of a respective discrete dielectric plate (167, 267) of the plurality of discrete dielectric plates (167, 267).

Figure 24C:
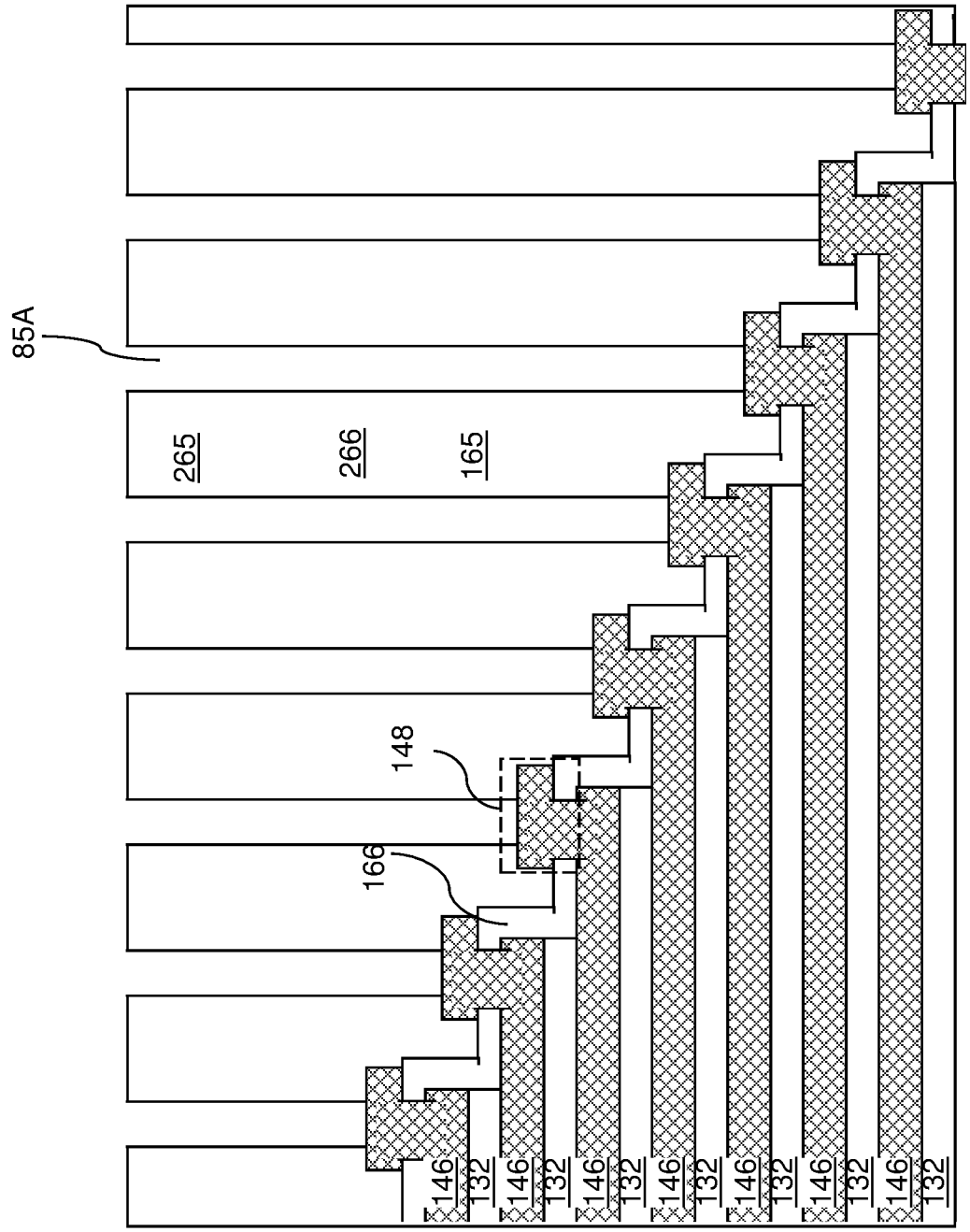

Referring to FIG. 24C, the processing steps of FIGS. 19A and 19B and FIGS. 20A and 20B can be subsequently performed with modifications to form contact via cavities (85A, 85B). In this case, the anisotropic etch process that transfers the pattern of the openings in the photoresist layer through the contact-level dielectric layer 280, the second-tier retro-stepped dielectric material portion 265, and the first-tier retro-stepped dielectric material portion 165, and through portions of the backside blocking dielectric layers (if present) located between the retro-stepped dielectric material portions (165, 265) and the electrically conductive layers (146, 246). The chemistry of the anisotropic etch process can be selected such that the anisotropic etch process etches the materials of the second-tier retro-stepped dielectric material portion 265 and the first-tier retro-stepped dielectric material portion 165 selective to the materials of the first electrically conductive layers 146 and the second electrically conductive layers 246. Specifically, the respective protrusion region 148 (e.g. at least a protrusion pad portion 148P of the region 148) of each electrically conductive layer acts as an etch stop during the anisotropic etch process. Therefore, the via cavities (85A, 85B) stop of the protrusion regions 148 and are not over etched through the entire thickness of the underlying electrically conductive layers (146, 246). Thus, the decrease or prevention of the over etching reduces or eliminates shorting of the electrically conductive layers (e.g., word lines) located in different vertical device layers by the contact via structures formed in the next step.

Figure 24D:
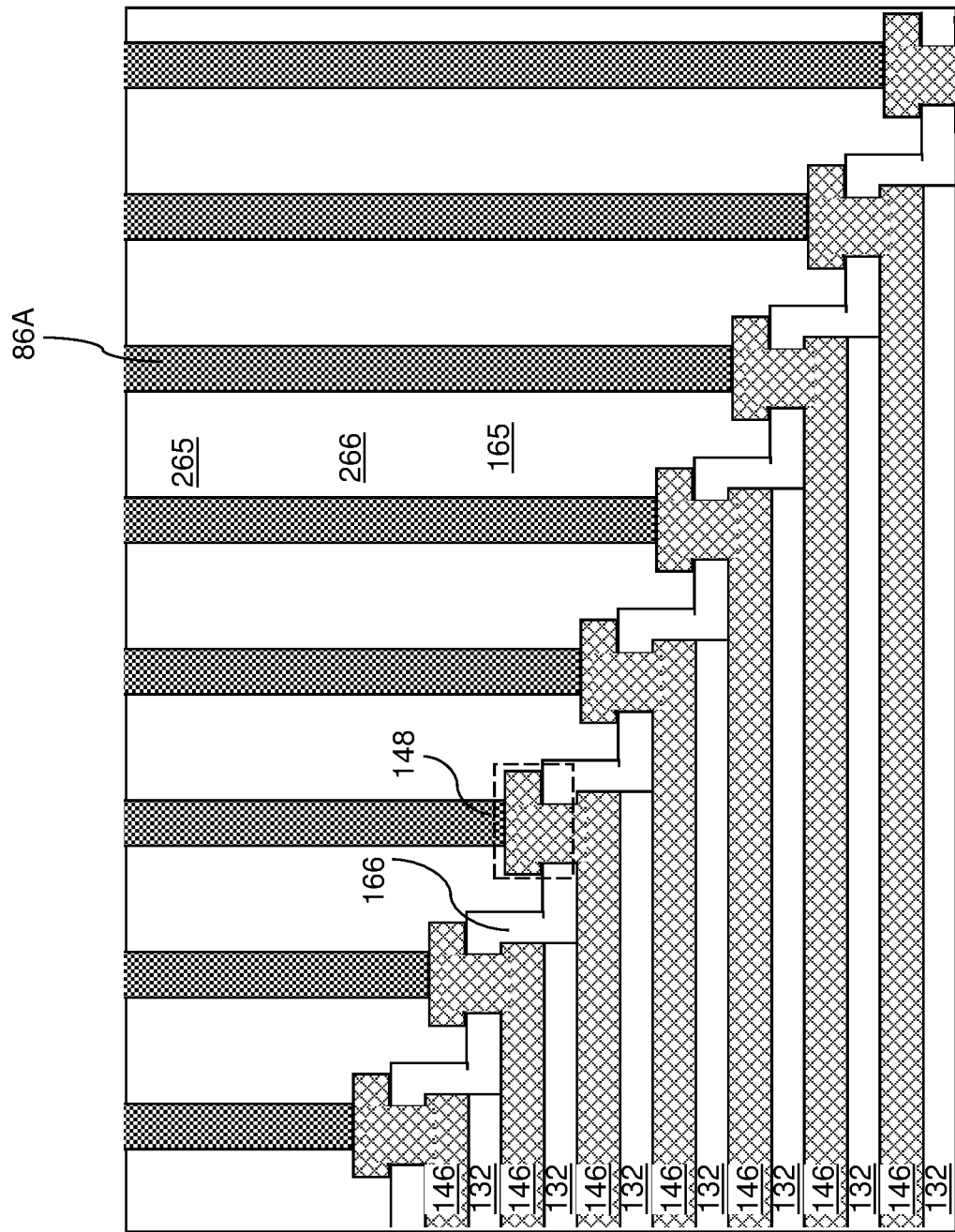
Figure 25:
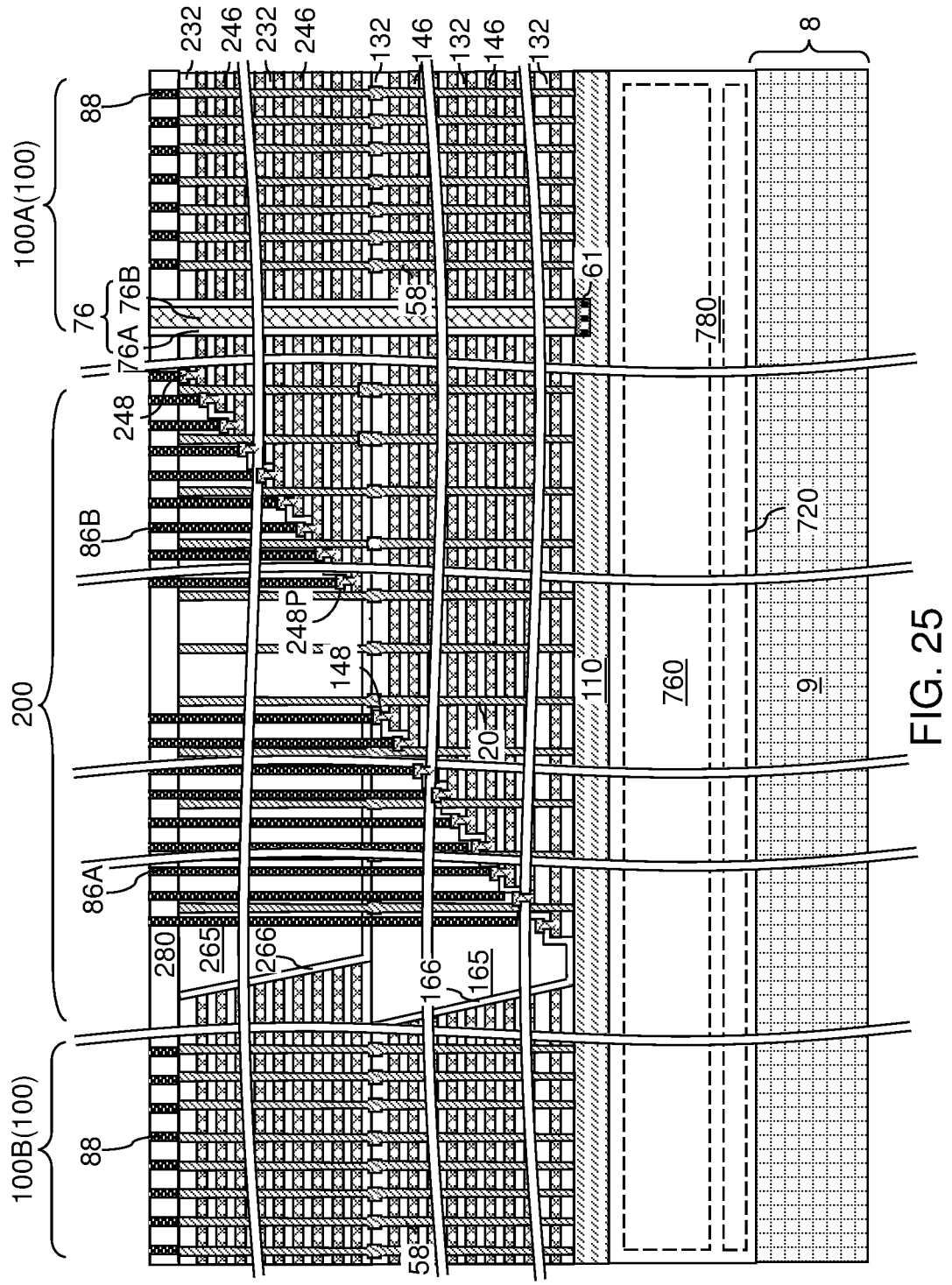
FIG. 25 is a schematic vertical cross-sectional view of the second exemplary structure after formation of various contact via structures according to the second embodiment of the present disclosure.

Referring to FIGS. 24D and 25, the processing steps of FIGS. 21 and 22A-22C can be performed to form first layer contact via structures 86A in the first layer contact via cavities 85A directly on a top surface of a protrusion pad portion 148P of the respective protrusion region 148 of the first electrically conductive layers 146, to form second layer contact via structures 86B in the second layer contact via cavities 85B directly on a top surface of a protrusion pad portion 248P of the respective protrusion region 248 of the second electrically conductive layers 246, and to form drain contact via structures 88 in the drain contact via cavities 87. Additional metal interconnect structures including bit lines can be subsequently formed.

According to the second embodiment and referring to FIGS. 23A-25 of the instant application, a three-dimensional memory device is provided, which comprises: an alternating stack of insulating layers (132, 232) and electrically conductive layers (146, 246), wherein the alternating stack {(132, 146) and/or (232, 246)} comprises at least one memory array region 100 in which each layer of the alternating stack {(132, 146) and/or (232, 246)} is present and a staircase region comprising stepped surfaces of the alternating stack {(132, 146) and/or (232, 246)} in which horizontal surfaces and vertical steps are adjoined to each other to form a continuous set of surface segments; memory openings 49 vertically extending through the alternating stack in the memory array region 100; memory opening fill structures 58 located in the memory openings and comprising a respective vertical stack of memory elements (e.g., portions of layer 54); an insulating liner (166, 266) overlying the stepped surfaces of the alternating stack {(132, 146) and/or (232, 246)} and comprising horizontal top surface segments and vertical sidewall segments that are adjoined to each other, wherein the electrically conductive layers (146, 246) comprises a respective protrusion via portion 148V that protrudes through a respective opening in the insulating liner (166, 266) and a respective protrusion pad portion 148P adjoined to an upper end of the respective protrusion via portion 148V; a dielectric material portion (165, 265) overlying the insulating liner (166, 266); and contact via structures (86A, 86B) vertically extending through the dielectric material portion (165, 265) and contacting a top surface of a respective one of the protrusion pad portions 148P.

In one embodiment, the protrusion pad portion 148P has a greater lateral extent than the protrusion via portion 148V.

In one embodiment, the protrusion pad portion 148P contacts a horizontal top surface segment of the insulating liner (166, 266).

In one embodiment, the insulating liner (166, 266) overlies the stepped surfaces of the alternating stack {(132, 146) and/or (232, 246)} and comprises horizontal top surface segments and vertical sidewall segments that are adjoined to each other and cylindrical openings through which a respective one of the protrusion via portions 146V vertically extends.

In one embodiment, the electrically conductive layers (146, 246), the protrusion via portions 148P, and the protrusion pad portions 148V have a same metallic material composition.

In one embodiment, horizontal surfaces and vertical steps of the alternating stack {(132, 146) and/or (232, 246)} are adjoined to each other within the staircase region to provide a continuous set of surface segments vertically extending from a bottommost layer of the alternating stack {(132, 146) and/or (232, 246)} to a topmost layer of the alternating stack {(132, 146) and/or (232, 246)}.

In one embodiment, the dielectric material portion (such as a second retro-stepped dielectric material portion 265) has a planar top surface located at, or above, a horizontal plane including topmost surfaces of the memory opening fill structures 58.

In one embodiment, each of the contact via structures (86A, 86B) comprises a respective straight sidewall that extends at least from the planar top surface of the dielectric material portion (such as a second retro-stepped dielectric material portion 265) to a top surface of a respective one of the protrusion pad portions 148P.

In one embodiment, the insulating layers (132, 232) comprise a first silicon oxide material; the insulating liner (166, 266) comprises a second silicon oxide material; and the dielectric material portion (165, 265) comprises a third silicon oxide material.

In one embodiment, each of the protrusion pad portions 148P has a respective sidewall and a respective top surface that contact the dielectric material portion (165, 265), and a respective bottom surface that contacts the insulating liner (166, 266).

In one embodiment, the insulating liner (166, 266) comprises horizontally-extending portions and vertically-extending portions that are adjoined to each other; and the protrusion pad portions 148P are in contact with top surfaces of the horizontally-extending portions of the insulating liner (166, 266) and does not contact any sidewall of the vertically-extending portions.

In one embodiment, the at least one memory array region 100 comprises a pair of memory array regions 100 that are laterally spaced apart along a first horizontal direction hd1; the staircase region is located between the pair of memory array regions 100; and an interconnecting strip region is located between the pair of memory array regions 100 and is laterally offset from the staircase region along a second horizontal direction hd2 that is perpendicular to the first horizontal direction hd1, wherein each layer within the alternating stack {(132, 146) and/or (232, 246)} extends along the first horizontal direction hd1 in the interconnecting strip region with a lesser with than a width of the alternating stack {(132, 146) and/or (232, 246)} in the pair of memory array regions 100 (for example, as illustrated in FIG. 1B).

In one embodiment, the three-dimensional memory device comprises: a first backside trench fill structure 76 having a first lengthwise sidewall that laterally extends along the first horizontal direction hd1 and contacting a first sidewall of each layer within the alternating stack {(132, 146) and/or (232, 246)}; and a second backside trench fill structure 76 having a second lengthwise sidewall that laterally extends along the first horizontal direction hd1 and contacting a second sidewall of each layer within the alternating stack {(132, 146) and/or (232, 246)}, wherein the insulating liner (166, 266) and the dielectric material portion (165, 265) contact one of the first backside trench fill structure 76 and the second backside trench fill structure 76, and are laterally spaced from another of the first backside trench fill structure 76 and the second backside trench fill structure 76 by the interconnecting strip region.

In one embodiment, each of the memory opening fill structures 58 further comprises a respective vertical semiconductor channel 60; a semiconductor material layer is located in a substrate 8 or between the alternating stack {(132, 146) and/or (232, 246)} and the substrate 8; and each of the vertical semiconductor channels 60 contacts the semiconductor material layer.

The various embodiments of the present disclosure can be employed to enhance reliability of layer contact via structures (86A, 86B) by employing the discrete dielectric plates (167, 267) or the protrusion pad portions 148P as etch stop structures during formation of layer contact via cavities (85A, 85B).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers, wherein the alternating stack comprises at least one memory array region in which each layer of the alternating stack is present and a staircase region comprising stepped surfaces of the alternating stack;
memory openings vertically extending through the alternating stack in the memory array region;
memory opening fill structures located in the memory openings and comprising a respective vertical stack of memory elements;
an insulating liner overlying the stepped surfaces of the alternating stack;
a plurality of discrete dielectric plates located over the insulating liner and spaced apart from each other;
a dielectric material portion overlying the plurality of discrete dielectric plates; and
contact via structures vertically extending through the dielectric material portion, a respective one of the plurality of discrete dielectric plates, and a respective portion of the insulating liner, and contacting a respective one of the electrically conductive layers,
wherein:
horizontal surfaces and vertical steps are adjoined to each other within the staircase region to provide a continuous set of surface segments vertically extending from a bottommost layer of the alternating stack to a topmost layer of the alternating stack;
the insulating liner overlies the stepped surfaces of the alternating stack and comprises horizontal top surface segments and vertical sidewall segments that are adjoined to each other;
each of the plurality of discrete dielectric plates contacts a respective one of the horizontal top surface segments of the insulating liner, and does not contact the vertical sidewall segments of the insulating liner;
the stepped surfaces comprise the vertical steps that are laterally spaced apart from each other along a first horizontal direction and laterally extend along a second horizontal direction that is perpendicular to the first horizontal direction;
the alternating stack comprises a sidewall that is adjoined to the stepped surfaces, that laterally extends along the first horizontal direction, and that vertically extends to the topmost layer of the alternating stack;
the dielectric material portion has a first sidewall that laterally extends along the first horizontal direction and is in direct contact with the vertical sidewall segments of the insulating liner;
the first sidewall of the dielectric material portion has a first stepped bottom edge that comprises first horizontally-extending edge segments that are connected by first vertically-extending edge segments; and
each of the plurality of discrete dielectric plates is laterally spaced from the first stepped bottom edge of the first sidewall of the dielectric material portion along the second horizontal direction by a respective segment of the dielectric material portion.

2. The three-dimensional memory device of claim 1, wherein:
the at least one memory array region comprises a pair of memory array regions that are laterally spaced apart along the first horizontal direction;
the staircase region is located between the pair of memory array regions; and
an interconnecting strip region is located between the pair of memory array regions and is laterally offset from the staircase region along the second horizontal direction that is perpendicular to the first horizontal direction, wherein each layer within the alternating stack extends along the first horizontal direction in the interconnecting strip region with a lesser width than a width of the alternating stack in the pair of memory array regions.

3. The three-dimensional memory device of claim 2, wherein:
the dielectric material portion comprises a lengthwise sidewall that laterally extends along the first horizontal direction; and
the lengthwise sidewall comprises a stepped bottom edge adjoining horizontal top surface segments of the insulating liner located at different levels.

4. The three-dimensional memory device of claim 3, wherein the insulating liner comprises a vertically-extending portion that contacts sidewalls of portions within the alternating stack in the interconnecting strip region and contacts the lengthwise sidewall of the dielectric material portion.

5. The three-dimensional memory device of claim 1, wherein the dielectric material portion has a planar top surface located at or above a horizontal plane including topmost surfaces of the memory opening fill structures.

6. The three-dimensional memory device of claim 5, wherein each of the contact via structures comprises a respective straight sidewall that extends at least from the planar top surface of the dielectric material portion to the respective one of the electrically conductive layers.

7. The three-dimensional memory device of claim 1, wherein:
the insulating liner has a uniform thickness throughout; and
the plurality of discrete dielectric plates have a uniform vertical thickness.

8. The three-dimensional memory device of claim 1, wherein:
the insulating layers comprise a first silicon oxide material
the insulating liner comprises a second silicon oxide material;
the plurality of discrete dielectric plates comprise silicon nitride; and
the dielectric material portion comprises a third silicon oxide material.

9. The three-dimensional memory device of claim 1, wherein each of the plurality of discrete dielectric plates has a respective sidewall and a respective top surface that contact the dielectric material portion, and a respective bottom surface that contacts the insulating liner.

10. The three-dimensional memory device of claim 1, wherein:
each of the memory opening fill structures further comprises a respective vertical semiconductor channel;
a semiconductor material layer is located in a substrate or between the alternating stack and the substrate; and
each of the vertical semiconductor channels contacts the semiconductor material layer.

11. The three-dimensional memory device of claim 1, further comprising a trench fill structure laterally extending along the first horizontal direction and comprising a dielectric surface that vertically extends at least from the bottommost layer of the alternating stack to at least the topmost layer of the alternating stack.

12. The three-dimensional memory device of claim 11, wherein:
a second sidewall of the dielectric material portion contacts the dielectric surface of the trench fill structure and has a second stepped bottom edge which is in direct contact with the insulating liner and comprises second horizontally-extending edge segments that are connected by second vertically-extending edge segments; and
each of the plurality of discrete dielectric plates is laterally spaced from the second stepped bottom edge of second sidewall of the dielectric material portion along the second horizontal direction by a respective additional segment of the dielectric material portion.

13. A method of forming a three-dimensional memory device, comprising:
forming an alternating stack of insulating layers and spacer material layers over a substrate, wherein the spacer material layers are formed are, or are subsequently replaced with, electrically conductive layers, and wherein the alternating stack comprises at least one memory array region in which each layer of the alternating stack is present and a staircase region comprising stepped surfaces of the alternating stack;
forming an insulating liner over the stepped surfaces of the alternating stack;
forming a plurality of discrete dielectric plates over the insulating liner, wherein the plurality of discrete dielectric plates are spaced apart from each other;
forming a dielectric material portion over the plurality of discrete dielectric plates;
forming memory openings through the alternating stack in the memory array region;
forming memory opening fill structures in the memory openings, wherein each of the memory opening fill structures comprises a respective vertical stack of memory elements; and
forming contact via structures through the dielectric material portion, a respective one of the plurality of discrete dielectric plates, and a respective portion of the insulating liner, and directly on a respective one of the electrically conductive layers,
wherein:
the insulating liner overlies the stepped surfaces of the alternating stack and comprises horizontal top surface segments and vertical sidewall segments that are adjoined to each other; and
each of the plurality of discrete dielectric plates contacts a respective one of the horizontal top surface segments of the insulating liner, and does not contact the vertical sidewall segments of the insulating liner.

14. The method of claim 13, wherein:
forming a continuous dielectric liner over the insulating liner;
applying and patterning a photoresist layer over the continuous dielectric liner, wherein patterned portions of the photoresist layer comprise discrete photoresist material portions; and
removing portions of the continuous dielectric liner that are not masked by the discrete photoresist material portions, wherein remaining portions of the continuous dielectric liner comprise the plurality of discrete dielectric plates.

15. The method of claim 13, wherein:
the spacer material layers comprise sacrificial material layers; and
the method further comprises forming backside trenches laterally extending along a first horizontal direction through the alternating stack, forming backside recesses by removing the sacrificial material layers selective to the insulating layers, the insulating liner, the memory opening fill structures, and the dielectric material portion by introducing an isotropic etchant into the backside trenches, and forming the electrically conductive layers in the backside recesses.

16. The method of claim 15, wherein:
the insulating layers comprise a first silicon oxide material;
the insulating liner comprises a second silicon oxide material;
the plurality of discrete dielectric plates comprise silicon nitride; and
the dielectric material portion comprises a third silicon oxide material.

17. The method of claim 13, further comprising:
applying and patterning a photoresist layer over the dielectric material portion to form openings through the photoresist layer in areas that overlie horizontal surface segments of the stepped surfaces; and performing an anisotropic etch process that etches portions of the dielectric material portion, the plurality of discrete dielectric plates, and the insulating liner, wherein the anisotropic etch process comprises:
  a first etch step that etches a material of the dielectric material portion selective to a material of the plurality of discrete dielectric plates;
  a second etch step that etches the material of the plurality of dielectric plates selective to a material of the insulating liner; and
a third etch step that etches the material of the insulating liner selective to a material of the electrically conductive layers.

* * * * *